US009520265B2

United States Patent
Yagita

(10) Patent No.: US 9,520,265 B2
(45) Date of Patent: Dec. 13, 2016

(54) ION IMPLANTATION APPARATUS

(71) Applicant: Sumitomo Heavy Industries Ion Technology Co., Ltd., Tokyo (JP)

(72) Inventor: Takanori Yagita, Ehime (JP)

(73) Assignee: Sumitomo Heavy Industries Ion Technology Co., Ltd., Tokyo (JP)

( * ) Notice: Subject to any disclaimer, the term of this patent is extended or adjusted under 35 U.S.C. 154(b) by 4 days.

(21) Appl. No.: 14/558,187

(22) Filed: Dec. 2, 2014

(65) Prior Publication Data

US 2015/0155129 A1 Jun. 4, 2015

(30) Foreign Application Priority Data

Dec. 2, 2013 (JP) .................. 2013-248915

(51) Int. Cl.
*H01J 37/12* (2006.01)
*H01J 37/317* (2006.01)
*H01J 37/21* (2006.01)

(52) U.S. Cl.
CPC ............... *H01J 37/21* (2013.01); *H01J 37/12* (2013.01); *H01J 37/3171* (2013.01); *H01J 2237/1415* (2013.01); *H01J 2237/303* (2013.01); *H01J 2237/30477* (2013.01)

(58) Field of Classification Search
CPC ........ H01J 37/12; H01J 37/21; H01J 37/3171; H01J 2237/30477
See application file for complete search history.

(56) References Cited

U.S. PATENT DOCUMENTS 4,849,641 A * 7/1989 Berkowitz ................. 250/492.2
5,132,544 A 7/1992 Glavish
8,110,820 B2 * 2/2012 Glavish et al. ........... 250/492.21
2002/0033458 A1 * 3/2002 Nagano et al. ............ 250/492.1
2006/0113493 A1 * 6/2006 Kabasawa et al. ....... 250/492.21
2009/0321630 A1 * 12/2009 Ryding et al. ................ 250/282
2010/0155623 A1 * 6/2010 Eisner ....................... 250/492.21

FOREIGN PATENT DOCUMENTS

| JP | S60-039748 A | 3/1985 |
|---|---|---|
| JP | S62-122045 A | 6/1987 |
| JP | H01-149960 A | 6/1989 |
| JP | H04-253149 A | 9/1992 |
| JP | 3390541 B2 | 3/2003 |
| JP | 5100963 B2 | 12/2012 |

OTHER PUBLICATIONS

Spohr, 'Ion Tracks and Microtechnology: Principles and Applications' 1990, p. 25.*

* cited by examiner

*Primary Examiner* — Robert Kim
*Assistant Examiner* — Eliza Osenbaugh-Stewar
(74) *Attorney, Agent, or Firm* — Michael Best & Friedrich LLP

(57) ABSTRACT

A multistage quadrupole lens system in an ion implantation apparatus includes a first quadrupole lens and a third quadrupole lens. A first bore radius of the first quadrupole lens may be smaller than a third bore radius of the third quadrupole lens. The multistage quadrupole lens system may further include a second quadrupole lens placed between the first quadrupole lens and the third quadrupole lens. A second bore radius of the second quadrupole lens may take a value lying between the first bore radius of the first quadrupole lens and the third bore radius of the third quadrupole lens (i.e., an intermediate value between them).

15 Claims, 21 Drawing Sheets

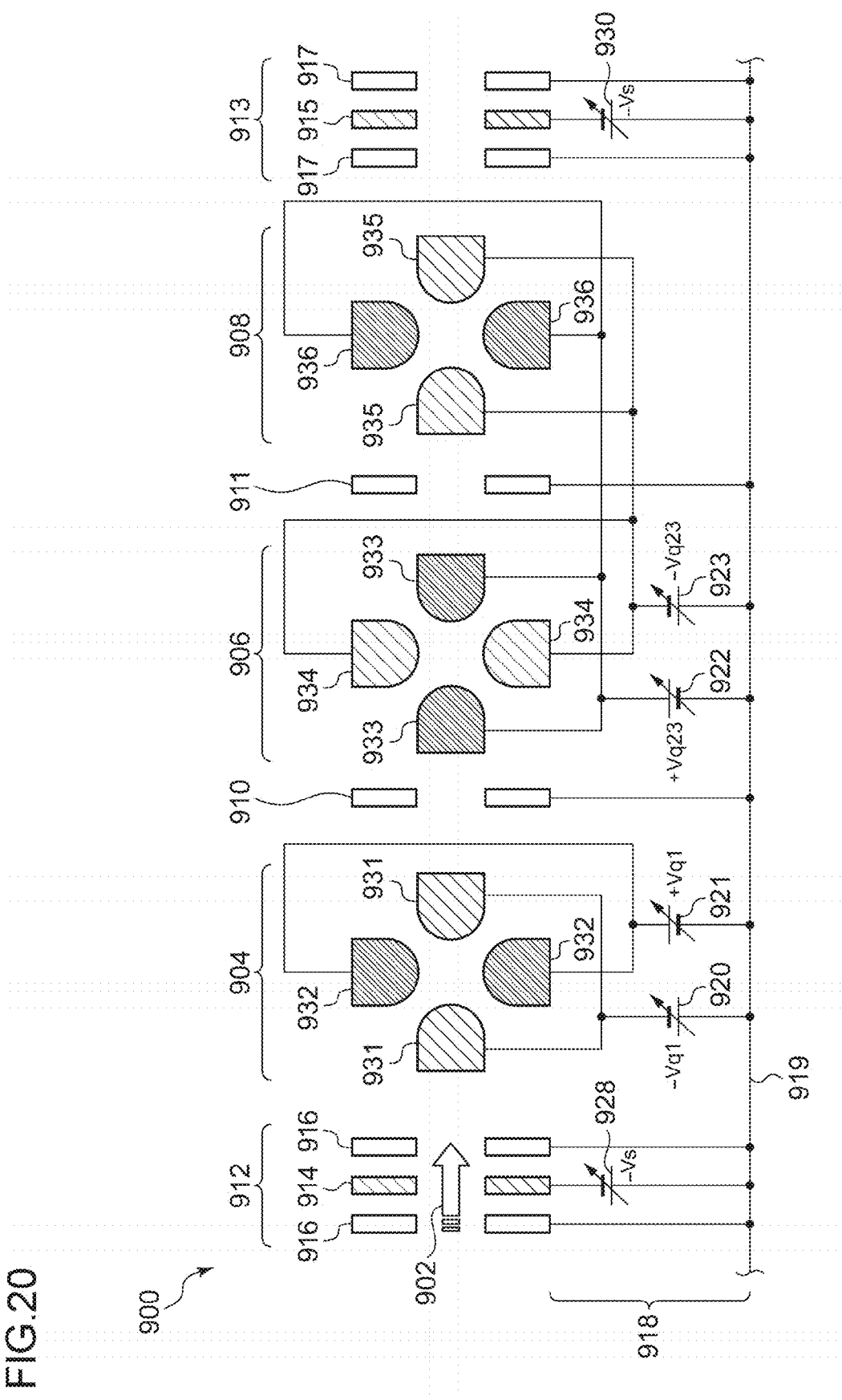

ION IMPLANTATION APPARATUS

RELATED APPLICATION

Priority is claimed to Japanese Patent Application No. 2013-248915, filed on Dec. 2, 2013, the entire content of which is incorporated herein by reference.

BACKGROUND OF THE INVENTION

1. Field of the Invention

The present invention relates to an ion implantation, and more particularly to an ion implantation apparatus and an ion implantation method.

2. Description of the Related Art

In a certain ion implantation apparatus, an ion source is connected to a power supply thereof such that an ion beam having a small amount of beam current is extracted from the ion source. In this apparatus, the connection between the ion source and the power supply may be modified such that an ion beam having a large amount of beam current is extracted from the ion source.

Another ion implantation apparatus includes an ion source, an acceleration tube, and an electric circuit connecting the power supplies thereof, so as to implant ions into a target at high ion energy. The electric circuit is provided with a selector switch for switching the connections so as to implant ions at low ion energy.

Attempts to extend the operating range of the ion implantation apparatus to some degree have been made as described above. However, a realistic proposal to the extension of the operating range beyond the existing categories is rare.

Generally, ion implantation apparatuses are classified into three categories: a high-current ion implantation apparatus, a medium-current ion implantation apparatus, and a high energy ion implantation apparatus. Since practical design requirements are different for each category, an apparatus of one category and an apparatus of another category may have significantly different configurations in, for example, beamline. Therefore, in the use of the ion implantation apparatus (for example, in a semiconductor manufacturing process), it is considered that apparatuses of different categories have no compatibility. That is, for particular ion implantation processing, an apparatus of a particular category is selected and used. Therefore, for a variety of ion implantation processing, it is necessary to own various types of ion implantation apparatuses.

SUMMARY OF THE INVENTION

An exemplary object of an aspect of the present invention is to provide an ion implantation apparatus and an ion implantation method which can be used in a wide range, for example, an ion implantation apparatus which can serve as both a high-current ion implantation apparatus and a medium-current ion implantation apparatus, and an ion implantation method.

According to an embodiment of the present invention, there is provided an ion implantation apparatus including: a multistage quadrupole lens system that is used to adjust beam focusing and defocusing, the multistage quadrupole lens system being placed midway in a beamline, wherein the multistage quadrupole lens system is constructed of a plurality of quadrupole lenses, linearly arranged, having an identical central axis, wherein the multistage quadrupole lens system is formed such that lens bore diameters increase in stages, and lens lengths of the plurality of quadrupole lenses are set separately, and wherein the multistage quadrupole lens system is configured such that a beam transport of an ion beam is achieved, the beam transport being such that a diameter of the ion beam entering the multistage quadrupole lens system is increased in a vertical direction and/or a horizontal direction toward a downstream side of the beamline and the ion beam exits from the multistage quadrupole lens system.

According to an embodiment of the present invention, there is provided an ion implantation apparatus equipped with a multistage quadrupole lens system, used to adjust beam focusing and defocusing, which is placed midway in a beamline of the ion implantation apparatus, wherein the ion implantation apparatus includes: a beam scanning unit; and the multistage quadrupole lens system provided upstream of the beam scanning unit, wherein the multistage quadrupole lens system includes an entrance quadrupole lens and an exit quadrupole lens, and wherein a bore diameter of the exit quadrupole lens is larger than that of the entrance quadrupole lens.

According to an embodiment of the present invention, there is provided an ion implantation apparatus equipped with a multistage quadrupole lens system, used to adjust beam focusing and defocusing, which is placed midway in a beamline of the ion implantation apparatus, wherein the ion implantation apparatus includes: the multistage quadrupole lens system provided downstream of a mass analysis slit, wherein the multistage quadrupole lens system includes an entrance quadrupole lens and an exit quadrupole lens, and wherein a bore diameter of the exit quadrupole lens is larger than that of the entrance quadrupole lens.

According to an embodiment of the present invention, there is provided an ion implantation apparatus equipped with a multistage quadrupole lens system, used to adjust beam focusing and defocusing, which is placed midway in a beamline of the ion implantation apparatus, wherein the ion implantation apparatus includes: the multistage quadrupole lens system provided between an extraction electrode and a mass analysis magnet, wherein the multistage quadrupole lens system includes an entrance quadrupole lens and an exit quadrupole lens, and wherein a bore diameter of the exit quadrupole lens is larger than that of the entrance quadrupole lens.

According to an embodiment of the present invention, there is provided an ion implantation apparatus equipped with a multistage quadrupole lens system, used to adjust beam focusing and defocusing, which is placed midway in a beamline of the ion implantation apparatus, wherein the ion implantation apparatus includes: the multistage quadrupole lens system provided upstream of a mass analysis slit, wherein the multistage quadrupole lens system includes an entrance quadrupole lens and an exit quadrupole lens, and wherein a bore diameter of the entrance quadrupole lens is larger than that of the exit quadrupole lens.

According to an embodiment of the present invention, there is provided an ion implantation apparatus equipped with a multistage quadrupole lens system, used to adjust beam focusing and defocusing, which is placed midway in a beamline of the ion implantation apparatus, wherein a plurality of beam transport modes used when the multistage quadrupole lens system is operated are set such that a GL product, a bore diameter, a lens length and a voltage setting of each quadrupole lens in the multistage quadrupole lens system and the number of stages of the multistage quadrupole lens system are combined according to a preset longitudinal diameter, a preset lateral diameter and a focused or defocused state of an ion beam entering the multistage quadrupole lens system and according to the preset longitudinal diameter, the preset lateral diameter and the focused or defocused state of the ion beam exiting from the multistage quadrupole lens system.

According to an embodiment of the present invention, there is provided an ion implantation apparatus equipped with a multistage quadrupole lens system, used to adjust beam focusing and defocusing, which is placed midway in a beamline of the ion implantation apparatus, wherein the multistage quadrupole lens system is operated in any one of a plurality of beam transport modes used when the multistage quadrupole lens system is operated, wherein the plurality of beam transport modes include: a defocusing beam mode where the multistage quadrupole lens system is operated such that an ion beam exiting from the multistage quadrupole lens system is focused in a first direction and defocused in a second direction perpendicular to the first direction; and a focusing beam mode where the multistage quadrupole lens system is operated such that the ion beam exiting therefrom is focused in the first direction and focused in the second direction perpendicular to the first direction.

According to an embodiment of the present invention, there is provided an ion implantation apparatus equipped with a multistage quadrupole lens system, used to adjust beam focusing and defocusing, which is placed midway in a beamline of the ion implantation apparatus, wherein the multistage quadrupole lens system includes: a first quadrupole lens; a second quadrupole lens placed downstream of the first quadrupole lens; and a third quadrupole lens placed downstream of the second quadrupole lens, wherein the first quadrupole lens is configured such that an ion beam is focused in a first direction within a plane perpendicular to a beam transportation direction of the multistage quadrupole lens system, wherein the second quadrupole lens is configured such that the ion beam is focused in a second direction perpendicular to the first direction within the plane, wherein the third quadrupole lens is configured such that the ion beam is focused in the first direction, wherein the multistage quadrupole lens system is operated in any one of a plurality of beam transport modes used when the multistage quadrupole lens system is operated, and wherein the plurality of beam transport modes include: a defocusing beam mode where at least one quadrupole lens is operated such that an ion beam exiting from the multistage quadrupole lens system is focused in the first direction and defocused in the second direction; and a focusing beam mode where at least two quadrupole lenses are operated such that the ion beam exiting therefrom is focused in the first direction and focused in the second direction.

According to an embodiment of the present invention, there is provided an ion implantation apparatus equipped with a multistage quadrupole lens system, used to adjust beam focusing and defocusing, which is placed midway in a beamline of the ion implantation apparatus, wherein the multistage quadrupole lens system includes: a first quadrupole lens; a second quadrupole lens placed downstream of the first quadrupole lens; and a third quadrupole lens placed downstream of the second quadrupole lens, wherein the first quadrupole lens is configured such that an ion beam is focused in a first direction within a plane perpendicular to a beam transportation direction of the multistage quadrupole lens system, wherein the second quadrupole lens is configured such that the ion beam is focused in a second direction perpendicular to the first direction within the plane, wherein the third quadrupole lens is configured such that the ion beam is focused in the first direction, wherein a bore diameter of the first quadrupole lens is equal to or smaller than a bore diameter of the second quadrupole lens, wherein the bore diameter of the second quadrupole lens is equal to or smaller than a bore diameter of the third quadrupole lens, and wherein the bore diameter of the first quadrupole lens is smaller than the bore diameter of the third quadrupole lens.

Optional combinations of the aforementioned constituting elements, and implementations of the invention in the form of methods, apparatuses, systems, computer programs and so forth may also be practiced as additional modes of the present invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIG. 20 is a diagram illustrating another exemplary configuration of a power supply of a multistage quadrupole lens system according to an embodiment of the present invention;

DETAILED DESCRIPTION OF THE INVENTION

Figure 1:
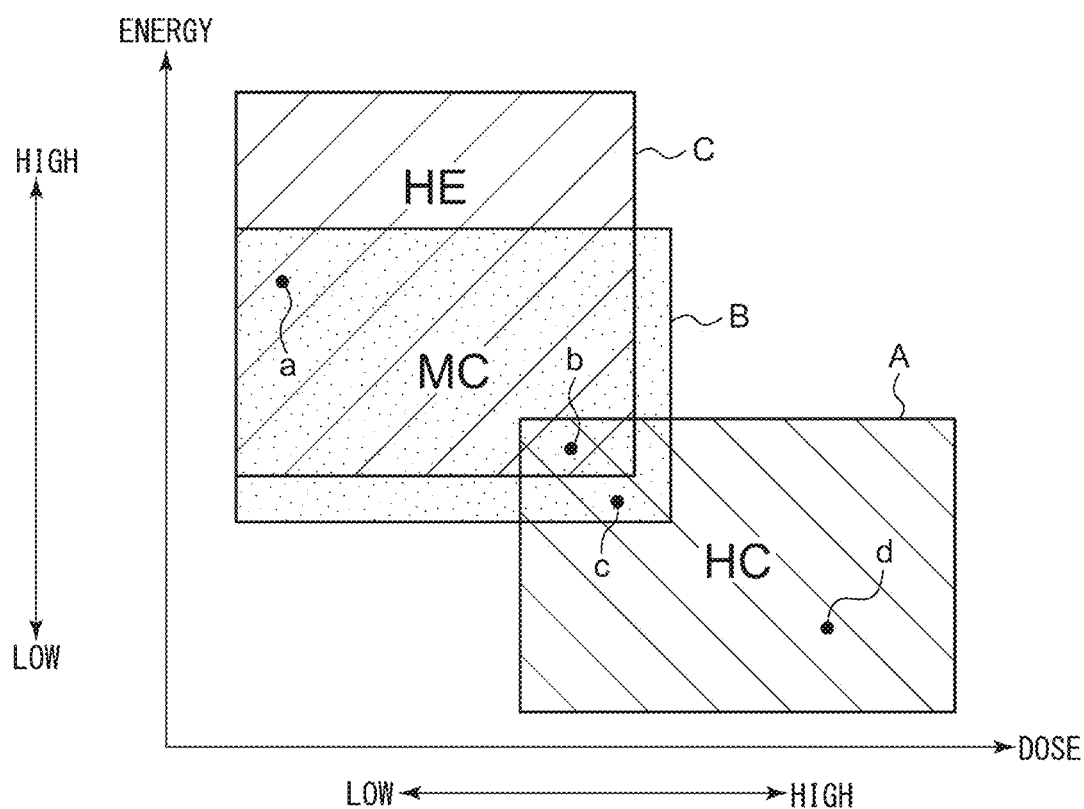
FIG. 1 is a diagram schematically illustrating ranges of an energy and a dose amount in several types of typical ion implantation apparatuses.

The invention will now be described by reference to the preferred embodiments. This does not intend to limit the scope of the present invention, but to exemplify the invention.

Hereinafter, embodiments of the present invention will be described in detail with reference to the drawings. Also, in the description of the drawings, the same reference numerals are assigned to the same components, and a redundant description thereof is appropriately omitted. Also, the configurations described below are exemplary, and do not limit the scope of the present invention. For example, in the following, a semiconductor wafer is described as an example of an object to which an ion implantation is performed, but other materials or members may also be used.

First, a description will be given of circumstances that led to an embodiment of the present invention to be described below. An ion implantation apparatus can select an ion species to be implanted and set an energy and a dose amount thereof, based on desired properties to be established within a workpiece. Generally, ion implantation apparatuses are classified into several categories according to the ranges of energy and dose amount of ions to be implanted. As representative categories, there are a high-dose high-current ion implantation apparatus (hereinafter, referred to as HC), a medium-dose medium-current ion implantation apparatus (hereinafter, referred to as MC), and a high energy ion implantation apparatus (hereinafter, referred to as HE).

FIG. 1 schematically illustrates the energy ranges and the dose ranges of a typical serial-type high-dose high-current ion implantation apparatus HC, a serial-type medium-dose medium-current ion implantation apparatus MC, and a serial-type high energy ion implantation apparatus HE. In FIG. 1, a horizontal axis represents the dose, and a vertical axis represents the energy. The dose is the number of ions (atoms) implanted per unit area (for example, $cm^2$), and the total amount of implanted material is provided by a time integral of ion current. The ion current provided by the ion implantation is generally expressed as mA or μA. The dose is also referred to as an implantation amount or a dose amount. In FIG. 1, the energy and dose ranges of the HC, the MC, and the HE are indicated by symbols A, B, and C, respectively. These are a set range of implantation conditions required according to implantation conditions (also called a recipe) for each implantation, and represent practically reasonable apparatus configuration categories matched with the implantation conditions (recipe), considering practically allowable productivity. Each of the illustrated ranges represents an implantation condition (recipe) range that can be processed by the apparatus of each category. The dose amount represents an approximate value when a realistic processing time is assumed.

The HC is used for ion implantation in a relatively low energy range of about 0.1 to 100 keV and in a high dose range of about $1\times10^{14}$ to $1\times10^{17}$ atoms/$cm^2$. The MC is used for ion implantation in a medium energy range of about 3 to 500 keV and in a medium dose range of about $1\times10^{11}$ to $1\times10^{14}$ atoms/$cm^2$. The HE is used for ion implantation in a relatively high energy range of about 100 keV to 5 MeV and in a relatively low dose range of about $1\times10^{10}$ to $1\times10^{13}$ atoms/$cm^2$. In this way, the broad ranges of the implantation conditions having about five digits for the energy range and about seven digits for the dose ranges are shared by the HC, the MC, and the HE. However, these energy ranges or dose ranges are a representative example, and are not strict. Also, the way of providing the implantation conditions is not limited to the dose and the energy, but is various. The implantation conditions may be set by a beam current value (representing an area integral beam amount of a beam cross-sectional profile by a current), a throughput, implantation uniformity, and the like.

Since the implantation conditions for ion implantation processing include particular values of energy and dose, the implantation conditions can be expressed as individual points in FIG. 1. For example, an implantation condition a has values of a high energy and a low dose. The implantation condition a is in the operating range of the MC and is also in the operating range of the HE. The ion implantation can be processed accordingly using the MC or the HE. An implantation condition b is a medium energy/dose and the ion implantation can be processed by one of the HC, MC, and HE. An implantation condition c is a medium energy/dose and the ion implantation can be processed by the HC or the MC. An implantation condition d is a low energy/a high dose and can be processed by only the HC.

The ion implantation apparatus is an equipment essential to the production of semiconductor devices, and the improvement of performance and productivity thereof has an important meaning to a device maker. The device maker selects an apparatus, which is capable of realizing implantation characteristics necessary for a device to be manufactured, among a plurality of ion implantation apparatus categories. At this time, the device maker determines the number of apparatuses of the category, considering various circumstances such as the realization of the best manufacturing efficiency, the cost of ownership of the apparatus, and the like.

It is assumed that an apparatus of a certain category is used at a high operating rate and an apparatus of another category has a relatively sufficient processing capacity. At this time, if the former apparatus cannot be replaced with the latter apparatus in order to obtain a desired device because implantation characteristics are strictly different for each category, the failure of the former apparatus cause a bottleneck on production processes, and thus overall productivity is impaired. Such trouble may be avoided to some extent by assuming a failure rate and the like in advance and determining a number configuration based on that.

When a manufacturing device is changed due to a change in demand or a technical advance and the number configuration of necessary apparatuses is changed, apparatuses become lacking or a non-operating apparatus occurs and thus an operating efficiency of the apparatuses may be reduced. Such trouble may be avoided to some extent by predicting the trend of future products and reflecting the predicted trend to the number configuration.

Even though the apparatus can be replaced with an apparatus of another category, the failure of the apparatus or the change of the manufacturing device may reduce the production efficiency or lead to wasted investment for the device maker. For example, in some cases, a manufacturing process having been mainly processed till now by a medium-current ion implantation apparatus is processed by a high-current ion implantation apparatus due to the change of the manufacturing device. If doing so, the processing capacity of the high-current ion implantation apparatus becomes lacking, and the processing capacity of the medium-current ion implantation apparatus becomes surplus. If it is expected that the state after the change will not change for a long period of time, the operating efficiency of the apparatus can be improved by taking measures of purchasing a new high-current ion implantation apparatus and selling the medium-current ion implantation apparatus having been owned. However, when a process is frequently changed, or such a change is difficult to predict, a trouble may be caused in production.

In practice, a process having already been performed in an ion implantation apparatus of a certain category in order to manufacture a certain device cannot be immediately used in an ion implantation apparatus of another category. This is because a process of matching device characteristics on the ion implantation apparatus is required. That is, device characteristics obtained by performing a process with the same ion species, energy, and dose amount in the new ion implantation apparatus may be significantly different from device characteristics obtained in the previous ion implantation apparatus. Various conditions other than the ion species, the energy, and the dose amount, for example, a beam current density (that is, a dose rate), an implantation angle, or an overspray method of an implantation region, also affect the device characteristics. Generally, when the categories are different, apparatus configurations also are different. Therefore, even though the ion species, the energy, and the dose amount are specified, it is impossible to automatically match the other conditions affecting the device characteristics. These conditions depend on implantation methods. Examples of the implantation methods include a method of relative movement between a beam and a workpiece (for example, a scanning beam, a ribbon beam, a two-dimensional wafer scanning, or the like), a batch type and a serial type to be described below.

In addition, rough classification of the high-dose high-current ion implantation apparatus and the high energy ion implantation apparatus into a batch type and the medium-dose medium-current ion implantation apparatus into a serial type also increases a difference between the apparatuses. The batch type is a method of processing a plurality of wafers at one time, and these wafers are disposed on, for example, the circumference. The serial type is a method of processing wafers one by one and is also called a single wafer type. Also, in some cases, the high-dose high-current ion implantation apparatus and the high energy ion implantation apparatus are configured as the serial type.

Also, a beamline of the batch-type high-dose high-current ion implantation apparatus is typically made shorter than that of the serial-type medium-dose medium-current ion implantation apparatus by a request on beamline design according to high-dose high-current beam characteristics. This is done for suppressing beam loss caused by divergence of ion beams in a low energy/high beam current condition in the design of the high-dose high-current beamline. In particular, this is done for reducing a tendency to expand outward in a radial direction, so-called a beam blow-up, because ions forming the beam include charged particles repelling each other. The necessity for such design is more remarkable when the high-dose high-current ion implantation apparatus is the batch type than when that is the serial type.

The beamline of the serial-type medium-dose medium-current ion implantation apparatus is made relatively long for ion beam acceleration or beam forming. In the serial-type medium-dose medium-current ion implantation apparatus, ions having considerable momentum are moving at high speed. The momentum of the ions increases while the ions pass through one or several of acceleration gaps added to the beamline. Also, in order to modify a trajectory of particles having considerable momentum, a focusing portion needs to be relatively long enough to fully apply a focusing power.

Since the high energy ion implantation apparatus adopts a linear acceleration method or a tandem acceleration method, it is essentially different from an acceleration method of the high-dose high-current ion implantation apparatus or the medium-dose medium-current ion implantation apparatus. This essential difference is equally applied when the high energy ion implantation apparatus is the serial type or the batch type.

As such, the ion implantation apparatuses HC, MC and HE are recognized as completely different apparatuses because the beamline types or the implantation methods are different according to categories. A difference in configuration between apparatuses of different categories is recognized as inevitable. Among the different types of apparatuses such as HC, MC and HE, process compatibility considering the influence on the device characteristics is not guaranteed.

Therefore, it is preferable that the ion implantation apparatus has a broader energy range and/or dose range than the apparatus of the existing category. In particular, it is desirable to provide an ion implantation apparatus capable of implantation in a broad range of energy and dose amount including at least two existing categories, without changing the type of the implantation apparatus.

Also, in recent years, the mainstream is that all implantation apparatuses adopt the serial type. It is therefore desirable to provide an ion implantation apparatus that has a serial-type configuration and also has a broad energy range and/or dose range.

Also, the HE uses an essentially different acceleration method, and the HC and the MC are common in that ion beams are accelerated or decelerated by a DC voltage. Therefore, there is a probability that the HC and the MC can share the beamline. It is therefore desirable to provide an ion implantation apparatus that can serve as both the HC and the MC.

The apparatus capable of operating at a broad range helps to improve productivity or operating efficiency in view of device makers.

Also, the medium-current ion implantation apparatus MC can operate in a high energy range and a low dose range as compared with the high-current ion implantation apparatus HC. Therefore, in this application, the medium-current ion implantation apparatus MC is also referred to as a low-current ion implantation apparatus. Likewise, regarding the medium-current ion implantation apparatus MC, the energy and the dose are also referred to as high energy and low dose, respectively. Alternatively, regarding the high-current ion implantation apparatus HC, the energy and the dose are also referred to as low energy and high dose, respectively. However, these expressions in this application are not intended to restrictively indicate only the energy range and the dose range of the medium-current ion implantation apparatus MC, but may mean "a high (or low) energy (or dose) range" literally according to the context.

Figure 2:
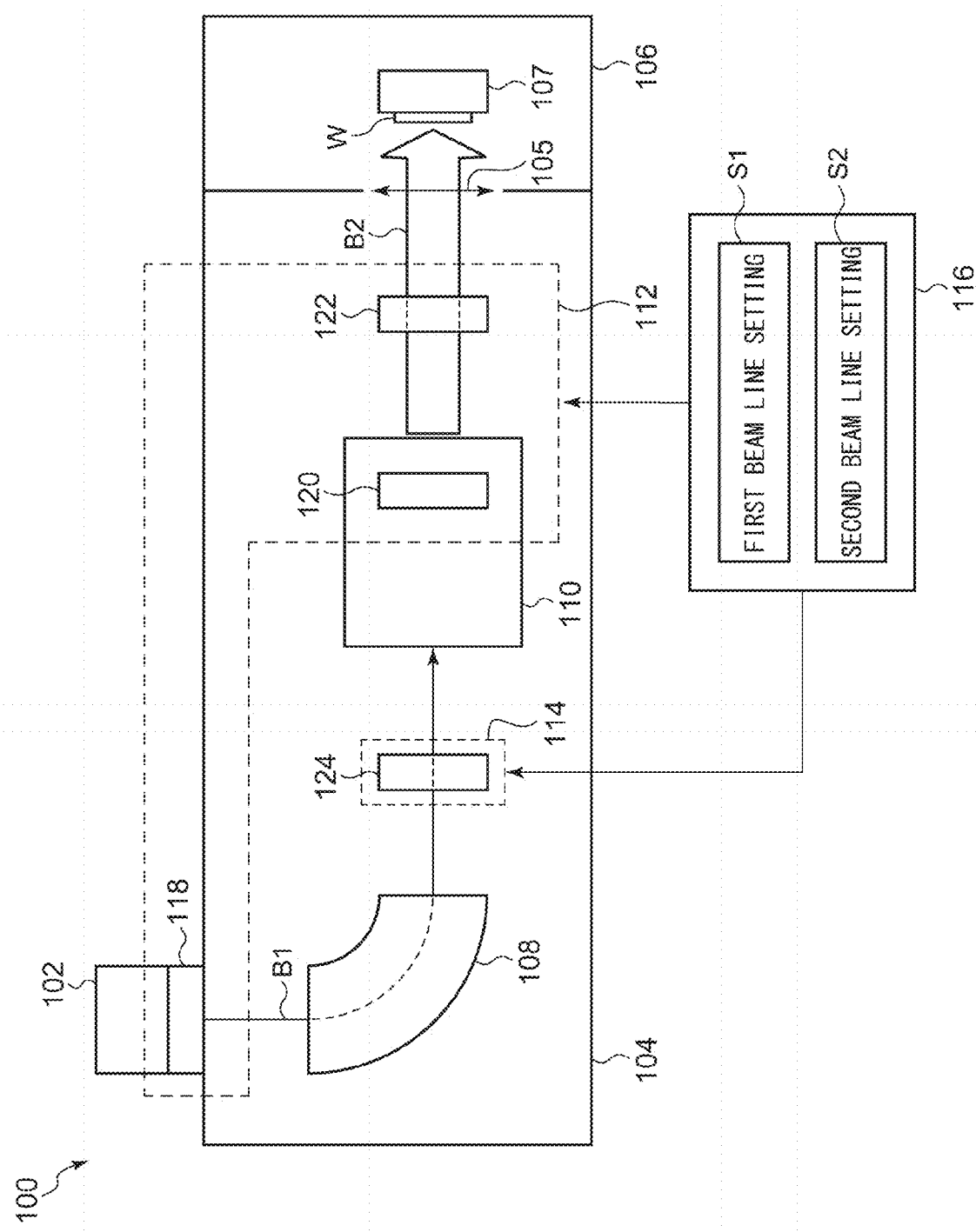
FIG. 2 is a diagram schematically illustrating an ion implantation apparatus according to an embodiment of the present invention.

FIG. 2 is a diagram schematically illustrating an ion implantation apparatus 100 according to an embodiment of the present invention. The ion implantation apparatus 100 is configured to perform ion implantation processing on a surface of a workpiece W according to given ion implantation conditions. The ion implantation conditions include, for example, an ion species to be implanted into the workpiece W, an ion dose amount, and ion energy. The workpiece W is, for example, a substrate, or, for example, a wafer. Therefore, in the following, the workpiece W is also referred to as a substrate W for convenience of description. This is not intended to limit a target of the implantation processing to a particular object.

The ion implantation apparatus 100 includes an ion source 102, a beamline device 104, and an implantation processing chamber 106. Also, the ion implantation apparatus 100 includes a vacuum exhaust system (not illustrated) for providing desired vacuum environments to the ion source 102, the beamline device 104, and the implantation processing chamber 106.

The ion source 102 is configured to generate ions to be implanted into the substrate W. The ion source 102 provides the beamline device 104 with an ion beam B1 accelerated and extracted from the ion source 102 by an extraction electrode unit 118 that is an example of a component for adjusting a beam current. Hereinafter, this may be also referred to as an initial ion beam B1.

The beamline device 104 is configured to transportions from the ion source 102 to the implantation processing chamber 106. The beamline device 104 provides a beamline for transporting the ion beam. The beamline is a passage of the ion beam and may be also said as a path of beam trajectory. The beamline device 104 performs operations including deflection, acceleration, deceleration, shaping (focusing/defocusing), and scanning, with respect to the initial ion beam B1, thereby forming an ion beam B2. Hereinafter, this may be also referred to as an implantation ion beam B2. The beamline device 104 includes a plurality of beamline components arranged for such beam operations. In this manner, the beamline device 104 provides the implantation processing chamber 106 with the implantation ion beam B2.

The implantation ion beam B2 has a beam irradiation region 105 in the plane perpendicular to a beam transportation direction (or a direction along a beam trajectory) of the beamline device 104. Generally, the beam irradiation region 105 has a width including the width of the substrate W. For example, when the beamline device 104 includes a beam scanning device scanning a spot-shaped ion beam, the beam irradiation region 105 is an elongated irradiation region extending over a scanning range along a longitudinal direction perpendicular to the beam transportation direction. Also, likewise, when the beamline device 104 includes a ribbon beam generator, the beam irradiation region 105 is an elongated irradiation region extending in a longitudinal direction perpendicular to the beam transportation direction. However, the elongated irradiation region is a cross-section of a corresponding ribbon beam. The elongated irradiation region is longer than the width (diameter when the substrate W is circular) of the substrate W in a longitudinal direction.

The implantation processing chamber 106 includes a workpiece holder 107 holding the substrate W such that the substrate W receives the implantation ion beam B2. The workpiece holder 107 is configured to move the substrate W in a direction perpendicular to the beam transportation direction of the beamline device 104 and the longitudinal direction of the beam irradiation region 105. That is, the workpiece holder 107 provides a mechanical scan of the substrate W. In this application, the mechanical scan is the same as reciprocating motion. Also, the "perpendicular direction" is not limited to only a strict right angle. For example, when the implantation is performed in a state in which the substrate W is inclined in a vertical direction, the "perpendicular direction" may include such an inclined angle.

The implantation processing chamber 106 is configured as a serial-type implantation processing chamber. Therefore, the workpiece holder 107 typically holds one sheet of the substrate W. However, like the batch type, the workpiece holder 107 may include a support holding a plurality of (for example, small) substrates, and may be configured to mechanically scan the plurality of substrates by linearly reciprocating the support. In another embodiment, the implantation processing chamber 106 may be configured as a batch-type implantation processing chamber. In this case, for example, the workpiece holder 107 may include a rotating disk that rotatably holds a plurality of substrates W on the circumference of the disk. The rotating disk may be configured to provide a mechanical scanning.

Figure 3:
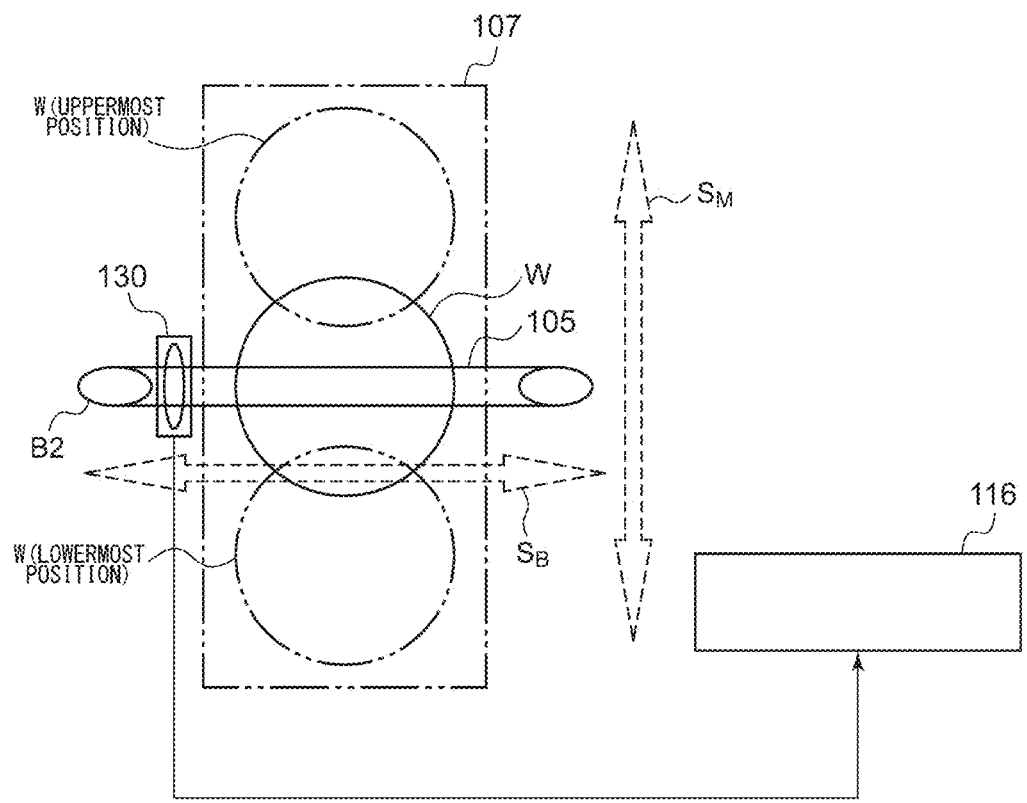
FIG. 3 is a diagram schematically illustrating an ion implantation apparatus according to an embodiment of the present invention.

FIG. 3 illustrates an example of the beam irradiation region 105 and the relevant mechanical scanning. The ion implantation apparatus 100 is configured to perform ion implantation by a hybrid scanning method using both one-dimensional beam scanning $S_B$ of the spot-shaped ion beam B2 and one-dimensional mechanical scanning $S_M$ of the substrate W. On the side of the workpiece holder 107, a beam measurement device 130 (for example, Faraday cup) is provided to overlap the beam irradiation region 105, and the measurement result may be provided to a control unit 116.

In this manner, the beamline device 104 is configured to supply the implantation processing chamber 106 with the implantation ion beam B2 having the beam irradiation region 105. The beam irradiation region 105 is formed to irradiate the implantation ion beam B2 across the substrate W in cooperation with the mechanical scanning of the substrate W. Therefore, ions can be implanted into the substrate W by the relative movement of the substrate W and the ion beam.

In another embodiment, the ion implantation apparatus 100 is configured to perform ion implantation by a ribbon beam+wafer scanning method using both the ribbon-shaped ion beam B2 and the one-dimensional mechanical scanning of the substrate W. The horizontal width of the ribbon beam is expanded while maintaining uniformity, and the substrate W is scanned so as to intersect with the ribbon beam. In a further embodiment, the ion implantation apparatus 100 may be configured to perform ion implantation by a method of two-dimensionally mechanically scanning the substrate W in a state in which the beam trajectory of the spot-shaped ion beam B2 is fixed.

Also, the ion implantation apparatus 100 is not limited to a particular implantation method for implanting ions across a broad region on the substrate W. An implantation method using no mechanical scanning is also possible. For example, the ion implantation apparatus 100 may be configured to perform ion implantation by a two-dimensional beam scanning method of two-dimensionally scanning the substrate W with the spot-shaped ion beam B2. Alternatively, the ion implantation apparatus 100 may be configured to perform ion implantation by a large-size beam method using the two-dimensionally expanded ion beam B2. The large-size beam is expanded to make a beam size equal to or larger than a substrate size while maintaining uniformity, and can process the entire substrate at one time.

Although details will be described below, the ion implantation apparatus 100 may be operated under a first beamline setting S1 for high-dose implantation or a second beamline setting S2 for low-dose implantation. Therefore, the beamline device 104 has the first beamline setting S1 or the second beamline setting S2 during operations. The two settings are determined to generate the ion beams for different ion implantation conditions under the common implantation method. Thus, in the first beamline setting S1 and the second beamline setting S2, the beam center trajectories being the reference of the ion beams B1 and B2 are identical to each other. The beam irradiation regions 105 are also identical to each other in the first beamline setting S1 and the second beamline setting S2.

The beam center trajectory being the reference refers to a beam trajectory when beam is not scanned in the beam scanning method. Also, in the case of the ribbon beam, the beam center trajectory being the reference corresponds to a locus of a geometric center of a beam cross-section.

The beamline device 104 may be divided into a beamline upstream part on the ion source 102 side and a beamline downstream part on the implantation processing chamber 106 side. In the beamline upstream part, for example, a mass analyzer 108 including a mass analysis magnet and a mass analysis slit is provided. The mass analyzer 108 analyzes the mass of the initial ion beam B1 and provides only necessary ion species to the beamline downstream part. In the beamline downstream part, for example, a beam irradiation region determination unit 110 is provided to determine the beam irradiation region 105 of the implantation ion beam B2.

The beam irradiation region determination unit 110 is configured to emit the ion beam having the beam irradiation region 105 (for example, the implantation ion beam B2) by applying either (or both) of an electric field and a magnetic field to the incident ion beam (for example, the initial ion beam B1). In an embodiment, the beam irradiation region determination unit 110 includes a beam scanning device and a beam parallelizing device. Examples of the beamline components will be described below with reference to FIG. 5.

Also, it should be understood that the division into the upstream part and the downstream part, as above-described, is mentioned for conveniently describing a relative position relationship of the components in the beamline device 104. Therefore, for example, a component in the beamline downstream part may be disposed at a place closer to the ion source 102 away from the implantation processing chamber 106. The opposite holds true as well. Therefore, in an embodiment, the beam irradiation region determination unit 110 may include a ribbon beam generator and a beam parallelizing device, and the ribbon beam generator may include the mass analyzer 108.

The beamline device 104 includes an energy adjustment system 112 and a beam current adjustment system 114. The energy adjustment system 112 is configured to adjust implantation energy to the substrate W. The beam current adjustment system 114 is configured to adjust the beam current in a broad range so as to change a dose amount implanted into the substrate W in a broad range. The beam current adjustment system 114 is provided to adjust the beam current of the ion beam quantitatively (rather than qualitatively). In an embodiment, the adjustment of the ion source 102 can be also used to adjust the beam current. In this case, the beam current adjustment system 114 may be considered to include the ion source 102. Details of the energy adjustment system 112 and the beam current adjustment system 114 will be described below.

Also, the ion implantation apparatus 100 includes a control unit 116 for controlling all or part of the ion implantation apparatus 100 (for example, all or part of the beamline device 104). The control unit 116 is configured to select any one from a plurality of beamline settings including the first beamline setting S1 and the second beamline setting S2, and operate the beamline device 104 under the selected beamline setting. Specifically, the control unit 116 sets the energy adjustment system 112 and the beam current adjustment system 114 according to the selected beamline setting, and controls the energy adjustment system 112 and the beam current adjustment system 114. Also, the control unit 116 may be a dedicated controller for controlling the energy adjustment system 112 and the beam current adjustment system 114.

The control unit 116 is configured to select a beamline setting suitable for given ion implantation conditions among the plurality of beamline settings including the first beamline setting S1 and the second beamline setting S2. The first beamline setting S1 is suitable for transport of a high-current beam for high-dose implantation into the substrate W. Therefore, for example, the control unit 116 selects the first beamline setting S1 when a desired ion dose amount implanted into the substrate W is in the range of about $1 \times 10^{14}$ to $1 \times 10^{17}$ atoms/cm$^2$. Also, the second beamline setting S2 is suitable for transport of a low-current beam for low-dose implantation into the substrate. Therefore, for example, the control unit 116 selects the second beamline setting S2 when a desired ion dose amount implanted into the substrate W is in the range of about $1 \times 10^{11}$ to $1 \times 10^{14}$ atoms/cm$^2$. Details of the beamline settings will be described below.

The energy adjustment system 112 includes a plurality of energy adjustment elements arranged along the beamline device 104. The plurality of energy adjustment elements is disposed at fixed positions on the beamline device 104. As illustrated in FIG. 2, the energy adjustment system 112 includes, for example, three adjustment elements, specifically, an upstream adjustment element 118, an intermediate adjustment element 120, and a downstream adjustment element 122. Each of these adjustment elements includes one or more electrodes configured to exert an electric field for accelerating or decelerating the initial ion beam B1 and/or the implantation ion beam B2.

The upstream adjustment element 118 is provided in the upstream part of the beamline device 104, for example, the most upstream part of the beamline device 104. The upstream adjustment element 118 includes, for example, an extraction electrode system for extracting the initial ion beam B1 from the ion source 102 to the beamline device 104. The intermediate adjustment element 120 is installed in the middle portion of the beamline device 104 and includes, for example, an electrostatic beam parallelizing device. The downstream adjustment element 122 is provided in the downstream part of the beamline device 104 and includes, for example, an acceleration/deceleration column. The downstream adjustment element 122 may include an angular energy filter (AEF) disposed in the downstream of the acceleration/deceleration column.

Also, the energy adjustment system 112 includes a power supply system for the above-described energy adjustment elements. This will be described below with reference to FIGS. 6 and 7. Also, the plurality of energy adjustment elements may be provided in any number anywhere on the beamline device 104, which is not limited to the illustrated arrangement. Also, the energy adjustment system 112 may include only one energy adjustment element.

The beam current adjustment system 114 is provided in the upstream part of the beamline device 104, and includes a beam current adjustment element 124 for adjusting the beam current of the initial ion beam B1. The beam current adjustment element 124 is configured to block at least a portion of the initial ion beam B1 when the initial ion beam B1 passes through the beam current adjustment element 124. In an embodiment, the beam current adjustment system 114 may include a plurality of beam current adjustment elements 124 arranged along the beamline device 104. Also, the beam current adjustment system 114 may be provided in the downstream part of the beamline device 104.

The beam current adjustment element 124 includes a movable portion for adjusting a passage region of the ion beam cross-section perpendicular to the beam transportation direction of the beamline device 104. According to the movable portion, the beam current adjustment element 124 constitutes a beam limiting device having a variable-width slit or a variable-shape opening for limiting a portion of the initial ion beam B1. Also, the beam current adjustment system 114 includes a driving device for continuously or discontinuously adjusting the movable portion of the beam current adjustment element 124.

Additionally or alternatively, the beam current adjustment element 124 may include a plurality of adjustment members (for example, adjustment aperture) each having a plurality of beam passage regions having different areas and/or shapes. The beam current adjustment element 124 may be configured to switch the adjustment member disposed on the beam trajectory among the plurality of adjustment members. In this manner, the beam current adjustment element 124 may be configured to adjust the beam current stepwise.

As illustrated, the beam current adjustment element 124 is a beamline component separate from the plurality of energy adjustment elements of the energy adjustment system 112. By separately installing the beam current adjustment element and the energy adjustment element, the beam current adjustment and the energy adjustment may be individually performed. This may increase the degree of freedom in the setting of the beam current range and the energy range in the individual beamline settings.

The first beamline setting S1 includes a first energy setting for the energy adjustment system 112 and a first beam current setting for the beam current adjustment system 114. The second beamline setting S2 includes a second energy setting for the energy adjustment system 112 and a second beam current setting for the beam current adjustment system 114. The first beamline setting S1 is directed to the low energy and high-dose ion implantation, and the second beamline setting S2 is directed to the high energy and low-dose ion implantation.

Therefore, the first energy setting is determined to be suitable for the transport of the low energy beam as compared with the second energy setting. Also, the second beam current setting is determined to reduce the beam current of the ion beam as compared with the first beam current setting. By combining the beam current adjustment and the irradiation time adjustment of the implantation ion beam B2, a desired dose amount can be implanted into the substrate W.

The first energy setting includes a first power supply connection setting that determines the connection between the energy adjustment system 112 and the power supply system thereof. The second energy setting includes a second power supply connection setting that determines the connection between the energy adjustment system 112 and the power supply system thereof. The power supply connection settings are determined such that the intermediate adjustment element 120 and/or the downstream adjustment element 122 generate an electric field for helping the beam transport. For example, the beam parallelizing device and/or the acceleration/deceleration column, as a whole, are configured to decelerate the implantation ion beam B2 under the first energy setting and accelerate the implantation ion beam B2 under the second energy setting. Due to the power supply connection settings, a voltage adjustment range of each adjustment element of the energy adjustment system 112 is determined. In the adjustment range, a voltage of the power supply corresponding to each adjustment element can be adjusted to provide a desired implantation energy to the implantation ion beam B2.

The first beam current setting includes a first opening setting that determines the ion beam passage region of the beam current adjustment element 124. The second beam current setting includes a second opening setting that determines the ion beam passage region of the beam current adjustment element 124. The second opening setting is determined such that the ion beam passage region is small as compared with the first opening setting. The opening settings determine, for example, the movable range of the movable portion of the beam current adjustment element 124. Alternatively, the opening settings may determine the adjustment member to be used. In this manner, the ion beam passage region corresponding to the desired beam current within the adjustment range determined by the opening settings may be set to the beam current adjustment element 124. The ion beam passage region can be adjusted such that a desired dose amount is implanted into the substrate W within a processing time permitted to the ion implantation processing.

Thus, the beamline device 104 has a first energy adjustment range under the first beamline setting S1 and has a second energy adjustment range under the second beamline setting S2. In order to enable a broad range of the adjustment, the first energy adjustment range has a portion overlapping the second energy adjustment range. That is, two adjustment ranges overlap each other in at least the ends thereof. The overlapping portion may be a straight-line in the diagram schematically illustrating range of an energy and dose of ion implantation apparatuses. In this case, two adjustment ranges contact each other. In another embodiment, the first energy adjustment range may be separated from the second energy adjustment range.

Likewise, the beamline device 104 has a first dose adjustment range under the first beamline setting S1 and has a second dose adjustment range under the second beamline setting S2. The first dose adjustment range has a portion overlapping the second dose adjustment range. That is, two adjustment ranges overlap each other in at least the ends thereof. The overlapping portion may be a straight-line in the diagram schematically illustrating range of an energy and dose of ion implantation apparatuses. In this case, two adjustment ranges contact each other. In another embodiment, the first dose adjustment range may be separated from the second dose adjustment range.

In this manner, the beamline device 104 is operated in a first operation mode under the first beamline setting S1. The first operation mode may be referred to as a low energy mode (or a high-dose mode). Also, the beamline device 104 is operated in a second operation mode under the second beamline setting S2. The second operation mode may be referred to as a high energy mode (or a low-dose mode). The first beamline setting S1 can be also referred to as a first implantation setting configuration suitable for the transport of a low energy/high-current beam for the high-dose implantation into the workpiece W. The second beamline setting S2 can be also referred to as a second implantation setting configuration suitable for the transport of a high energy/low-current beam for the low-dose implantation into the workpiece W.

An operator of the ion implantation apparatus 100 can switch the beamline settings before a certain ion implantation processing is performed, depending on the implantation conditions of the processing. Therefore, the broad range from the low energy (or high-dose) to the high energy (or low-dose) can be processed by one ion implantation apparatus.

Also, the ion implantation apparatus 100 corresponds to the broad range of the implantation conditions in the same implantation method. That is, the ion implantation apparatus 100 processes a broad range with substantially the same beamline device 104. Also, the ion implantation apparatus 100 has the serial-type configuration that is recently becoming the mainstream. Therefore, although details will be described below, the ion implantation apparatus 100 is suitable for use as a shared unit of the existing ion implantation apparatuses (for example, HC and MC).

The beamline device 104 can also be considered to include a beam control device for controlling the ion beam, a beam conditioning device for conditioning the ion beam, and a beam focusing/defocusing device for focusing/defocusing the ion beam. The beamline device 104 supplies the ion beam having the beam irradiation region 105 exceeding the width of the workpiece W in the implantation processing chamber 106 by using the beam control device, the beam conditioning device, and the beam focusing/defocusing device. In the ion implantation apparatus 100, the beam control device, the beam conditioning device, and the beam focusing/defocusing device may have the same hardware configuration in the first beamline setting S1 and the second beamline setting S2. In this case, the beam control device, the beam conditioning device, and the beam focusing/defocusing device may be disposed with the same layout in the first beamline setting S1 and the second beamline setting S2. Therefore, the ion implantation apparatus 100 may have the same installation floor area (so-called footprint) in the first beamline setting S1 and the second beamline setting S2.

The beam center trajectory being the reference is a beam trajectory that is a locus of geometric center of the beam cross-section without beam scanning in the beam scanning method. Also, in the case of the ribbon beam that is a stationary beam, the beam center trajectory being the reference corresponds to a locus of a geometric center of the beam cross-section, regardless of a change in the beam cross-sectional shape in the implantation ion beam B2 of the downstream part.

The beam control device may include the control unit 116. The beam conditioning device may include the beam irradiation region determination unit 110. The beam conditioning device may include an energy filter or a deflection element. The beam focusing/defocusing device may include a first XY focusing lens 206, a second XY focusing lens 208, and a Y focusing lens 210, which are to be described below.

It can be considered that, in the case of the beam scanning method, the initial ion beam B1 takes a single beam trajectory in the upstream part of the beamline device 104, and in the downstream part the implantation ion beam B2 takes a plurality of beam trajectories due to the beam scanning and parallelizing with reference to the beam center trajectory being the reference. However, in the case of the ribbon beam, it becomes a beam irradiation zone because the beam cross-sectional shape of the single beam trajectory is changed and the beam width is widened. Thus, the beam trajectory is also single. According to this view, the beam irradiation region 105 may be also referred to as an ion beam trajectory zone. Therefore, in the ion implantation apparatus 100, the implantation ion beam B2 has the same ion beam trajectory zone in the first beamline setting S1 and the second beamline setting S2.

Figure 4:
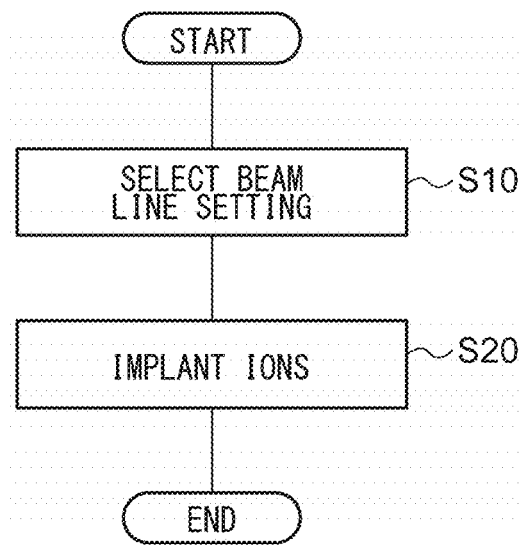
FIG. 4 is a flowchart illustrating an ion implantation method according to an embodiment of the present invention.

FIG. 4 is a flowchart illustrating an ion implantation method according to an embodiment of the present invention. This ion implantation method is suitable for use in the ion implantation apparatus 100. This method is performed by the control unit 116. As illustrated in FIG. 4, this method includes a beamline setting selecting step (S10) and an ion implantation step (S20).

The control unit 116 selects a beamline setting suitable for given ion implantation conditions among a plurality of beamline settings (S10). As described above, the plurality of beamline settings includes a first beamline setting S1 suitable for transport of a high-current beam for high-dose implantation into a workpiece, and a second beamline setting S2 suitable for transport of a low-current beam for low-dose implantation into a workpiece. For example, the control unit 116 selects the first beamline setting S1 when a desired ion dose amount implanted into a substrate W exceeds a threshold value, and selects the second beamline setting S2 when the desired ion dose amount is smaller than the threshold value. Also, as described below, the plurality of beamline settings (or implantation setting configurations) may include a third beamline setting (or third implantation setting configuration) and/or a fourth beamline setting (or fourth implantation setting configuration).

When the first beamline setting S1 is selected, the control unit 116 sets the energy adjustment system 112 by using the first energy setting. The energy adjustment system 112 and the power supply thereof are connected according to a first power supply connection setting. Also, the control unit 116 sets the beam current adjustment system 114 by using the first beam current setting. Therefore, the ion beam passage region (or adjustment range thereof) is set according to the first opening setting. Likewise, when the second beamline setting S2 is selected, the control unit 116 sets the energy adjustment system 112 by using the second energy setting, and sets the beam current adjustment system 114 by using the second beam current setting.

The selecting process step may include a process step of adjusting the beamline device 104 in the adjustment range according to the selected beamline setting. In the adjusting process step, each adjustment element of the beamline device 104 is adjusted within a corresponding adjustment range so as to generate the ion beam of a desired implantation condition. For example, the control unit 116 determines a voltage of a power supply corresponding to each adjustment element of the energy adjustment system 112 so as to obtain a desired implantation energy. Also, the control unit 116 determines the ion beam passage region of the beam current adjustment element 124 so as to obtain a desired implantation dose amount.

In this manner, the control unit 116 operates the ion implantation apparatus 100 under the selected beamline setting (S20). The implantation ion beam B2 having the beam irradiation region 105 is generated and supplied to the substrate W. The implantation ion beam B2 scans the entire substrate W in cooperation with the mechanical scanning of the substrate W (or with the beam alone). As a result, ions are implanted into the substrate W at the energy and dose amount of the desired ion implantation conditions.

The serial-type high-dose high-current ion implantation apparatus, which is being used in device production, currently adopts a hybrid scanning method, a two-dimensional mechanical scanning method, and a ribbon beam+wafer scanning method. However, the two-dimensional mechanical scanning method has a limitation in increase of a scanning speed due to a load of mechanical driving mechanism of the mechanical scanning, and thus, the two-dimensional mechanical scanning method disadvantageously cannot suppress implantation non-uniformity sufficiently. Also, in the ribbon beam+wafer scanning method, uniformity is easily degraded when the beam size is expanded in a horizontal direction. Therefore, in particular, there are problems in the uniformity and the identity of beam angle in the low-dose condition (low beam current condition). However, when the obtained implantation result is within an allowable range, the ion implantation apparatus of the present invention may be configured by the two-dimensional mechanical scanning method or the ribbon beam+wafer scanning method.

On the other hand, the hybrid scanning method can achieve excellent uniformity in the beam scanning direction by adjusting the bean scanning speed at high accuracy. Also, by performing the beam scanning at a sufficient high speed, implantation non-uniformity in the wafer scanning direction can be sufficiently suppressed. Therefore, the hybrid scanning method is considered as optimal over a broad range of the dose condition.

FIG. 5A is a plan view illustrating a schematic configuration of an ion implantation apparatus 200 according to an embodiment of the present invention, and FIG. 5B is a side view illustrating a schematic configuration of an ion implantation apparatus 200 according to an embodiment of the present invention. The ion implantation apparatus 200 is an embodiment when the hybrid scanning method is applied to the ion implantation apparatus 100 illustrated in FIG. 2. Also, like the ion implantation apparatus 100 illustrated in FIG. 2, the ion implantation apparatus 200 is a serial-type apparatus.

As illustrated, the ion implantation apparatus 200 includes a plurality of beamline components. The beamline upstream part of the ion implantation apparatus 200 includes, in order from the upstream side, an ion source 201, a mass analysis magnet 202, a beam dump 203, a resolving aperture 204, a current suppression mechanism 205, a first XY focusing lens 206, a beam current measurement device 207, and a second XY focusing lens 208. An extraction electrode 218 (see FIGS. 6 and 7) for extracting ions from the ion source 201 is provided between the ion source 201 and the mass analysis magnet 202.

A scanner 209 is provided between the beamline upstream part and the beamline downstream part. The beamline downstream part includes, in order from the upstream side, a Y focusing lens 210, a beam parallelizing mechanism 211, an AD (Accel/Decel) column 212, and an energy filter 213. A wafer 214 is disposed in the most downstream part of the beamline downstream part. The beamline components from the ion source 201 to the beam parallelizing mechanism 211 are accommodated in a terminal 216.

The current suppression mechanism 205 is an example of the above-described beam current adjustment system 114. The current suppression mechanism 205 is provided for switching a low-dose mode and a high-dose mode. The current suppression mechanism 205 includes, for example, a continuously variable aperture (CVA). The CVA is an aperture capable of adjusting an opening size by a driving mechanism. Therefore, the current suppression mechanism 205 is configured to operate in a relatively small opening size adjustment range in the low-dose mode, and operate in a relatively large opening size adjustment range in the high-dose mode. In an embodiment, in addition or alternative to the current suppression mechanism 205, a plurality of resolving apertures 204 having different opening widths may be configured to operate with different settings in the low-dose mode and the high-dose mode.

The current suppression mechanism 205 serves to help beam adjustment under the low beam current condition by limiting an ion beam amount arriving at the downstream. The current suppression mechanism 205 is provided in the beamline upstream part (that is, from the ion extraction from the ion source 201 to the upstream side of the scanner 209). Therefore, the beam current adjustment range can be increased. Also, the current suppression mechanism 205 may be provided in the beamline downstream part.

The beam current measurement device 207 is, for example, a movable flag Faraday.

The first XY focusing lens 206, the second XY focusing lens 208, and the Y focusing lens 210 constitute the beam focusing/decousing device for adjusting the beam shape in the vertical and horizontal directions (beam cross-section in an XY plane). As such, the beam focusing/defocusing device includes a plurality of lenses arranged along the beamline between the mass analysis magnet 202 and the beam parallelizing mechanism 211. The beam focusing/defocusing device can use the convergence/divergence effect of these lenses in order to appropriately transport the ion beam up to the downstream in a broad range of energy/beam current condition. That is, the ion beam can be appropriately transported to the wafer 214 in any condition of low energy/low beam current, low energy/high beam current, high energy/low beam current, and high energy/high beam current.

The first XY focusing lens 206 is, for example, a Q lens. The second XY focusing lens 208 is, for example, an XY-direction einzel lens. The Y focusing lens 210 is, for example, a Y-direction einzel lens or Q lens. Each of the first XY focusing lens 206, the second XY focusing lens 208, and the Y focusing lens 210 may be a single lens or a group of lenses. In this manner, the beam focusing/defocusing device is designed to appropriately control the ion beam from the low energy/high beam current condition having a beam self-divergence problem caused by a large beam potential to the high energy/low beam current having a beam cross-sectional shape control problem caused by a small beam potential.

The energy filter 213 is, for example, an angular energy filter (AEF) having a deflection electrode or a deflection electromagnet, or both of the defection electrode and the deflection electromagnet.

The ions generated in the ion source 201 are accelerated with an extraction electric field (not illustrated). The accelerated ions are deflected in the mass analysis magnet 202. In this manner, only ions having a predetermined energy and a mass-to-charge ratio pass through the resolving aperture 204. Subsequently, the ions are guided to the scanner 209 through the current suppression mechanism (CVA) 205, the first XY focusing lens 206, and the second XY focusing lens 208.

The scanner 209 reciprocally scans the ion beam in a horizontal direction (which may be a vertical direction or an oblique direction) by applying either (or both) of a periodic electric field and a periodic magnetic field. Due to the scanner 209, the ion beam is adjusted such that the ion beam is uniformly implanted in a horizontal direction on the wafer 214. The traveling direction of the ion beam 215 with which the scanner 209 scans can be parallelized by the beam parallelizing mechanism 211 using the application of either (or both) of the electric field and the magnetic field. Thereafter, the ion beam 215 is accelerated or decelerated to have a predetermined energy in the AD column 212 by applying the electric field. The ion beam 215 exiting the AD column 212 reaches the final implantation energy (in the low energy mode, the energy may be adjusted to be higher than the implantation energy, and the ion beam may be deflected while decelerating in the energy filter). The energy filter 213 in the downstream of the AD column 212 deflects the ion beam 215 to the wafer 214 by the application of either (or both) of the electric field and the magnetic field with the deflection electrode or the deflection electromagnet. Thus, a contamination with energy other than target energy is eliminated. In this manner, the purified ion beam 215 is implanted into the wafer 214.

Also, the beam dump 203 is disposed between the mass analysis magnet 202 and the resolving aperture 204. The beam dump 203 deflects the ion beam by applying the electric field when necessary. Therefore, the beam dump 203 can control the arrival of the ion beam at the downstream at high speed.

Figure 5:
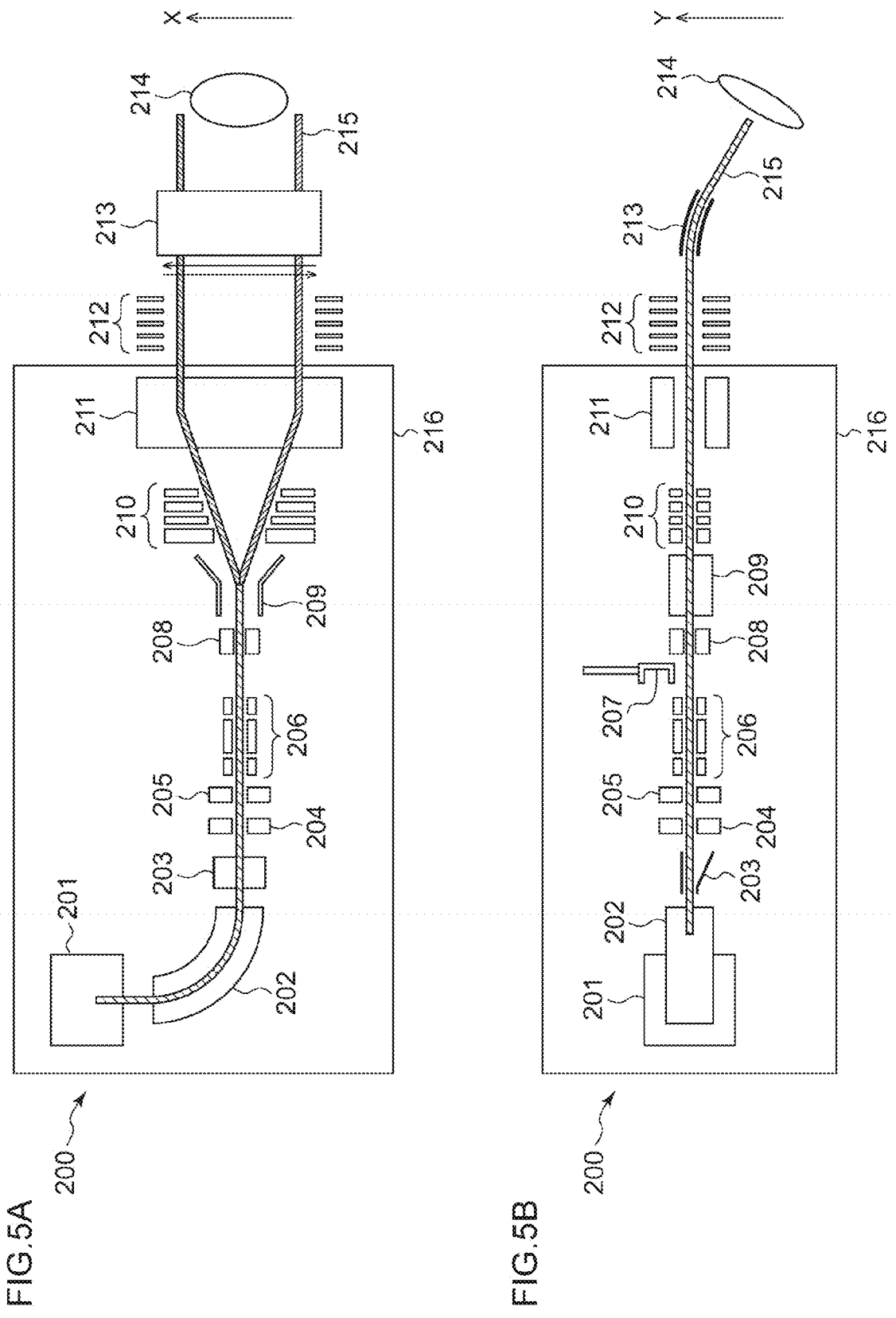
FIG. 5A is a plan view illustrating a schematic configuration of an ion implantation apparatus according to an embodiment of the present invention.
FIG. 5B is a side view illustrating a schematic configuration of an ion implantation apparatus according to an embodiment of the present invention.
Figure 6:
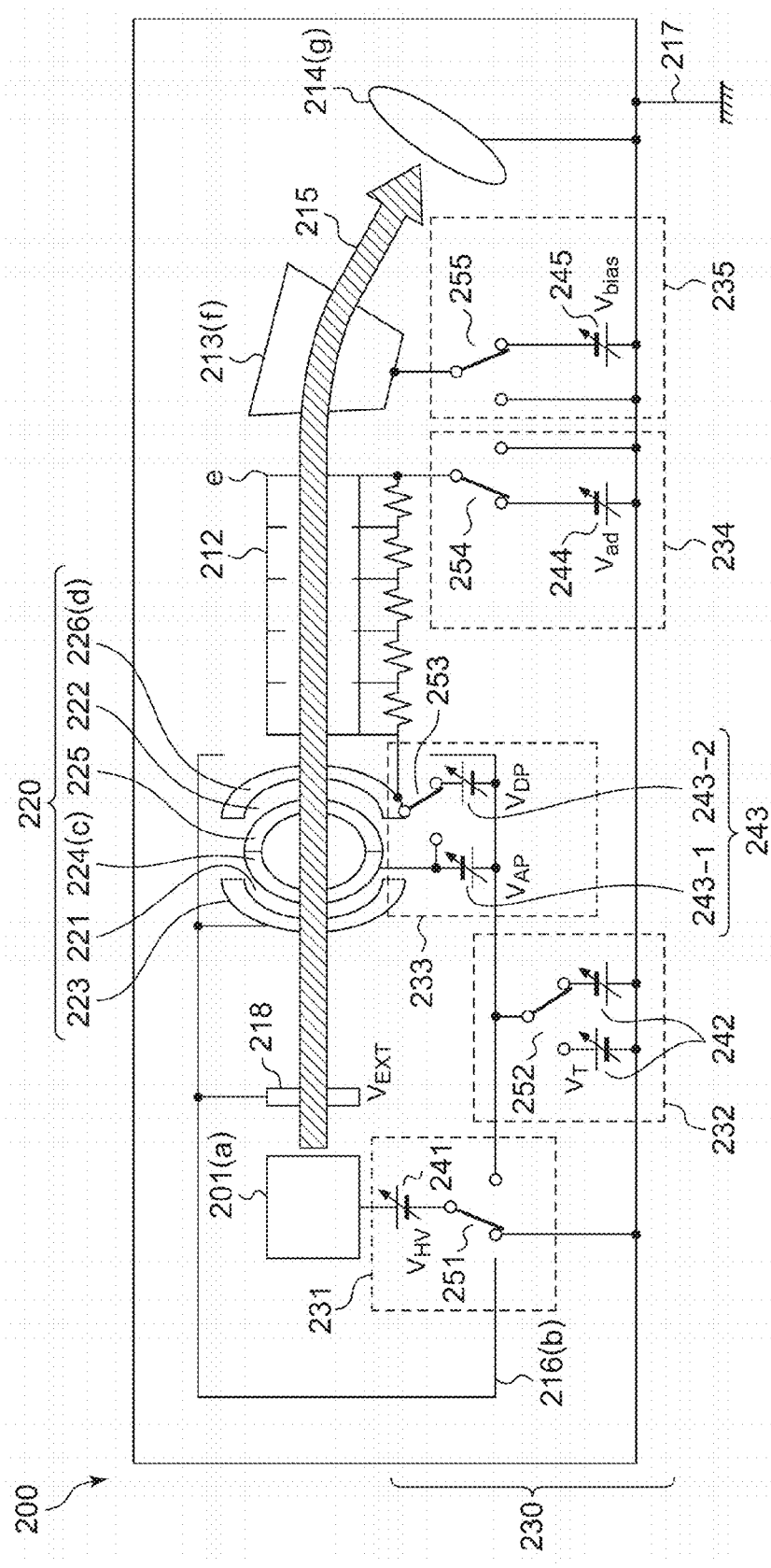
FIG. 6 is a diagram schematically illustrating a configuration of a power supply of an ion implantation apparatus according to an embodiment of the present invention.
Figure 7:
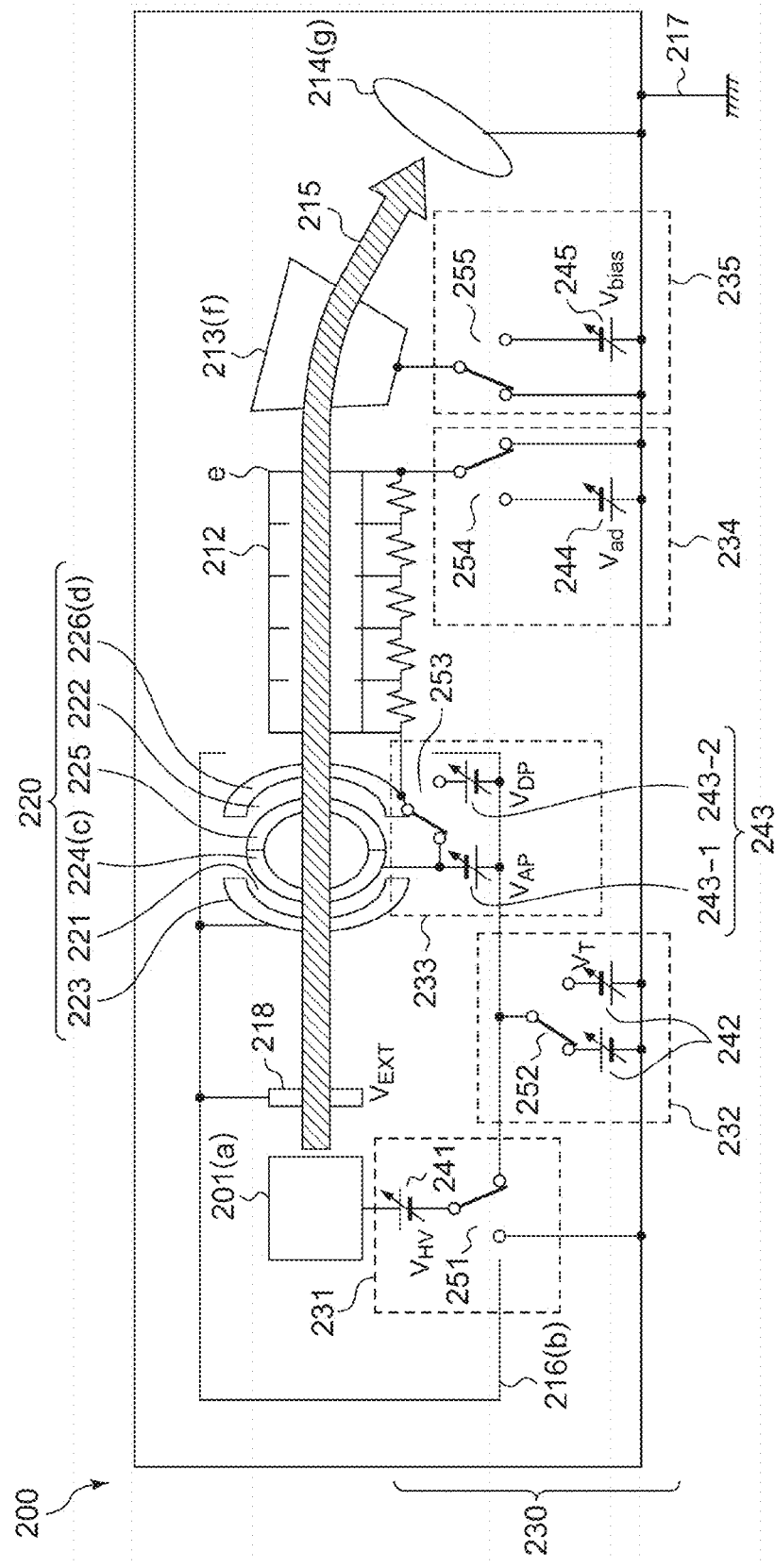
FIG. 7 is a diagram schematically illustrating a configuration of a power supply of an ion implantation apparatus according to an embodiment of the present invention.

Next, the low energy mode and the high energy mode in the ion implantation apparatus 200 illustrated in FIG. 5 will be described with reference to the configuration system diagram of the high-voltage power supply system 230 illustrated in FIGS. 6 and 7. FIG. 6 illustrates a power supply switching state of the low energy mode, and FIG. 7 illustrates a power supply switching state of the high energy mode. FIGS. 6 and 7 illustrate main components related to the energy adjustment of the ion beam among the beamline components illustrated in FIG. 5. In FIGS. 6 and 7, the ion beam 215 is indicated by an arrow.

As illustrated in FIGS. 6 and 7, the beam parallelizing mechanism 211 (see FIG. 5) includes a double P lens 220. The double P lens 220 includes a first voltage gap 221 and a second voltage gap 222 disposed spaced apart from each other along the ion movement direction. The first voltage gap 221 is disposed in the upstream, and the second voltage gap 222 is disposed in the downstream.

The first voltage gap 221 is formed between a pair of electrodes 223 and 224. The second voltage gap 222 is formed between another pair of electrodes 225 and 226 disposed in the downstream of the electrodes 223 and 224. The first voltage gap 221 and the electrodes 223 and 224 forming the gap 221 have a convex shape toward the upstream side. Conversely, the second voltage gap 222 and the electrodes 225 and 226 forming the gap 222 have a convex shape toward the downstream side. Also, for convenience of description, these electrodes may be also referred to as a first P lens upstream electrode 223, a first P lens downstream electrode 224, a second P lens upstream electrode 225, and a second P lens downstream electrode 226 below.

The double P lens 220 parallelizes the incident ion beam before emission and adjusts the energy of the ion beam by a combination of the electric fields applied to the first voltage gap 221 and the second voltage gap 222. That is, the double P lens 220 accelerates or decelerates the ion beam by the electric fields of the first voltage gap 221 and the second voltage gap 222.

Also, the ion implantation apparatus 200 includes a high-voltage power supply system 230 including a power supply for the beamline components. The high-voltage power supply system 230 includes a first power supply unit 231, a second power supply unit 232, a third power supply unit 233, a fourth power supply unit 234, and a fifth power supply unit 235. As illustrated, the high-voltage power supply system 230 includes a connection circuit for connecting the first to fifth power supply units 231 to 235 to the ion implantation apparatus 200.

The first power supply unit 231 includes a first power supply 241 and a first switch 251. The first power supply 241 is provided between the ion source 201 and the first switch 251, and is a DC power supply that provides the ion source 201 with a positive voltage. The first switch 251 connects the first power supply 241 to a ground 217 in the low energy mode (see FIG. 6), and connects the first power supply 241 to a terminal 216 in the high energy mode (see FIG. 7). Therefore, the first power supply 241 provides a voltage $V_{HV}$ to the ion source 201 in the low energy mode on the basis of a ground potential. This provides the total ion energy as it is. On the other hand, the first power supply 241 provides a voltage $V_{HV}$ to the ion source 201 in the high energy mode on the basis of a terminal potential.

The second power supply unit 232 includes a second power supply 242 and a second switch 252. The second power supply 242 is provided between the terminal 216 and the ground 217, and is a DC power supply that provides the terminal 216 with one of positive and negative voltages by the switching of the second switch 252. The second switch 252 connects a negative electrode of the second power supply 242 to the terminal 216 in the low energy mode (see FIG. 6), and connects a positive electrode of the second power supply 242 to the terminal 216 in the high energy mode (see FIG. 7). Therefore, the second power supply 242 provides a voltage $V_T$ ($V_T<0$) to the terminal 216 in the low energy mode on the basis of the ground potential. On the other hand, the second power supply 242 provides a voltage $V_T$ ($V_T$>0) to the terminal 216 in the high energy mode on the basis of the ground potential.

Therefore, an extraction voltage $V_{EXT}$ of the extraction electrode 218 is $V_{EXT}=V_{HV}-V_T$ in the low energy mode, and is $V_{EXT}=V_{HV}$ in the high energy mode. When a charge of an ion is q, the final energy is $qV_{HV}$ in the low energy mode, and is $q(V_{HV}+V_T)$ in the high energy mode.

The third power supply unit 233 includes a third power supply 243 and a third switch 253. The third power supply 243 is provided between the terminal 216 and the double P lens 220. The third power supply 243 includes a first P lens power supply 243-1 and a second P lens power supply 243-2. The first P lens power supply 243-1 is a DC power supply that provides a voltage $V_{AP}$ to the first P lens downstream electrode 224 and the second P lens upstream electrode 225 on the basis of the terminal potential. The second P lens power supply 243-2 is a DC power supply that provides a voltage $V_{DP}$ to a destination through the third switch 253 on the basis of the terminal potential. The third switch 253 is provided between the terminal 216 and the double P lens 220 to connect one of the first P lens power supply 243-1 and the second P lens power supply 243-2 to the second P lens downstream electrode 226 by the switching. Also, the first P lens upstream electrode 223 is connected to the terminal 216.

The third switch 253 connects the second P lens power supply 243-2 to the second P lens downstream electrode 226 in the low energy mode (see FIG. 6), and connects the first P lens power supply 243-1 to the second P lens downstream electrode 226 in the high energy mode (see FIG. 7). Therefore, the third power supply 243 provides a voltage $V_{DP}$ to the second P lens downstream electrode 226 in the low energy mode on the basis of the terminal potential. On the other hand, the third power supply 243 provides a voltage $V_{AP}$ to the second P lens downstream electrode 226 in the high energy mode on the basis of the terminal potential.

The fourth power supply unit 234 includes a fourth power supply 244 and a fourth switch 254. The fourth power supply 244 is provided between the fourth switch 254 and the ground 217 and is a DC power supply that provides a negative voltage to an exit (that is, the downstream end) of the AD column 212. The fourth switch 254 connects the fourth power supply 244 to the exit of the AD column 212 in the low energy mode (see FIG. 6), and connects the exit of the AD column 212 to the ground 217 in the high energy mode (see FIG. 7). Therefore, the fourth power supply 244 provides a voltage $V_{ad}$ to the exit of the AD column 212 in the low energy mode on the basis of the ground potential. On the other hand, the fourth power supply 244 is not used in the high energy mode.

The fifth power supply unit 235 includes a fifth power supply 245 and a fifth switch 255. The fifth power supply 245 is provided between the fifth switch 255 and the ground 217. The fifth power supply 245 is provided for the energy filter (AEF) 213. The fifth switch 255 is provided for switching the operation modes of the energy filter 213. The energy filter 213 is operated in a so-called offset mode in the low energy mode, and is operated in a normal mode in the high energy mode. The offset mode is an operation mode of the AEF in which an average value of the positive electrode and the negative electrode is a negative potential. The beam convergence effect of the offset mode can prevent beam loss caused by the beam divergence in the AEF. The normal mode is an operation mode of the AEF in which an average value of the positive electrode and the negative electrode is the ground potential.

The ground potential is provided to the wafer 214.

Figure 8A:
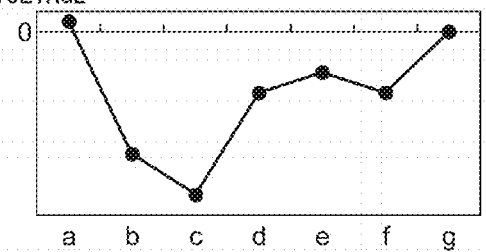
FIG. 8A is a diagram illustrating a voltage in an ion implantation apparatus according to an embodiment of the present invention.
Figure 8B:
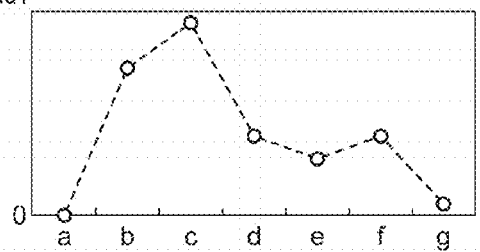
FIG. 8B is a diagram illustrating an energy in an ion implantation apparatus according to an embodiment of the present invention.
Figure 9A:
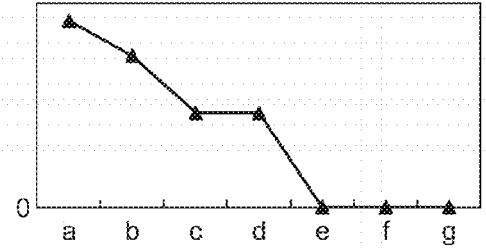
FIG. 9A is a diagram illustrating a voltage in an ion implantation apparatus according to an embodiment of the present invention.
Figure 9B:
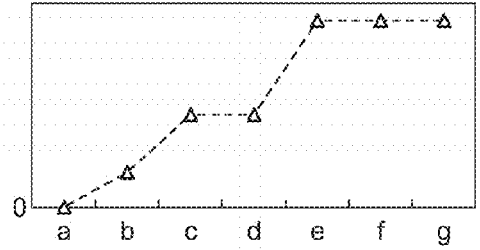
FIG. 9B is a diagram illustrating an energy in an ion implantation apparatus according to an embodiment of the present invention.

FIG. 8A illustrates an example of a voltage applied to each portion of the ion implantation apparatus 200 in the low energy mode, and FIG. 8B illustrates an example of energy of the ion in each portion of the ion implantation apparatus 200 in the low energy mode. FIG. 9A illustrates an example of a voltage applied to each portion of the ion implantation apparatus 200 in the high energy mode, and FIG. 9B illustrates an example of energy of the ion in each portion of the ion implantation apparatus 200 in the high energy mode. The vertical axes in FIGS. 8A and 9A represent the voltage, and the vertical axes in FIGS. 8B and 9B represent the energy. In the horizontal axes of the respective drawings, locations in the ion implantation apparatus 200 are represented by symbols a to g. The symbols a, b, c, d, e, f, and g represent the ion source 201, the terminal 216, the acceleration P lens (first P lens downstream electrode 224), the deceleration P lens (second P lens downstream electrode 226), the exit of the AD column 212, the energy filter 213, and the wafer 214, respectively.

The double P lens 220 has a configuration that uses the acceleration P lens c alone, or uses the deceleration P lens d alone, or uses both of the acceleration P lens c and the deceleration P lens d, when necessary according to the implantation condition. In the configuration that uses both of the acceleration P lens c and the deceleration P lens d, the double P lens 220 can be configured to change the distribution of the acceleration and deceleration effects by using both of the acceleration effect and the deceleration effect. In this case, the double P lens 220 can be configured such that a difference between the incident beam energy to the double P lens 220 and the exit beam energy from the double P lens 220 is used to accelerate or decelerate the beam. Alternatively, the double P lens 220 can be configured such that the difference between the incident beam energy and the exit beam energy becomes zero, and thus, the beam is neither accelerated nor decelerated.

As an example, as illustrated, in the low energy mode, the double P lens 220 is configured to decelerate the ion beam in the deceleration P lens d, accelerate the ion beam in the acceleration P lens c to some extent when necessary, and thereby the ion beam is decelerated as a whole. On the other hand, in the high energy mode, the double P lens 220 is configured to accelerate the ion beam only in the acceleration P lens c. Also, in the high energy mode, the double P lens 220 may be configured to decelerate the ion beam in the deceleration P lens d to some extent when necessary, as long as the ion beam is accelerated as a whole.

Since the high-voltage power supply system 230 is configured as above, the voltages applied to several regions on the beamline can be changed by the switching of the power supply. Also, the voltage application paths in some regions can also be changed. By using these, it is possible to switch the low energy mode and the high energy mode in the same beamline.

In the low energy mode, the potential $V_{HV}$ of the ion source 201 is directly applied on the basis of the ground potential. Therefore, a high-accuracy voltage application to the source unit is possible, and the accuracy of energy setting can be increased during the ion implantation at low energy. Also, by setting the terminal voltage $V_T$, the P lens voltage $V_{DP}$, the AD column exit voltage $V_{ad}$, and the energy filter voltage $V_{bias}$ to negative, it is possible to transport the ions to the energy filter at a relatively high energy. Therefore, the transport efficiency of the ion beam can be improved, and the high current can be obtained.

Also, in the low energy mode, the deceleration P lens is employed to facilitate the ion beam transport in the high energy state. This helps the low energy mode coexist with the high energy mode in the same beamline. Also, in the low energy mode, an expanded beam by design is generated by adjusting the convergence/divergence elements of the beamline in order to transport the beam such that the self-divergence of the beam is minimized. This also helps the low energy mode coexist with the high energy mode in the same beamline.

In the high energy mode, the potential of the ion source 201 is the sum of the acceleration extraction voltage $V_{HV}$ and the terminal potential $V_T$. This can enable the application of the high voltage to the source unit, and accelerate ions at high energy.

Figure 10:
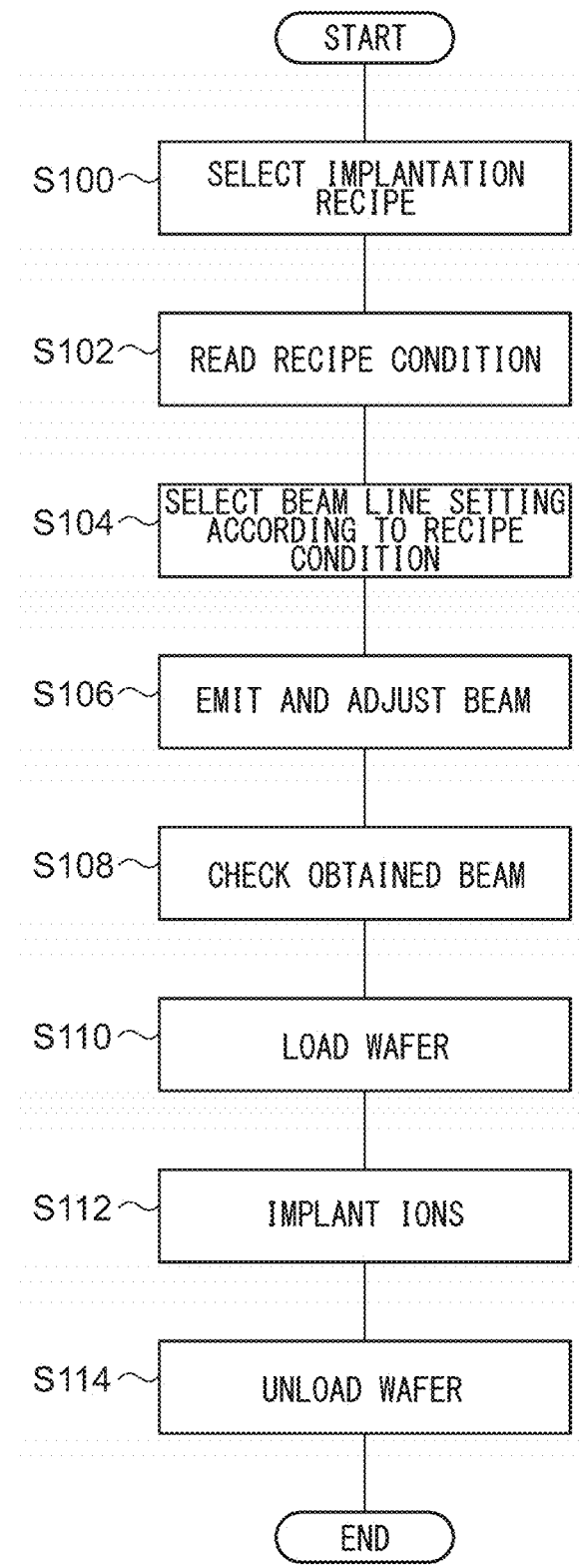
FIG. 10 is a flowchart illustrating an ion implantation method according to an embodiment of the present invention.

FIG. 10 is a flowchart illustrating an ion implantation method according to an embodiment of the present invention. This method may be performed by, for example, the beam control device for the ion implantation apparatus. As illustrated in FIG. 10, first, the implantation recipe is selected (S100). The control device reads the recipe condition (S102), and selects the beamline setting according to the recipe condition (S104). The ion beam adjusting process is performed under the selected beamline setting. The adjusting process includes a beam emission and adjustment (S106) and an obtained beam checking (S108). In this manner, the preparing process for the ion implantation is ended. Next, the wafer is loaded (S110), the ion implantation is performed (S112), and the wafer is unloaded (S114). Steps 110 to 114 may be repeated until the desired number of wafers are processed.

Figure 11:
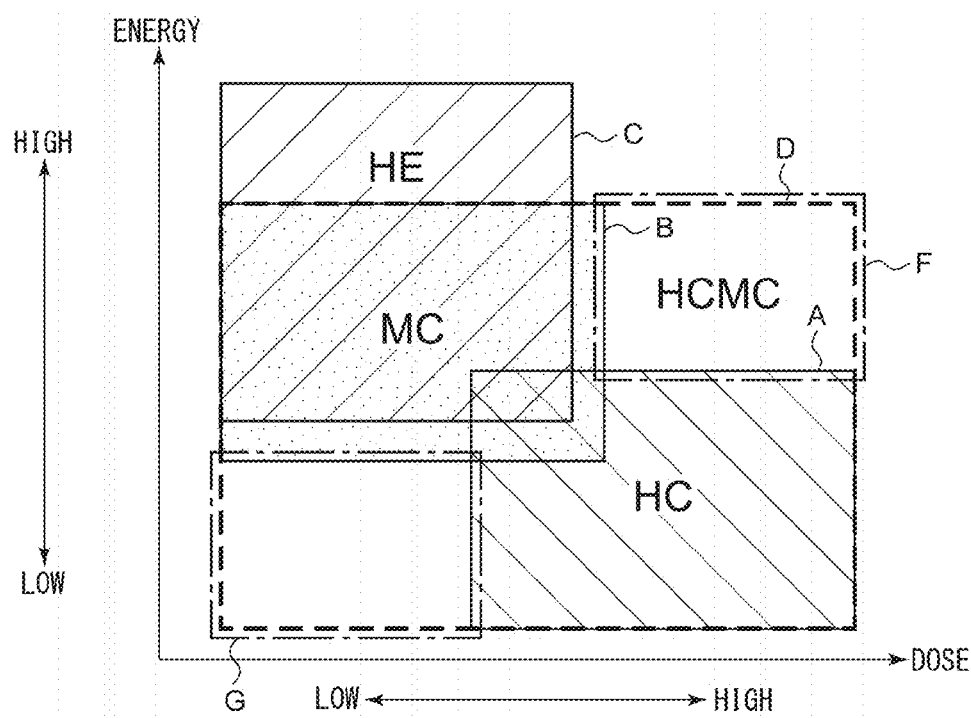
FIG. 11 is a diagram schematically illustrating ranges of an energy and a dose amount in an ion implantation apparatuses according to an embodiment of the present invention.

FIG. 11 schematically illustrates a range D of energy and dose amount that is realized by the ion implantation apparatus 200. Like in FIG. 1, FIG. 11 illustrates the range of energy and dose amount that can be processed in the actually allowable productivity. For comparison, ranges A, B and C of energy and dose amount of the HC, the MC, and the HE illustrated in FIG. 1 are illustrated in FIG. 11.

As illustrated in FIG. 11, it can be seen that the ion implantation apparatus 200 includes all the operation ranges of the existing apparatuses HC and MC. Therefore, the ion implantation apparatus 200 is a novel apparatus beyond the existing framework. Even one novel ion implantation apparatus can serve as the two existing types of categories HC and MC while maintaining the same beamline and the implantation method. Therefore, this apparatus may be referred to as HCMC.

Therefore, according to the present embodiment, it is possible to provide the HCMC in which the serial-type high-dose high-current ion implantation apparatus and the serial-type medium-dose medium-current ion implantation apparatus are configured as a single apparatus. The HCMC can perform the implantation in a broad range of energy condition and dose condition by changing the voltage applying method in the low energy condition and the high energy condition and changing the beam current from high current to low current in the CVA.

Figure 12:
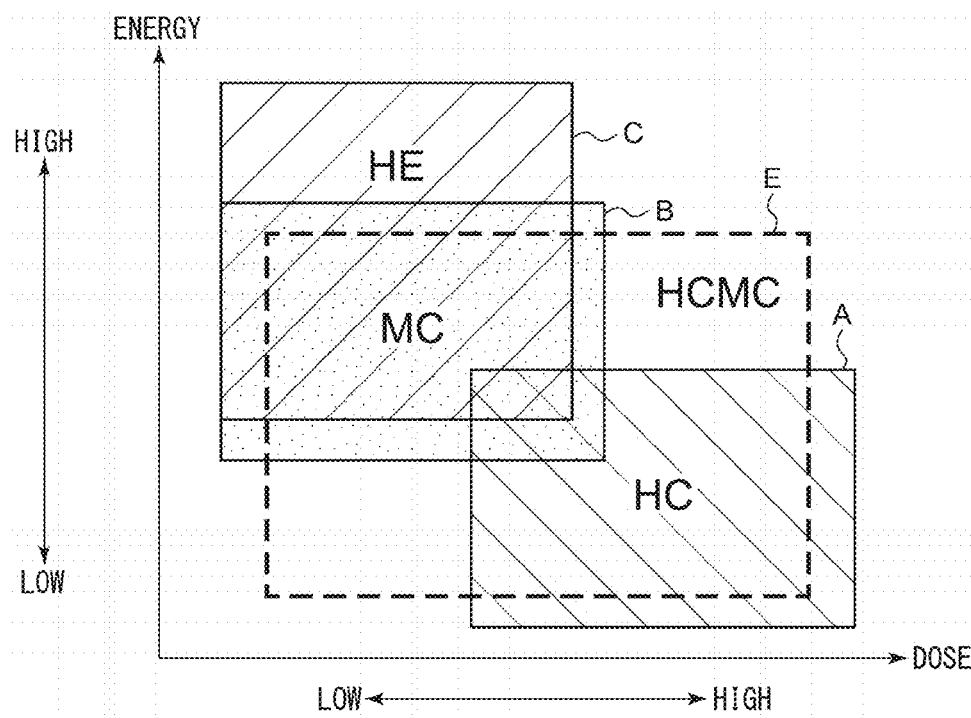
FIG. 12 is a diagram schematically illustrating ranges of an energy and a dose amount in an ion implantation apparatuses according to an embodiment of the present invention.

Also, the HCMC-type ion implantation apparatus may not include all the implantation condition ranges of the existing HC and MC. Considering the tradeoff of the device manufacturing cost and the implantation performance, it may be thought to provide an apparatus having a range E (see FIG. 12) narrower than the range D illustrated in FIG. 11. In this case, the ion implantation apparatus having excellent practicality can be provided as long as it covers the ion implantation conditions required for the device maker.

Figure 13:
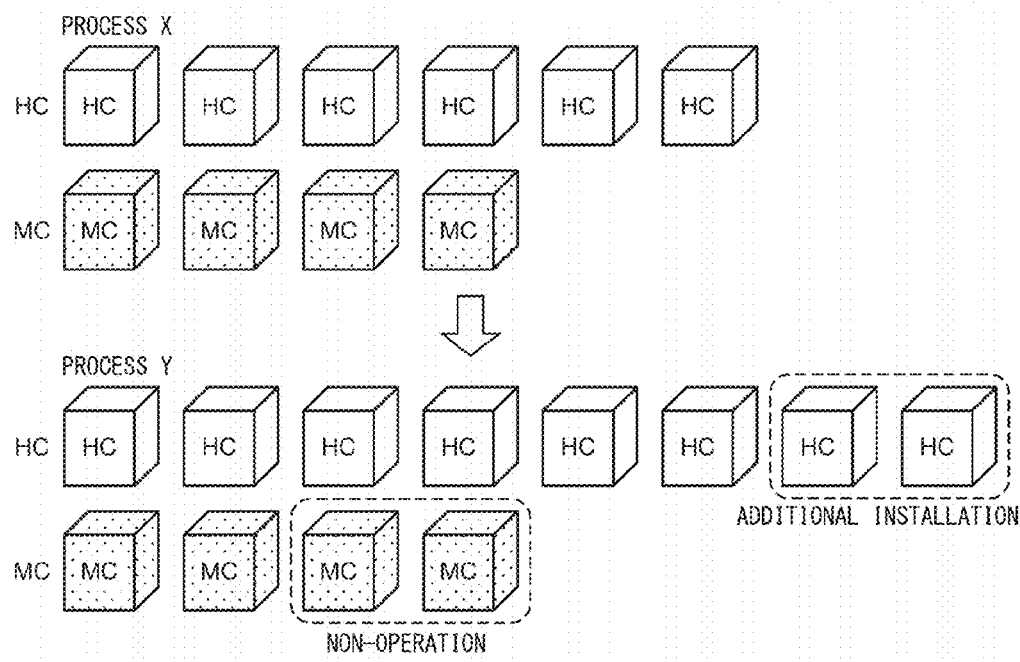
FIG. 13 is a diagram describing the use of a typical ion implantation apparatus.

The improvement in the operation efficiency of the apparatus realized by the HCMC in the device manufacturing process will be described. For example, as illustrated in FIG. 13, it is assumed that a device maker uses six HCs and four MCs in order to process a manufacturing process X (that is, this device maker owns only the existing apparatuses HC and MC). Thereafter, the device maker changes the process X to a process Y according to a change in a manufacturing device. As a result, the device maker needs eight HCs and two MCs. The maker needs to install two more HCs, and thus, the increase in investment and the lead time are required. At the same time, two MCs are not operated, and thus, the maker unnecessarily owns these. As described above, since the HC and the MC are generally different in the implantation method, it is difficult to convert the non-operating MCs to newly necessary HCs.

Figure 14:
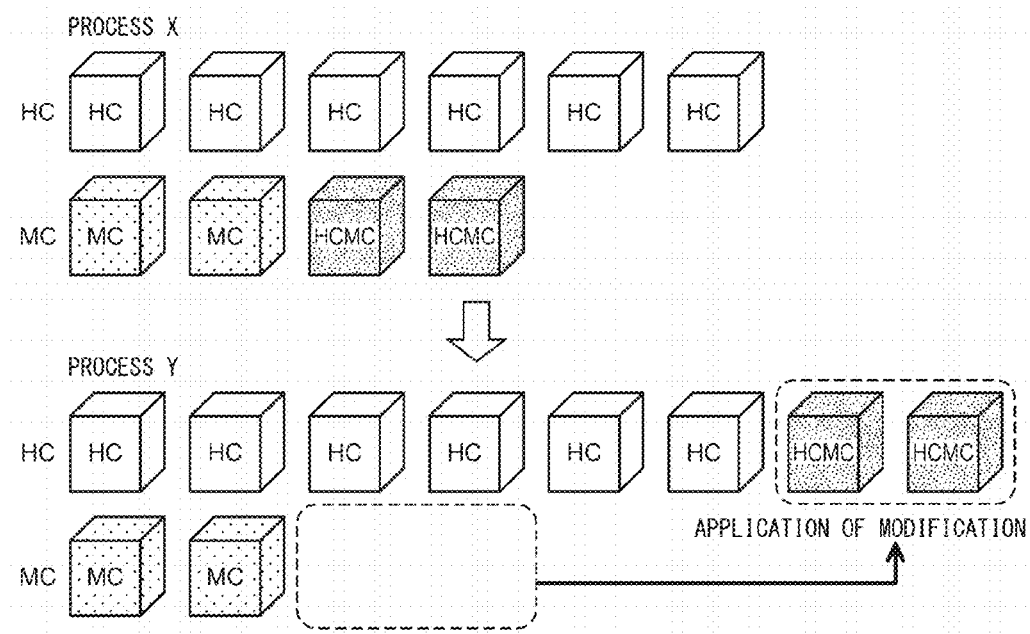
FIG. 14 is a diagram describing the use of an ion implantation apparatus according to an embodiment of the present invention.

Next, as illustrated in FIG. 14, it is considered that the device maker uses six HCs, two MCs, and two HCMCs in order to process the process X. In this case, even when the process X is changed to the process Y according to the change in the manufacturing device, the HCMC can be operated as the HC because the HCMC is the process shared machine of the HC and the MC. Therefore, additional equipment installation and non-operation are unnecessary.

As such, there is a great merit when the device maker owns a certain number of HCMCs. This is because the process change of HC and the MC can be absorbed by the HCMC. Also, when some apparatuses cannot be used due to malfunction or maintenance, the HCMC can also be used as the HC or the MC. Therefore, by owning the HCMC, the overall operating rate of the apparatus can be significantly improved.

Also, ultimately, it can be considered that all apparatuses are provided with HCMCs. However, in many cases, it is practical that part of the apparatuses are provided with HCMCs considering a price difference between the HCMC and the HC (or MC) or the utilization of the already owned HC or MC.

Also, when a type of the existing ion implantation apparatus is replaced with other apparatuses having different methods of implanting ions into the wafer in order for an ion implantation process to be performed, it may be difficult to match the implantation characteristics. This is because a beam divergence angle or a beam density may be different even though the energy and dose are matched in two types of ion implantation apparatuses for the ion implantation process. However, the HCMC can process the high-dose high-current ion implantation condition and the medium-dose medium-current ion implantation condition on the same beamline (the same ion beam trajectory). In this way the HCMC can separately use the high-dose high-current ion implantation condition and the medium-dose medium-current ion implantation condition. Therefore, it is expected to facilitate the matching because the change in the implantation characteristics followed by the replacement of the apparatus is sufficiently suppressed.

The HCMC is the shared machine of the HC and the MC and can also process the implantation condition out of the operation range of the existing HC or the MC. As illustrated in FIG. 11, the HCMC is a new apparatus that can also process the high energy/high dose implantation (right upper region F in the range D) and low energy/low dose implantation (left lower region G in the range D). Therefore, in addition or alternative to the first beamline setting S1 and the second beamline setting S2 described above, in an embodiment, the ion implantation apparatus may include a third beamline setting for high energy/high dose implantation and/or a fourth beamline setting for low energy/low dose implantation.

As described above, in the present embodiment, the beamlines of the serial-type high-dose high-current ion implantation apparatus and the serial-type medium-dose medium-current ion implantation apparatus are matched and shared. Moreover, a structure for switching the beamline configuration is constructed. In this manner, the implantation processing is possible over a broad range of energy and beam current regions on the same beamline (the same ion beam trajectory and the same implantation method).

The present invention has been described based on the embodiments. The present invention is not limited to the embodiments, and it can be understood by those skilled in the art that designs can be modified in various ways, various modifications can be made, and such modifications fall within the scope of the present invention.

In addition or alternative to the above-described configurations, the quantitative adjustment of the beam current by the beam current adjustment system can be configured in various ways. For example, when the beam current adjustment system includes a variable-width aperture arranged on the beamline, the variable-width aperture may be disposed at any arbitrary position. Therefore, the variable-width aperture may be disposed between the ion source and the mass analysis magnet, between the mass analysis magnet and the mass analysis slit, between the mass analysis slit and the beam focusing/defocusing device, between the beam focusing/defocusing device and the beam control device, between the beam control device and the beam conditioning device, between the respective elements of the beam conditioning device, and/or between the beam conditioning device and the workpiece. The variable-width aperture may be the mass analysis slit.

The beam current adjustment may be configured to adjust the amount of ion beam passing through the aperture by arranging the divergence/convergence lens system before and/or after a fixed-width aperture. The fixed-width aperture may be the mass analysis slit.

The beam current adjustment may be performed using an energy slit opening width variable (and/or a beamline end opening width variable slit apparatus). The beam current adjustment may be performed using an analyzer magnet (mass analysis magnet) and/or a steerer magnet (trajectory modification magnet). The dose amount adjustment may be accompanied by an expansion of the variable range of mechanical scan speed (for example, from ultra-low speed to ultra-high speed) and/or a change in the number of times of the mechanical scanning.

The beam current adjustment may be performed by the adjustment of the ion source (for example, amount of gas or arc current). The beam current adjustment may be performed by the exchange of the ion source. In this case, the ions source for MC and the ion source for HC may be selectively used. The beam current adjustment may be performed by the gap adjustment of the extraction electrode of the ion source. The beam current adjustment may be performed by providing the CVA immediately downstream of the ion source.

The beam current adjustment may be performed according to the change in the vertical width of the ribbon beam. The dose amount adjustment may be performed according to the change in the scanning speed during the two-dimensional mechanical scanning.

The beamline device may include a plurality of beamline components configured to operate under only one of the first beamline setting and the second beamline setting, and thus, the ion implantation apparatus may be configured as a high-current ion implantation apparatus or a medium-current ion implantation apparatus. That is, with the HCMC as a platform, for example, by exchanging some beamline components, or changing the power supply configuration, the serial-type high-dose dedicated ion implantation apparatus or the serial-type medium-dose dedicated ion implantation apparatus can be produced from the serial-type high-dose medium-dose wide-use ion implantation apparatus. Since it is expected to manufacture each dedicated apparatus at lower cost than the wide-use apparatus, it can contribute to reducing the manufacturing costs for the device maker.

In the MC, implantation at higher energy may be achieved by using multivalent ions such as divalent ions or trivalent ions. However, in the typical ion source (thermionic emission type ion source), the generation efficiency of multivalent ions is much lower than the generation efficiency of monovalent ions. Therefore, practical dose implantation in the high energy range is actually difficult. When a multivalent ion enhancement source, such as an RF ion source, is employed as the ion source, tetravalent or pentavalent ions can be obtained. Therefore, more ion beams can be obtained in the higher energy condition.

Therefore, by employing the multivalent ion enhancement source, such as the RF ion source, as the ion source, the HCMC can operate as the serial-type high energy ion implantation apparatus (HE). Therefore, a portion of the implantation condition that has been processed by only the serial-type high energy/low-dose ion implantation apparatus can be processed by the HCMC (the range of the MC illustrated in FIG. 8 may be expanded to include at least a portion of the range C).

Hereinafter, several aspects of the present invention will be described.

An ion implantation apparatus according to an embodiment includes: an ion source for generating ions and extracting the ions as an ion beam; an implantation processing chamber for implanting the ions into a workpiece; and a beamline device for providing a beamline to transport the ion beam from the ion source to the implantation processing chamber, wherein the beamline device supplies the ion beam having a beam irradiation region exceeding the width of the workpiece in the implantation processing chamber, the implantation processing chamber includes a mechanical scanning device for mechanically scanning the workpiece with respect to the beam irradiation region, the beamline device is operated under one of a plurality of implantation setting configurations according to an implantation condition, the plurality of implantation setting configurations including a first implantation setting configuration suitable for transport of a low energy/high current beam for high-dose implantation into the workpiece, and a second implantation setting configuration suitable for transport of a high energy/low current beam for low-dose implantation into the workpiece, and the beamline device is configured such that a same beam center trajectory being a reference in the beamline is provided from the ion source to the implantation processing chamber in the first implantation setting configuration and the second implantation setting configuration.

An ion implantation apparatus according to an embodiment includes: an ion source for generating ions and extracting the ions as an ion beam; an implantation processing chamber for implanting the ions into a workpiece; and a beamline device for providing a beamline to transport the ion beam from the ion source to the implantation processing chamber, wherein the ion implantation apparatus is configured to irradiate the workpiece with the ion beam in cooperation with mechanical scanning of the workpiece, the beamline device is operated under one of a plurality of implantation setting configurations according to an implantation condition, the plurality of implantation setting configurations including a first implantation setting configuration suitable for transport of a low energy/high current beam for high-dose implantation into the workpiece, and a second implantation setting configuration suitable for transport of a high energy/low current beam for low-dose implantation into the workpiece, and the beamline device is configured such that a same beam center trajectory being a reference in the beamline is provided from the ion source to the implantation processing chamber in the first implantation setting configuration and the second implantation setting configuration.

The beamline device may take the same implantation method in the first implantation setting configuration and the second implantation setting configuration. The beam irradiation region may be equal in the first implantation setting configuration and the second implantation setting configuration.

The beamline apparatus may include a beam conditioning device for conditioning the ion beam, and a beam focusing/defocusing device for focusing/defocusing the ion beam. The beam conditioning device and the beam focusing/defocusing device in the beamline device may be disposed in the same layout in the first implantation setting configuration and the second implantation setting configuration. The beam implantation apparatus may have the same installation floor area in the first implantation setting configuration and the second implantation setting configuration.

The beamline device may include a beam current adjustment system for adjusting the total amount of beam current of the ion beam. The first implantation setting configuration may include a first beam current setting for the beam current adjustment system, the second implantation setting configuration may include a second beam current setting for the beam current adjustment system, and the second beam current setting may be determined to make the beam current of the ion beam smaller than that of the first beam current setting.

The beam current adjustment system may be configured to block at least a portion of the ion beam when passing through an adjustment element. The beam current adjustment system may include a variable-width aperture arranged on the beamline. The beam current adjustment system may include a beamline end opening width variable slit device. The ion source may be configured to adjust the total amount of beam current of the ion beam. The ion source may include an extraction electrode for extracting the ion beam, and the total amount of beam current of the ion beam may be adjusted by adjusting an opening of the extraction electrode.

The beamline device may include an energy adjustment system for adjusting an implantation energy of the ions into the workpiece. The first implantation setting configuration may include a first energy setting for the energy adjustment system, the second implantation setting configuration may include a second energy setting for the energy adjustment system, the first energy setting may be suitable for transport of a lower energy beam as compared with the second energy setting.

The energy adjustment system may include a beam parallelizing device for parallelizing the ion beam. The beam parallelizing device may be configured to decelerate, or decelerate and accelerate the ion beam under the first implantation setting configuration, and accelerate, or accelerate and decelerate the ion beam under the second implantation setting configuration. The beam parallelizing device may include an acceleration lens for accelerating the ion beam, and a deceleration lens for decelerating the ion beam, and may be configured to modify a distribution of acceleration and deceleration, and the beam parallelizing device may be configured to mainly decelerate the ion beam under the first implantation setting configuration, and mainly accelerate the ion beam under the second implantation setting configuration.

The beamline device may include a beam current adjustment system for adjusting the total amount of beam current of the ion beam, and an energy adjustment system for adjusting an implantation energy of the ions into the workpiece, and may adjust the total amount of the beam current and the implantation energy individually or simultaneously. The beam current adjustment system and the energy adjustment system may be separate beamline components.

The ion implantation apparatus may include a control unit configured to manually or automatically select one implantation setting configuration suitable for a given ion implantation condition among the plurality of implantation setting configurations including the first implantation setting configuration and the second implantation setting configuration.

The control unit may select the first implantation setting configuration when a desired ion dose amount implanted into the workpiece is in the range of about $1 \times 10^{14}$ to $1 \times 10^{17}$ atoms/cm$^2$, and may select the second implantation setting configuration when a desired ion dose amount implanted into the workpiece is in the range of about $1 \times 10^{11}$ to $1 \times 10^{14}$ atoms/cm$^2$.

The beamline device may have a first energy adjustment range under the first implantation setting configuration, and may have a second energy adjustment range under the second implantation setting configuration, and the first energy adjustment range and the second energy adjustment range may have a partially overlapped range.

The beamline device may have a first dose adjustment range under the first implantation setting configuration, and may have a second dose adjustment range under the second implantation setting configuration, and the first dose adjustment range and the second dose adjustment range may have a partially overlapped range.

The beamline device may include a beam scanning device for providing scanning of the ion beam to form an elongated irradiation region extending in a longitudinal direction perpendicular to a beam transportation direction. The implantation processing chamber may include a workpiece holder configured to provide mechanical scanning of the workpiece in a direction perpendicular to the longitudinal direction and the beam transportation direction.

The beamline device may include a ribbon beam generator for generating a ribbon beam having an elongated irradiation region extending in a longitudinal direction perpendicular to a beam transportation direction. The implantation processing chamber may include a workpiece holder configured to provide mechanical scanning of the workpiece in a direction perpendicular to the longitudinal direction and the beam transportation direction.

The implantation processing chamber may include a workpiece holder configured to provide mechanical scanning of the workpiece in two directions perpendicular to each other in a plane perpendicular to the beam transportation direction.

The beamline device may be configured to be selectable from a plurality of beamline components configured to be operated under only one of the first implantation setting configuration and the second implantation setting configuration, and the ion implantation apparatus may be configured as a high-current dedicated ion implantation apparatus or a medium-current dedicated ion implantation apparatus.

An ion implantation method according to an embodiment includes: selecting one implantation setting configuration, with respect to a beamline device, which is suitable for a given ion implantation condition among a plurality of implantation setting configurations including a first implantation setting configuration suitable for transport of a low energy/high current beam for high-dose implantation into a workpiece, and a second implantation setting configuration suitable for transport of a high energy/low current beam for low-dose implantation into the workpiece; transporting an ion beam along a beam center trajectory being a reference in a beamline from an ion source to an implantation processing chamber by using the beamline device under the selected implantation setting configuration; and irradiating the workpiece with the ion beam in cooperation with mechanical scanning of the workpiece, wherein the beam center trajectory being the reference is equal in the first implantation setting configuration and the second implantation setting configuration.

The transporting may include adjusting an implantation dose amount into the workpiece by adjusting the total amount of beam current of the ion beam. The implantation dose amount may be adjusted in a first dose adjustment range under the first implantation setting configuration, and may be adjusted in a second dose adjustment range under the second implantation setting configuration, the second dose adjustment range including a dose range smaller than the first dose adjustment range.

The transporting may include adjusting the implantation energy into the workpiece. The implantation energy may be adjusted in a first energy adjustment range under the first implantation setting configuration, and may be adjusted in a second energy adjustment range under the second implantation setting configuration, the second energy adjustment range including an energy range higher than the first energy adjustment range.

1. An ion implantation apparatus according to an embodiment has the same beam trajectory and the same implantation method and has a broad energy range by switching a connection of a power supply for deceleration as a whole and a connection of a power supply for acceleration as a whole.

2. An ion implantation apparatus according to an embodiment has the same beam trajectory and the same implantation method and has a broad beam current range by including a device for cutting a portion of beam in a beamline upstream part in a beamline capable of obtaining a high current.

3. An ion implantation apparatus according to an embodiment may have the same beam trajectory and the same implantation method and have a broad energy range and a broad beam current range by including both of the features of the embodiment 1 and the embodiment 2.

An ion implantation apparatus according to an embodiment may be an apparatus that combines a beam scanning and a mechanical wafer scanning as the same implantation method in the embodiments 1 to 3. An ion implantation apparatus according to an embodiment may be an apparatus that combines a ribbon-shaped beam and a mechanical wafer scanning as the same implantation method in the embodiments 1 to 3. An ion implantation apparatus according to an embodiment may be an apparatus that combines a two-dimensional mechanical wafer scanning as the same implantation method in the embodiments 1 to 3.

4. An ion implantation apparatus according to an embodiment is configured to freely select/switch a high-dose high-current ion implantation and a medium-dose medium-current ion implantation by configuring a high-dose high-current ion implantation beamline component and a medium-dose medium-current ion implantation beamline component in parallel on the same beamline (the same ion beam trajectory and the same implantation method), and covers a very broad energy range from low energy to high energy and a very broad dose range from a low dose to a high dose.

5. In the embodiment 4, each beamline component shared in the high dose use and the medium dose use and each beamline component individually switched in the high dose/medium dose use may be configured on the same beamline.

6. In the embodiment 4 or 5, in order to adjust the beam current amount in a broad range, a beam limiting device (vertical or horizontal variable-width slit, or rectangular or circular variable opening) for physically cutting a portion of beam in a beamline upstream part may be provided.

7. In any one of the embodiments 4 to 6, a switch controller control device may be provided to select a high-dose high-current ion implantation and a medium-dose medium-current ion implantation, based on a desired ion dose amount implanted into the workpiece.

8. In the embodiment 7, the switch controller is configured to operate the beamline in a medium-dose acceleration (extraction)/acceleration (P lens)/acceleration or deceleration (AD column) mode when a desired ion dose amount implanted into the workpiece is in the medium-dose medium-current range of about $1 \times 10^{11}$ to $1 \times 10^{14}$ atoms/cm$^2$, and operate the beamline in a high-dose acceleration (extraction)/deceleration (P lens)/deceleration (AD column) mode when a desired ion dose amount implanted into the workpiece is in the high-dose high-current range of about $1 \times 10^{14}$ to $1 \times 10^{17}$ atoms/cm$^2$.

9. In any one of the embodiments 4 to 8, an apparatus for implanting ions of relatively high energy by using an acceleration mode and an apparatus for implanting ions of relatively low energy by using a deceleration mode may have a mutually overlapped energy range.

10. In any one of the embodiments 4 to 8, an apparatus for implanting ions of relatively high energy by using an acceleration mode and an apparatus for implanting ions of relatively low energy by using a deceleration mode may have a mutually overlapped dose range.

11. In any one of the embodiments 4 to 6, by limiting the beamline components, the ion implantation apparatus may easily be changed to a high-dose high-current dedicated ion implantation apparatus or a medium-dose medium-current dedicated ion implantation apparatus.

12. In any one of the embodiments 4 to 11, the beamline configuration may combine a beam scanning and a mechanical substrate scanning.

13. In any one of the embodiments 4 to 11, the beamline configuration may combine a mechanical substrate scanning and a ribbon-shaped beam having a width equal to or greater than a width of a substrate (or wafer or workpiece).

14. In any one of the embodiments 4 to 11, the beamline configuration may include a mechanical substrate scanning in a two-dimensional direction.

Figure 15:
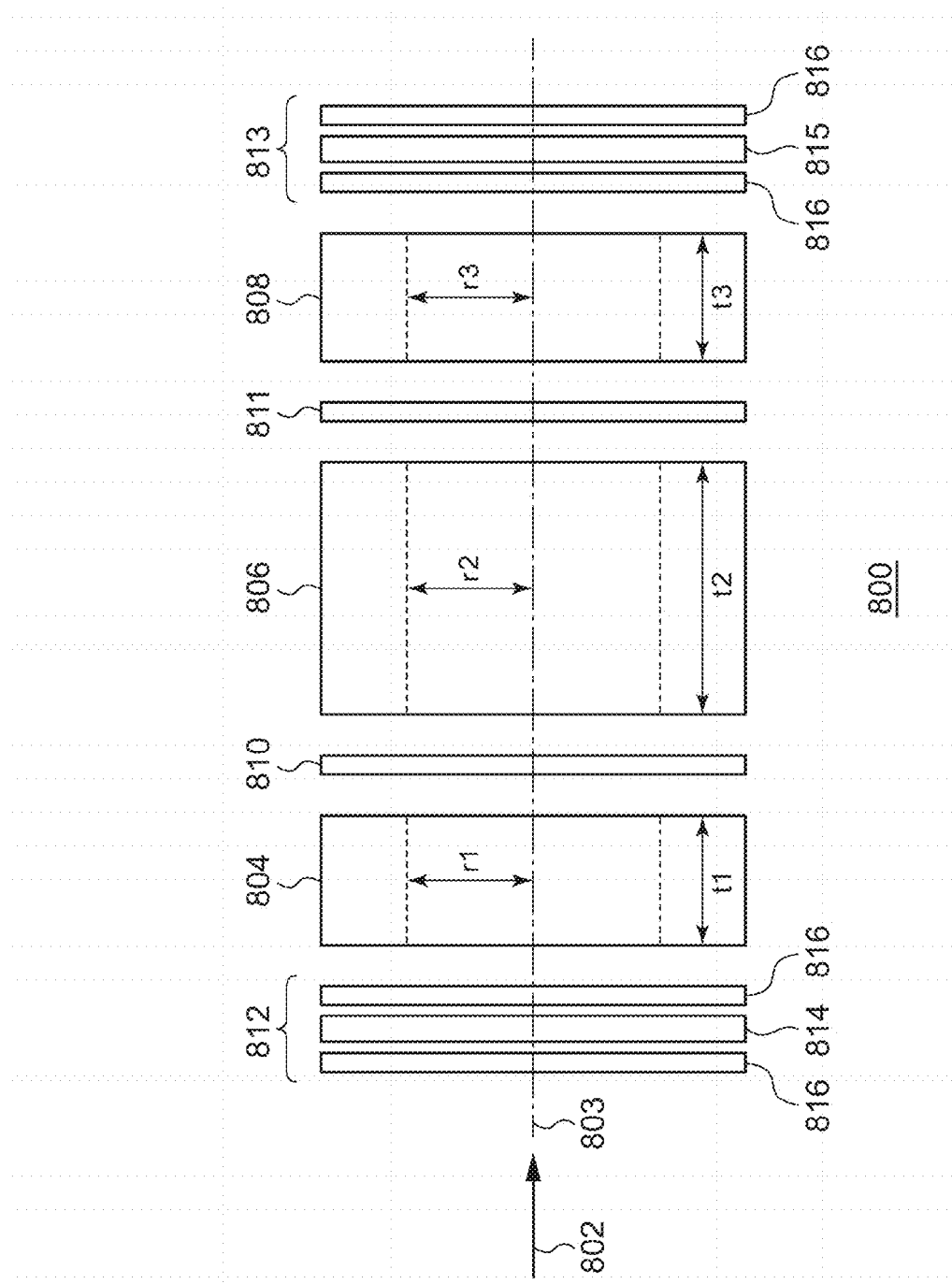
FIG. 15 is a diagram showing a schematic configuration of part of a beam transport unit used in an ion implantation apparatus.

FIG. 15 is a diagram illustrating a schematic configuration of part of a beam transport unit used in an ion implantation apparatus. The beam transport unit includes an electrostatic (electric-field type) triplet quadrupole lens system (which may be hereinafter referred to as "triplet Q lens") 800. The triplet quadrupole lens system 800 includes a first quadrupole lens 804, a second quadrupole lens 806 and a third quadrupole lens 808, in order from the upstream side along a beam transportation direction 802. The triplet quadrupole lens system 800 may be used, for example, as the first XY focusing lens 206 (see FIG. 5A and FIG. 5B).

The triplet quadrupole lens system 800 is configured such that an upstream part of the triplet quadrupole lens system 800 and a downstream part thereof are symmetrical with respect to a plane perpendicular to a central axis 803 and passing through the center of the second quadrupole lens 806, which is positioned in the middle of the three quadrupole lenses 804, 806 and 808. The first quadrupole lens 804, the second quadrupole lens 806 and the third quadrupole lens 808 each has the same bore radius (r1=r2=r3). The length of the first quadrupole lens 804 is equal to that of the third quadrupole lens 808. The length of the second quadrupole lens 806 is twice the length of the first or third quadrupole lens 804 or 808 (t1:t2:t3=1:2:1). The central axis 803 corresponds to the designed beam center trajectory passing through the triplet quadrupole lens system 800.

The triplet quadrupole lens system 800 includes a first partition plate 810 and a second partition plate 811. The first partition plate 810 is placed in between the first quadrupole lens 804 and the second quadrupole lens 806. The second partition plate 811 is placed in between the second quadrupole lens 806 and the third quadrupole lens 808. The first partition plate 810 and the second partition plate 811 each has an aperture (opening) through which to have an ion beam pass, and the diameters of the apertures of them are equal to each other.

The triplet quadrupole lens system 800 further includes an entrance suppression electrode portion 812 and an exit suppression electrode portion 813. The entrance suppression electrode portion 812 is disposed upstream of the first quadrupole lens 804, and the exit suppression electrode portion 813 is disposed downstream of the third quadrupole lens 808. The entrance suppression electrode portion 812 is constituted by three electrode plates. Similarly, the exit suppression electrode portion 813 is constituted by three electrode plates. The electrode plate in the middle of the entrance suppression electrode portion 812 is an entrance suppression electrode 814, and the electrode plates at both ends thereof are suppression partition plates 816. Similarly, the electrode plate in the middle of the exit suppression electrode portion 813 is an exit suppression electrode 815, and the electrode plates at both ends thereof are suppression partition plates 816. The three electrode plates of the entrance suppression electrode portion 812 and the three electrode plates of the exit suppression electrode portion 813 have apertures (openings) through which to have the ion beam pass, and the diameters of the apertures in all of the six electrode plates are approximately identical.

Figure 16:
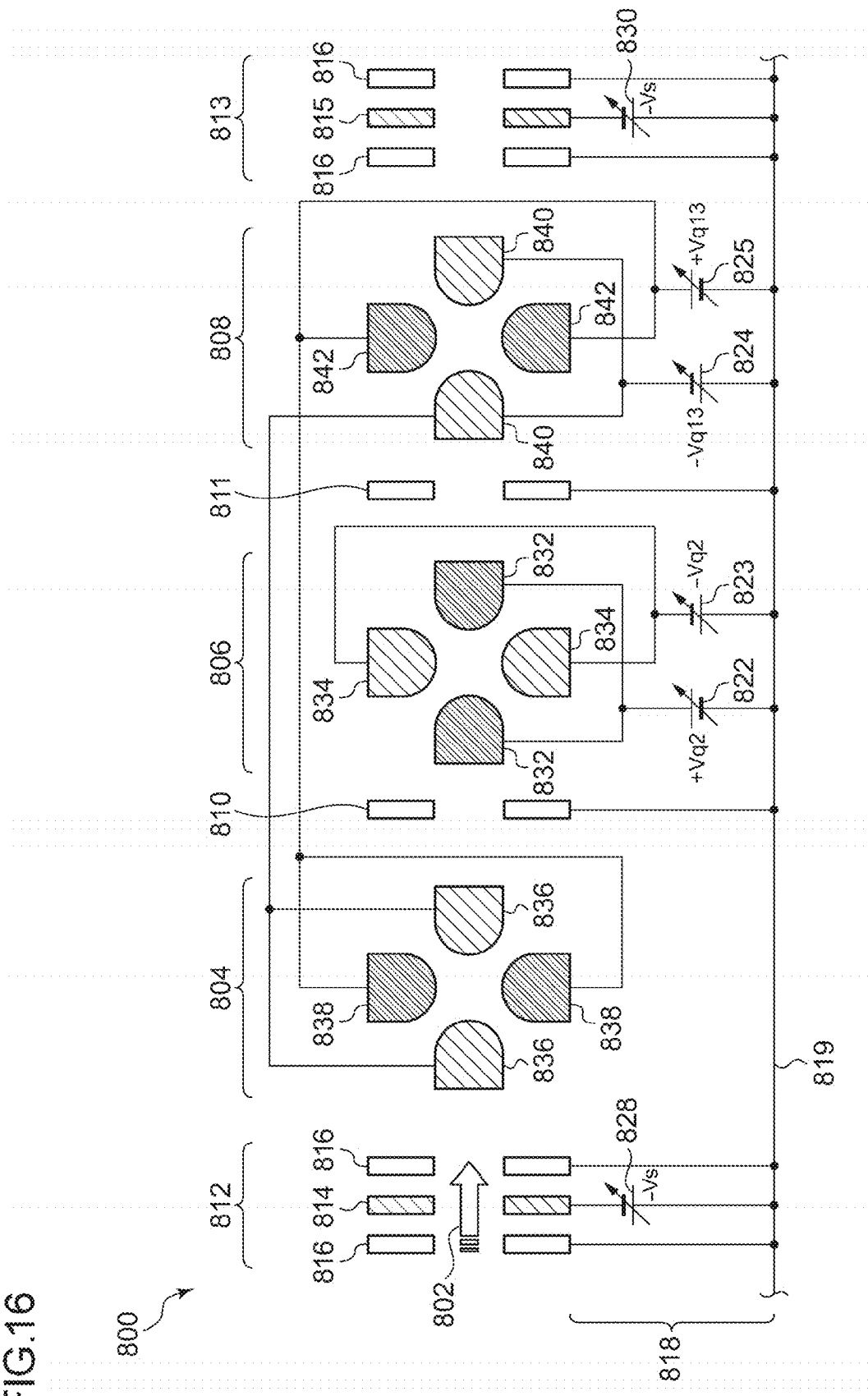
FIG. 16 is a diagram illustrating an exemplary configuration of a power supply of a triplet quadrupole lens system shown in FIG. 15.

FIG. 16 is a diagram illustrating an exemplary configuration of a power supply of the triplet quadrupole lens system 800 shown in FIG. 15. A power supply unit 818 of the quadrupole lens 800 is configured such that appropriate electric potentials relative to a reference potential 819 is applied to the first quadrupole lens 804, the second quadrupole lens 806, the third quadrupole lens 808, the entrance suppression electrode 814 and the exit suppression electrode 815. The reference potential 819 is, for example, a potential of a casing of the beam transport unit (e.g., the terminal 216 (see FIG. 6 and FIG. 7)). The power supply unit 818 includes a second positive power supply 822, a second negative power supply 823, a third negative power supply 824, a third positive power supply 825, a first suppression power supply 828, and a second suppression power supply 830. Each of these power supplies is a variable DC power supply.

The second positive power supply 822 is connected to electrodes 832 in a manner such that a positive potential +Vq2 is applied to a pair of electrodes 832 disposed opposite to each other (namely, a pair of facing electrodes 832) in a horizontal direction (e.g., in the X direction in FIG. 5A) in the second quadrupole lens 806. The second negative power supply 823 is connected to electrodes 834 in a manner such that a negative potential −Vq2 is applied to a pair of electrodes 834 disposed opposite to each other (namely, a pair of facing electrodes 834) in a vertical direction (e.g., in the Y direction in FIG. 5B) in the second quadrupole lens 806.

The third negative power supply 824 and the third positive power supply 825 are each a common power supply used commonly for the first quadrupole lens 804 and the third quadrupole lens 808. The third negative power supply 824 is connected to electrodes 836 in a manner such that a negative potential −Vq13 is applied to a pair of electrodes 836 disposed horizontally opposite to each other (namely, a pair of horizontally facing electrodes 836) in the first quadrupole lens 804. The third positive power supply 825 is connected to electrodes 838 in a manner such that a positive potential +Vq13 is applied to a pair of electrodes 838 disposed vertically opposite to each other (namely, a pair of vertically facing electrodes 838) in the first quadrupole lens 804. Also, the third negative power supply 824 is connected to electrodes 840 in a manner such that a negative potential −Vq13 is applied to a pair of electrodes 840 disposed horizontally opposite to each other (namely, a pair of horizontally facing electrodes 840) in the third quadrupole lens 808. The third positive power supply 825 is connected to electrodes 842 in a manner such that a positive potential +Vq13 is applied to a pair of electrodes 842 disposed vertically opposite to each other (namely, a pair of vertically facing electrodes 842) in the third quadrupole lens 808.

In this manner, the first quadrupole lens 804 and the third quadrupole lens 808 are each configured such that the ion beam is focused (or converged) in the vertical direction. The second quadrupole lens 806 is configured such that the ion beam is focused in the horizontal direction.

Suppose that the positive potential +Vq2 of the second positive power supply 822 and the positive potential +Vq13 of the third positive power supply 825 are equal to each other. At the same time, suppose that the negative potential −Vq2 of the second negative power supply 823 and the negative potential −Vq13 of the third negative power supply 824 are equal to each other. Then, the ratio among the focusing forces of the first quadrupole lens 804, the second quadrupole lens 806 and the third quadrupole lens 808 is 1:2:1. Compared to this basic state, the power supply unit 818 is controlled such that either one of the voltage Vq2 and the voltage Vq3 is made to somewhat differ from the other thereof. Thereby, the beam focusing (or beam defocusing) by the triplet quadrupole lens system 800 can be fine-adjusted.

The first suppression power supply 828 applies a negative potential −Vs to the entrance suppression electrode 814, and the second suppression power supply 830 applies a negative potential −Vs to the exit suppression electrode 815. The suppression partition plates 816 are connected to the reference potential 819. Also, the first partition plate 810 and the second partition plate 811 are connected to the reference potential 819.

Figure 17:
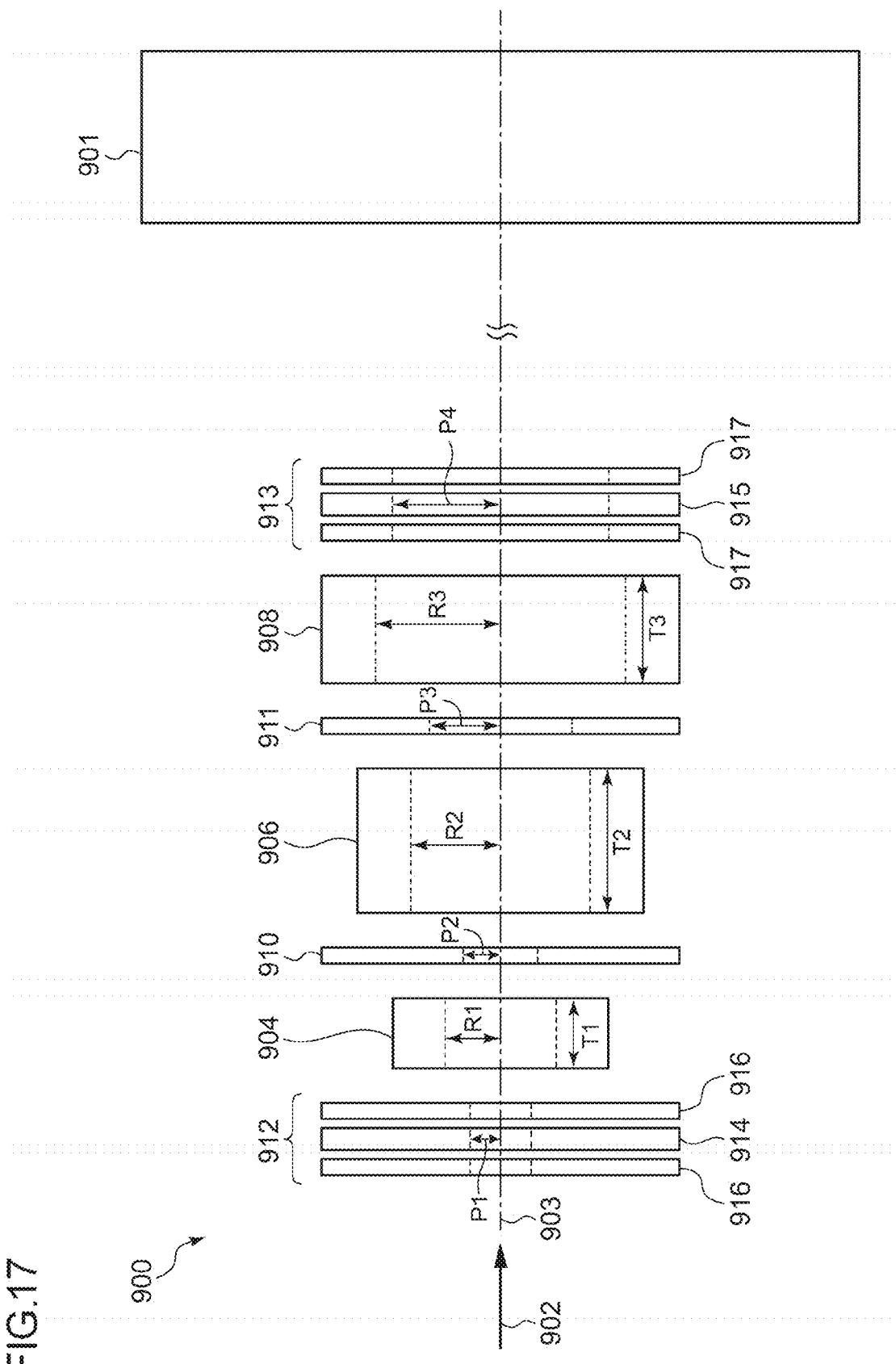
FIG. 17 is a diagram illustrating a schematic configuration of part of an ion implantation apparatus according to an embodiment of the present invention.
Figure 18A:
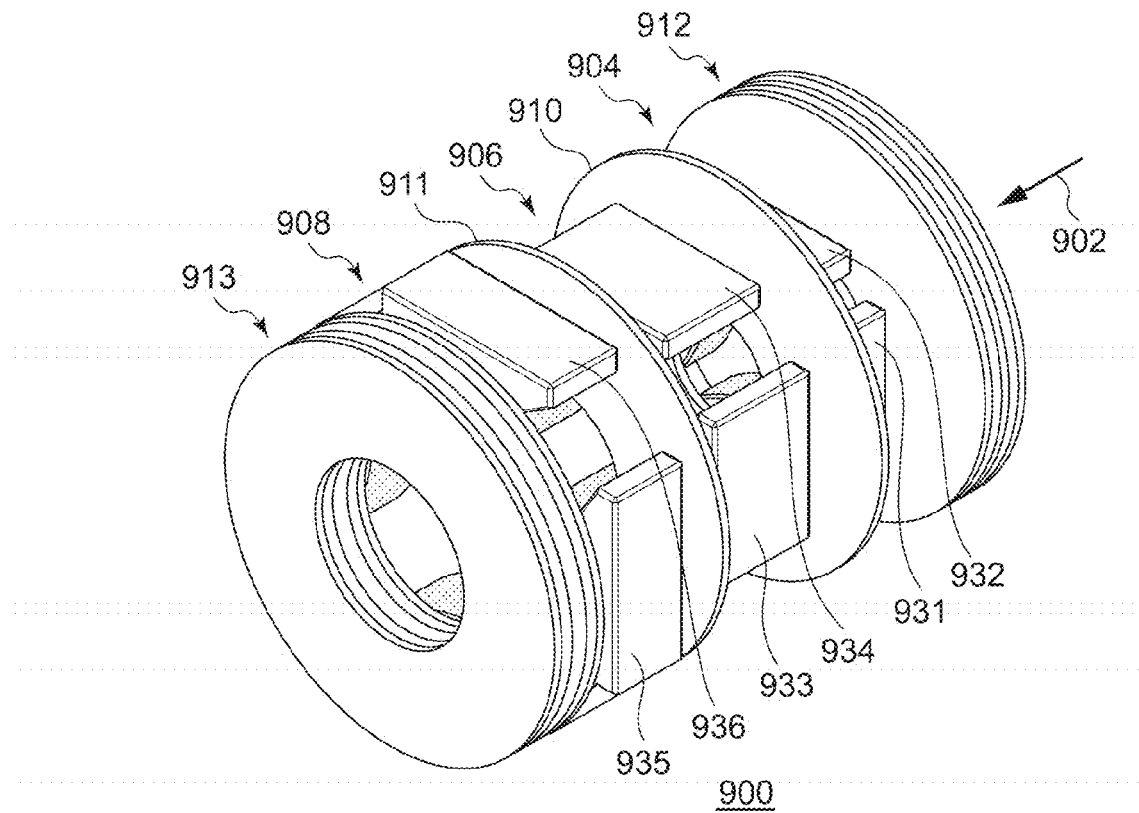
FIG. 18A and FIG. 18B each shows a shape of a multistage quadrupole lens system, according to an embodiment of the present invention, in a three-dimensional manner.
Figure 18B:
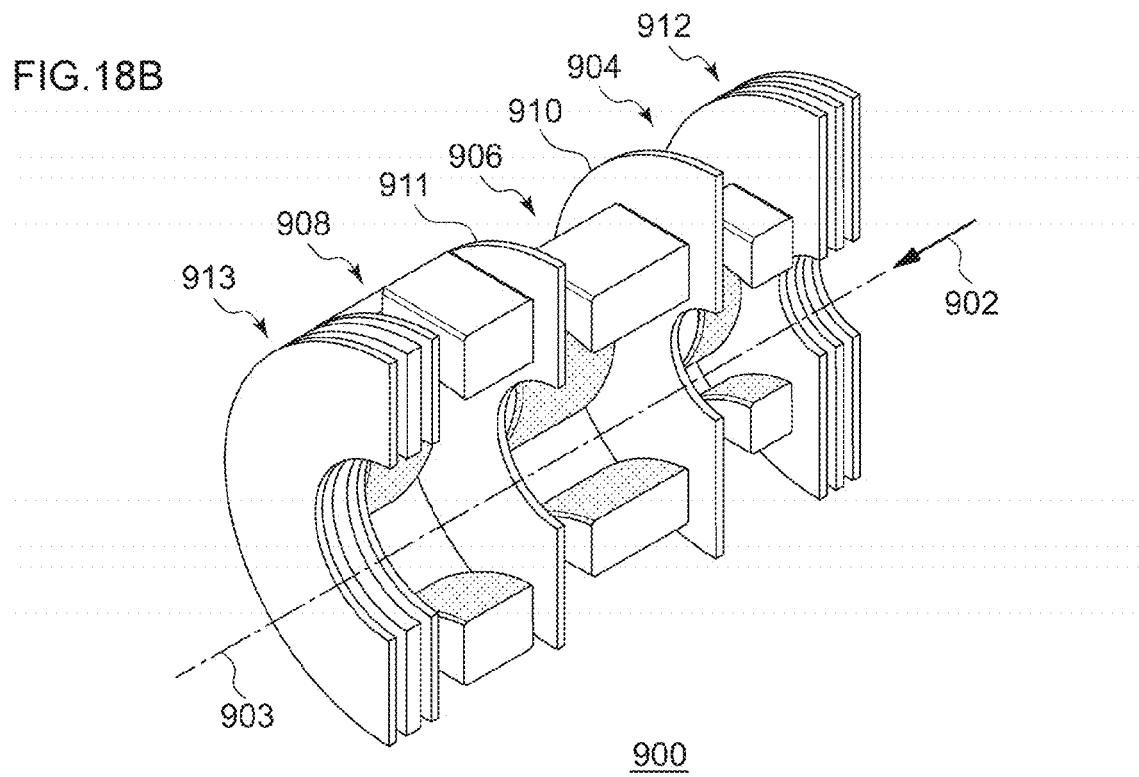

FIG. 17 is a diagram illustrating a schematic configuration of part of an ion implantation apparatus according to an embodiment of the present invention. The ion implantation apparatus includes a multistage quadrupole lens system 900 and a beam scanning unit 901. FIG. 18A and FIG. 18B each shows a shape of the multistage quadrupole lens system 900, according to an embodiment of the present invention, in a three-dimensional manner. To help understand the exact shape thereof, the multistage quadrupole lens system 900 shown in FIG. 18A is virtually cut in half and FIG. 18B illustrates the left half of the multistage quadrupole lens system 900.

As shown in FIG. 17, the multistage quadrupole lens system 900 is placed upstream of the beam scanning unit 901 of the ion implantation apparatus along a beam transportation direction 902. Also, the multistage quadrupole lens system 900 is placed downstream of a mass analyzing unit (e.g., the mass analyzer 108 (see FIG. 2)) of the ion implantation apparatus. The multistage quadrupole lens system 900 may be used, for example, as the first XY focusing lens 206 (see FIG. 5A and FIG. 5B). As described earlier, the first XY focusing lens 206 is disposed in between the mass analysis magnet 202 and the scanner 209. When required, the multistage quadrupole lens system 900 may be disposed in an arbitrary position midway along the beamline of the ion implantation apparatus. For example, the multistage quadrupole lens system 900 may be disposed downstream or upstream of the mass analysis slit or may be disposed between the extraction electrode and the mass analysis magnet.

The multistage quadrupole lens system 900 includes a sequence of quadrupole lenses arranged adjacent to each other in the beam transportation direction 902. Here, the "sequence of quadrupole lenses" means at least two quadrupole lenses. No electromagnetic field generation element is provided between the two adjacent quadrupole lens. Here, the "electromagnetic field generation element" is a beamline component so configured as to generate by itself the electric field and/or the magnetic field acting on an ion beam. The respective centers of the quadrupole lenses constituting the multistage quadrupole lens system 900 lie on a designed beam center trajectory 903. As described above, a sequence of quadrupole lenses are aligned coaxially with the beam center trajectory 903 along the beam transportation direction 902 from an upstream side to a downstream side. Note that a sequence of quadrupole lenses may be configured such that a plurality of quadrupole lenses whose focusing directions are alternately vertical and horizontal directions. For example, the multistage quadrupole lens system may be configured by a doublet Q lens, which is constituted by two quadrupole lenses, a triplet Q lens, which is constituted by three quadrupole lenses, or a multistage Q lens, which is constituted by four or more quadrupole lenses.

The multistage quadrupole lens system 900 includes a first quadrupole lens 904, a second quadrupole lens 906 disposed downstream of the first quadrupole lens 904, and a third quadrupole lens 908 disposed downstream of the second quadrupole lens 906. The first quadrupole lens 904 is positioned on the uppermost stream side of the quadrupole lenses constituting the multistage quadrupole lens system 900. And this first quadrupole lens 904 may be called an entrance quadrupole lens. The third quadrupole lens 908 is positioned on the lowermost stream side of the quadrupole lenses constituting the multistage quadrupole lens system 900. And this third quadrupole lens 908 may be called an exit quadrupole lens.

Though its detail will be described later, the multistage quadrupole lens system 900 is so configured that the multistage quadrupole lens system 900 as a whole operates in any one of a plurality of beam transport modes. In a certain transport mode, the multistage quadrupole lens system 900 is so configured that it operates as a triplet quadrupole lens system (which may be hereinafter referred to as "triplet Q lens"). In another transport mode, the multistage quadrupole lens system 900 is so configured that it operates as a singlet quadrupole lens (which may be hereinafter referred to as "singlet Q lens" or "single-stage Q lens"). In this manner, the multistage quadrupole lens system 900 is configured such that at least two operating states can be switched between those operating states. The switching process for switching the operating states in the multistage quadrupole lens system 900 may be performed by a control unit (e.g., the control unit 116 (see FIG. 2)) that is so configured as to control the multistage quadrupole lens system 900.

The multistage quadrupole lens system 900 includes electrostatic quadrupole lenses. As illustrated in FIGS. 18A and 18B, each of the quadrupole lenses has four electrodes that are arranged symmetrically with each other in a manner such that the four electrodes surround the center of the quadrupole lenses (i.e., the beam center trajectory 903) in a plane perpendicular to the beam transportation direction 902. The four electrodes are of an identical shape. The surface of each electrode facing the beam center trajectory 903 is a convex surface having a ridge line in a position where the convex surface is closest to the beam center trajectory 903. The line of intersection where the convex surface intersects with a plane perpendicular to the beam center trajectory 903 is a hyperbolic curve or may be an approximately circular arc or quadratic curves. The ridge line of the convex surface is a straight line in parallel with the beam transportation direction 902. The length of the four electrodes in the beam transportation direction 902 is equal to each other; this length may be hereinafter referred to as "Q lens length".

Four electrodes constituting each quadrupole lens are comprised of a pair of electrodes disposed vertically opposite to each other (namely, a pair of vertically facing electrodes) and the other pair of electrodes disposed horizontally opposite to each other (namely, the other pair of horizontally facing electrodes). The distance between the facing electrodes (more precisely, the distance between the ridge lines) is called a bore diameter, and the half of the bore diameter (namely, the distance between the beam center trajectory 903 and the electrode) is called a bore radius. The bore diameter is greater than the diameter of beam being transported. Here, the vertical direction and the horizontal direction are two directions crossing at right angles in a plane perpendicular to the beam transportation direction 902, and correspond respectively to the Y direction and the X direction shown in FIG. 5, for instance. The voltage applied to the vertically facing electrodes and the voltage applied to the horizontally facing electrodes are opposite in the polarity and identical in the magnitude. Each quadrupole lens generates an electrostatic field, within a range equivalent to the Q lens length, in the beam transportation direction 902. The quadrupole lens causes an ion beam passing therethrough to focus in the vertical or horizontal direction using this electrostatic field.

As shown in FIG. 17, the first quadrupole lens 904, the second quadrupole lens 906 and the third quadrupole lens 908 have a first bore radius R1, a second bore radius R2 and a third bore radius R3, respectively. The first bore radius R1 is less than or equal to the second bore radius R2. The second bore radius R2 is less than or equal to the third bore radius R3. The first bore radius R1 is strictly less than the third bore radius. In other words, the second bore radius R2 is greater than the first bore radius R1 and less than the third bore radius R3, or equal to either one of the first bore radius R1 or the third bore radius R3.

As described above, the multistage quadrupole lens system 900 is so configured as to form a flare-type beam transport space as a whole. In other words, the multistage quadrupole lens system 900 is configured such that the central openings of a sequence of quadrupole lenses get wider toward a downstream end from an upstream end in the beam transportation direction 902.

The first quadrupole lens 904, the second quadrupole lens 906 and the third quadrupole lens 908 have a first Q lens length T1, a second Q lens length T2 and a third Q lens length T3, respectively. The relations between these Q lens lengths T1 to T3 will be discussed later.

The multistage quadrupole lens system 900 further includes a partition plate provided in between every two adjacent quadrupole lenses. The partition plate is provided for the purpose of suppressing the interference occurring between an electric field of an upstream quadrupole lens and that of a downstream quadrupole lens adjacent to the upstream quadrupole lens.

As shown in FIG. 17 and FIG. 18, the multistage quadrupole lens system 900 includes a first partition plate 910 and a second partition plate 911. The first partition plate 910 is placed in between the first quadrupole lens 904 and the second quadrupole lens 906. The second partition plate 911 is placed in between the second quadrupole lens 906 and the third quadrupole lens 908.

Each of the first partition plate 910 and the second partition plate 911 is a rectangular/square or circular board and has an aperture (opening), through which to have an ion beam pass, at a central part thereof. An aperture radius P2 of the first partition plate 910 is smaller than an aperture radius P3 of the second partition plate 911. In order to effectively suppress the aforementioned interference occurring between the electric fields, the aperture radius P2 of the first partition plate 910 is smaller than the first bore radius R1. Similarly, the aperture radius P3 of the second partition plate 911 is smaller than the second bore radius R2.

The multistage quadrupole lens system 900 further includes an entrance suppression electrode portion 912 and an exit suppression electrode portion 913. The entrance suppression electrode portion 912 is disposed upstream of the first quadrupole lens 904, and the exit suppression electrode portion 913 is disposed downstream of the third quadrupole lens 908. The entrance suppression electrode portion 912 is constituted by three electrode plates. Similarly, the exit suppression electrode portion 913 is constituted by three electrode plates. The electrode plate in the middle of the entrance suppression electrode portion 912 is an entrance suppression electrode 914, and the electrode plates at both ends thereof are entrance suppression partition plates 916. Similarly, the electrode plate in the middle of the exit suppression electrode portion 913 is an exit suppression electrode 915, and the electrode plates at both ends thereof are exit suppression partition plates 917.

The entrance suppression electrode 914, the exit suppression electrode 915, the entrance suppression partition plates 916 and the exit suppression partition plates 917 are each a rectangular/square or circular board having an aperture (opening), through which to have an ion beam pass, at a central part. An aperture radius P1 of the entrance suppression electrode 914 is smaller than an aperture radius P4 of the exit suppression electrode 915. The aperture radius of each entrance suppression partition plate 916 may be equal to or slightly smaller than the aperture radius P1 of the entrance suppression electrode 914. The aperture radius of each exit suppression partition plate 917 may be equal to or slightly smaller than the aperture radius P4 of the exit suppression electrode 915.

The aperture radius P1 of the entrance suppression electrode 914 is smaller than the first bore radius R1. The aperture radius P1 of the entrance suppression electrode 914 may be equal to or slightly smaller than the aperture radius P2 of the first partition plate 910. The aperture radius P4 of the exit suppression electrode 915 is larger than the aperture radius P3 of the second partition plate 911 and is smaller than the third bore radius R3.

Figure 19:
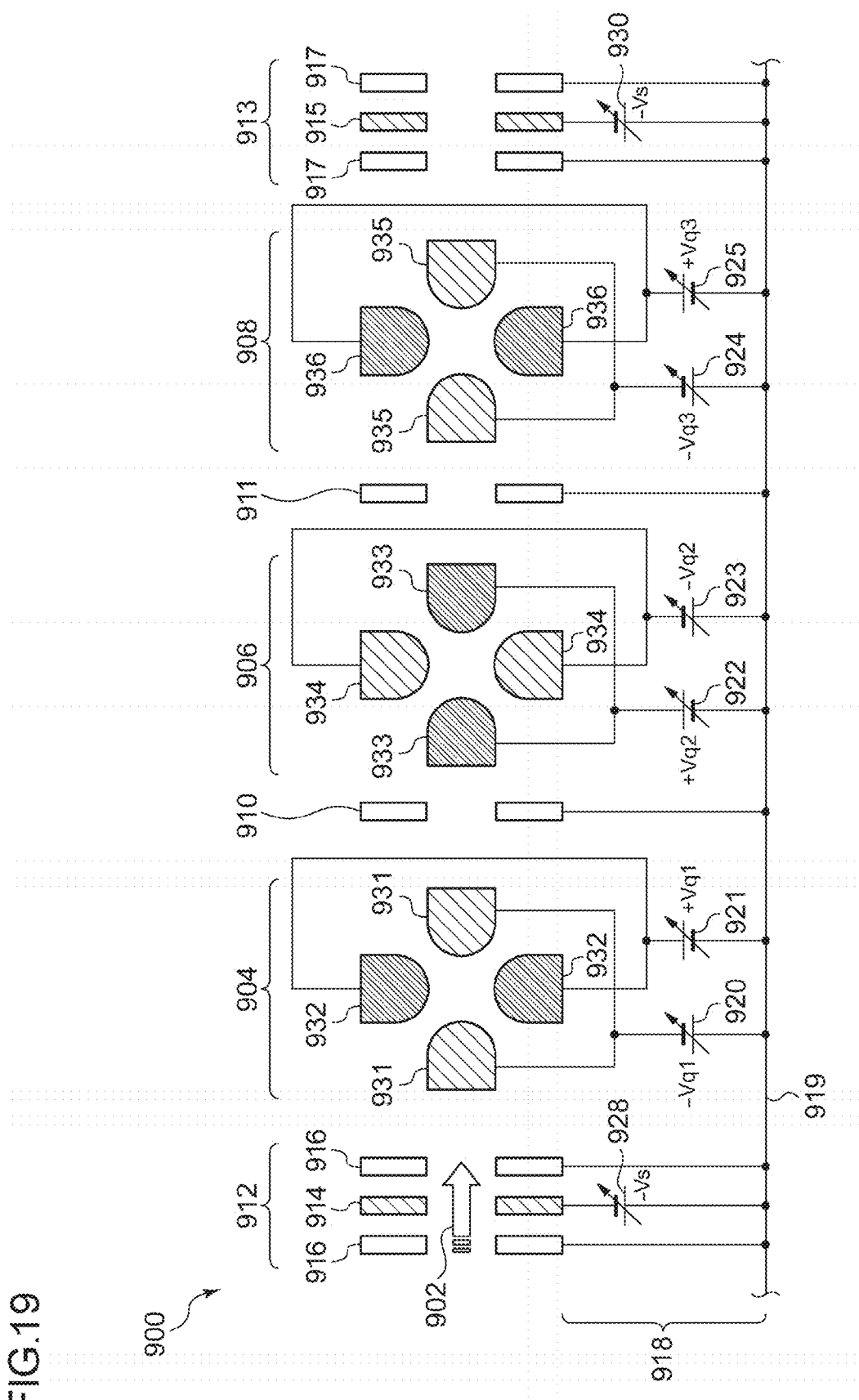
FIG. 19 is a diagram illustrating an exemplary configuration of a power supply of a multistage quadrupole lens system according to an embodiment of the present invention.

FIG. 19 is a diagram illustrating an exemplary configuration of a power supply of the multistage quadrupole lens system 900 according to an embodiment of the present invention. A power supply unit 918 of the multistage quadrupole lens system 900 is configured such that appropriate electric potentials relative to a reference potential 919 is applied to the first quadrupole lens 904, the second quadrupole lens 906, the third quadrupole lens 908, the entrance suppression electrode 914 and the exit suppression electrode 915. The reference potential 919 is, for example, a potential of a casing of the beam transport unit (e.g., the terminal 216 (see FIG. 6 and FIG. 7)). The power supply unit 918 includes a first negative power supply 920, a first positive power supply 921, a second positive power supply 922, a second negative power supply 923, a third negative power supply 924, a third positive power supply 925, a first suppression power supply 928, and a second suppression power supply 930. Each of these power supplies is a variable DC power supply, and these power supplies are provided as separate power supplies that can be controlled independently of each other. Each power supply may be controlled to achieve a desired voltage by a control unit (e.g., the control unit 116 (see FIG. 2)) that is so configured as to control the multistage quadrupole lens system 900.

The first negative power supply 920 is connected to electrodes 931 in a manner such that a negative potential $-Vq1$ is applied to a pair of electrodes 931 disposed horizontally opposite to each other (namely, a pair of horizontally facing electrodes 931) in the first quadrupole lens 904. The first positive power supply 921 is connected to electrodes 932 in a manner such that a positive potential $+Vq1$ is applied to a pair of electrodes 932 disposed vertically opposite to each other (namely, a pair of vertically facing electrodes 932) in the first quadrupole lens 904.

The second positive power supply 922 is connected to electrodes 933 in a manner such that a positive potential $+Vq2$ is applied to a pair of electrodes 933 disposed horizontally opposite to each other (namely, a pair of horizontally facing electrodes 933) in the second quadrupole lens 906. The second negative power supply 923 is connected to electrodes 934 in a manner such that a negative potential $-Vq2$ is applied to a pair of electrodes 934 disposed vertically opposite to each other (namely, a pair of vertically facing electrodes 934) in the second quadrupole lens 906.

The third negative power supply 924 is connected to electrodes 935 in a manner such that a negative potential $-Vq3$ is applied to a pair of electrodes 935 disposed horizontally opposite to each other (namely, a pair of horizontally facing electrodes 935) in the third quadrupole lens 908. The third positive power supply 925 is connected to electrodes 936 in a manner such that a positive potential $+Vq3$ is applied to a pair of electrodes 936 disposed vertically opposite to each other (namely, a pair of vertically facing electrodes 936) in the third quadrupole lens 908.

In this manner, the first quadrupole lens 904 is configured such that the ion beam is focused (or converged) in the vertical direction and is defocused (or diverged) in the horizontal direction. The second quadrupole lens 906 is configured such that the ion beam is defocused in the vertical direction and is focused in the horizontal direction. The third quadrupole lens 908 is configured such that the ion beam is focused in the vertical direction and is defocused in the horizontal direction.

What is meant by the phrase that "a certain quadrupole lens focuses an ion beam in the vertical (or horizontal) direction" is as follows. That is, for an ion trajectory passing through the quadrupole lens, the vertical (or horizontal) inclination of the trajectory at the exit of the quadrupole lens is smaller than the vertical (or horizontal) inclination of the trajectory at the entrance of the quadrupole lens. Conversely, what is meant by the phrase that "a certain quadrupole lens defocuses an ion beam in the vertical (or horizontal) direction" is as follows. That is, the vertical (or horizontal) inclination of the trajectory at the exit of the quadrupole lens is larger than the vertical (or horizontal) inclination of the trajectory at the entrance of the quadrupole lens. Note here that the vertical (or horizontal) inclination indicates a vertical-direction component (or horizontal-direction component) of an angle formed between the beam center trajectory 903 and the ion trajectory. The angle is defined as a positive when the ion trajectory moves away from the designed beam center trajectory 903.

As shown in FIG. 19, the first suppression power supply 928 applies a negative potential $-Vs$ to the entrance suppression electrode 914, and the second suppression power supply 930 applies a negative potential $-Vs$ to the exit suppression electrode 915. The entrance suppression partition plates 916 and the exit suppression partition plates 917 are connected to the reference potential 919. Also, the first partition plate 910 and the second partition plate 911 are connected to the reference potential 919. In the example as shown in FIG. 19, the first suppression power supply 928 and the second suppression power supply 930 are separate power supplies independent of each other but both of them applies the same negative potential $-Vs$. Thus, the first suppression power supply 928 and the second suppression power supply 930 may be configured as a single common suppression power supply.

The first negative power supply 920, the second negative power supply 923 and the third negative power supply 924 are configured such that, for example, a voltage selected within a range of about $-1$ kV to about $-30$ kV is applied to their corresponding quadrupole lenses. The first positive power supply 921, the second positive power supply 922 and the third positive power supply 925 are configured such that, for example, a voltage selected within a range of about 1 kV to about 30 kV is applied to their corresponding quadrupole lenses. The first suppression power supply 928 and the second suppression power supply 930 are configured such that a voltage selected within a range of about $-0.5$ kV to about $-5$ kV is applied to their corresponding suppression electrodes. The voltage value for each power supply is set according to given ion implantation conditions including the implantation energy, for instance.

The focusing force of a quadrupole lens is expressed by a parameter, which is called a GL product. When a quadrupole lens is an electrostatic lens, the GL product is expressed by the following equation using the Q lens voltage, the Q lens length and the bore radius.

$$[GL \text{ product}] = 2 \times [Q \text{ lens voltage}] \times [Q \text{ lens length}] / ([\text{Bore radius}] \times [\text{Bore radius}])$$

Thus, the GL product of each quadrupole lens is expressed by the following equations, when the GL products of the first quadrupole lens 904, the second quadrupole lens 906 and the third quadrupole lens 908 are denoted by GL1, GL2 and GL3, respectively. GL1, GL2 and GL3 may be hereinafter referred to as "first GL product", "second GL product" and "third GL product", respectively.

$$GL1 = 2 \cdot Vq1 \cdot T1/R1^2$$

$$GL2 = 2 \cdot Vq2 \cdot T2/R2^2$$

$$GL3 = 2 \cdot Vq3 \cdot T3/R3^2$$

A triplet quadrupole lens system is typically designed such that the first GL product and the third GL product are equal to each other and the second GL product is twice the first GL product (or the third GL product) (namely, GL1:GL2:GL3=1:2:1). However, the ratio among the GL products in the triplet quadrupole lens system is not limited to such a typical example as described above. The ratio among the GL products may be a desired ratio selected within a range of GL1:GL2:GL3=1:[1 to 3]:[0.5 to 2]. This notation of ratio is expressed in terms of the first GL product defined as the reference. Where it is expressed in terms of the third GL product defined as the reference, the ratio among the GL products may be a desired ratio selected within a range of GL1:GL2:GL3=[0.5 to 2]:[1 to 3]:1. In other words, the second GL product may be in a range of one to three times the first GL product, and the third GL product may be in a range of 0.5 to two times the first GL product. (Or the first GL product may be in a range of 0.5 to two times the third GL product, and the second GL product may be in a range of one to three times the third GL product.)

In order that the ratio among the GL products of the three quadrupole lenses can be set within a range of GL1:GL2:GL3=1:[1 to 3]:[0.5 to 2] (or GL1:GL2:GL3=[0.5 to 2]:[1 to 3]:1), the ratio among the bore radii of the three quadrupole lenses is preferably R1:R2:R3=1:[1 to 2]:[1 to 2] (or R1:R2:R3=[0.5 to 1]:[0.5 to 1]:1). In other words, both the second bore radius R2 and the third bore radius R3 may be in a range of one to two times the first bore radius R1 (or both the first bore radius R1 and the second bore radius R2 may be in a range of 0.5 to one time the third bore radius R3). If, however, a flare-type triplet quadrupole lens system is to be constructed, the second bore radius R2 will be smaller than or equal to the third bore radius R3, as described earlier.

Similarly, in order that the ratio among the GL products of the three quadrupole lenses can be set within a range of GL1:GL2:GL3=1:[1 to 3]:[0.5 to 2] (or GL1:GL2:GL3=[0.5 to 2]:[1 to 3]:1), the ratio among the lengths of the three quadrupole lenses is preferably T1:T2:T3=1:[1 to 12]:[0.5 to 8] (or T1:T2:T3=[0.5 to 2]:[0.2 to 3]:1). In other words, the second Q lens length T2 may be in a range of one to twelve times the first Q lens length T1, and the third Q lens length T3 may be in a range of 0.5 to eight times the first Q lens length T1. (Or the second Q lens length T2 may be in a range of 0.2 to three times the third Q lens length T3, and the first Q lens length T1 may be in a range of 0.5 to two times the third Q lens length T3.) For the practical purposes, the ratio among the lengths of the three quadrupole lenses is preferably T1:T2:T3=[0.5 to 0.8]:[0.8 to 1.6]:1.

FIG. 20 is a diagram illustrating another exemplary configuration of a power supply of the multistage quadrupole lens system 900 according to an embodiment of the present invention. The power supply unit 918 shown in FIG. 20 differs from the power supply unit 918 shown in FIG. 19 in that the power supply of the second quadrupole lens 906 and the power supply of the third quadrupole lens 908 are put to a common use. Otherwise, the configuration of the power supply unit 918 shown in FIG. 20 is similar to that of the power supply unit 918 shown in FIG. 19.

Thus, as shown in FIG. 20, the power supply unit 918 includes the second positive power supply 922 and the second negative power supply 923, which are each a common power supply used commonly for the second quadrupole lens 906 and the third quadrupole lens 908. The first negative power supply 920 and the first positive power supply 921 are provided as separate power supplies, which are used to control the first quadrupole lens 904 independently of the second quadrupole lens 906 and the third quadrupole lens 908.

The second positive power supply 922 is connected to the electrodes 933 in a manner such that a positive potential +Vq23 is applied to a pair of electrodes 933 disposed horizontally opposite to each other (namely, a pair of horizontally facing electrodes 933) in the second quadrupole lens 906. The second negative power supply 923 is connected to the electrodes 934 in a manner such that a negative potential −Vq23 is applied to a pair of electrodes 934 disposed vertically opposite to each other (namely, a pair of vertically facing electrodes 934) in the second quadrupole lens 906. The second negative power supply 923 is connected to the electrodes 935 in a manner such that a negative potential −Vq23 is applied to a pair of electrodes 935 disposed horizontally opposite to each other (namely, a pair of horizontally facing electrodes 935) in the third quadrupole lens 908. The second positive power supply 922 is connected to the electrodes 936 in a manner such that a positive potential +Vq23 is applied to a pair of electrodes 936 disposed vertically opposite to each other (namely, a pair of vertically facing electrodes 936) in the third quadrupole lens 908.

Thus, the GL products of the first quadrupole lens 904, the second quadrupole lens 906 and the third quadrupole lens 908 are respectively expressed by the following equations.

$$GL1 = 2 \cdot Vq1 \cdot T1/R1^2$$

$$GL2 = 2 \cdot Vq23 \cdot T2/R2^2$$

$$GL3 = 2 \cdot Vq23 \cdot T3/R3^2$$

Hence, in order that the ratio between the GL product of the second quadrupole lens 906 and the GL product of the third quadrupole lens 908 (i.e., GL2:GL3) can be set to a desired ratio (e.g., 2:1), the second Q lens length T2, the second bore radius R2, the third Q lens length T3 and the third bore radius R3 are determined such that the ratio of $T2/R2^2$ to $T3/R3^2$ ($T2/R2^2:T3/R3^2$) is set to the desired ratio. In this manner, the shapes of the second quadrupole lens 906 and the third quadrupole lens 908 are determined such that the ratio among the GL product of the first quadrupole lens 904, the GL product of the second quadrupole lens 906 and the GL product of the third quadrupole lens 908 is a desired ratio selected within a range of GL1:GL2:GL3=1:[1 to 3]:[0.5 to 2]. Designing the lens shapes like this allows the unification of the power supplies of the second quadrupole lens 906 and the third quadrupole lens 908.

The multistage quadrupole lens system 900 controls the separate power supply for controlling the first quadrupole lens 904 independently of the second quadrupole lens 906 and the third quadrupole lens 908 and/or the common power supply for the second quadrupole lens 906 and the third quadrupole lens 908. With this control, the multistage quadrupole lens system 900 is configured such that the focusing force of the multistage quadrupole lens system 900 can be fine-adjusted.

If the positive potential +Vq1 of the first positive power supply 921 and the positive potential +Vq23 of the second positive power supply 922 are equal to each other and if the negative potential −Vq1 of the first negative power supply 920 and the negative potential −Vq23 of the second negative power supply 923 are equal to each other, the ratio among the GL products of the three quadrupole lenses will take a value determined by the shapes of the quadrupole lenses. For example, the ratio among the GL products of the three quadrupole lenses is in a range of GL1:GL2:GL3=1:[1 to 3]:[0.5 to 2]. And the ratio is GL1:GL2:GL3=1:2:1, for instance. Regarding this basic state as a standard, the power supply unit 918 is controlled such that either one of the voltage Vq1 and the voltage Vq23 is made to somewhat differ from the other thereof. Thereby, the beam focusing (or beam defocusing) by the triplet multistage quadrupole lens system can be fine-adjusted.

As described earlier, the multistage quadrupole lens system 900 is so configured as to operate in any one of a plurality of beam transport modes. The plurality of beam transport modes include a defocusing beam mode. In this defocusing beam mode, the multistage quadrupole lens system 900 operates such that an ion beam exiting from the multistage quadrupole lens system 900 is focused in the vertical direction and is defocused in the horizontal direction. The defocusing beam mode is an operation under a setting where the first quadrupole lens 904 only is used (or turned on) or under a setting where two or more quadrupole lenses including at least the first quadrupole lens 904 are used (or turned on). Thus, the multistage quadrupole lens system 900 works as a single quadrupole lens or a group of quadrupole lenses having two or more stages. Hereinbelow, the ion beam that is focused in the vertical direction and defocused in the horizontal direction by the multistage quadrupole lens system 900 may be referred to as "defocusing beam".

Also, the plurality of beam transport modes includes a focusing beam mode. In this focusing beam mode, the multistage quadrupole lens system 900 operates such that an ion beam exiting therefrom is focused in the vertical direction and is focused in the horizontal direction. In the focusing beam mode, the first quadrupole lens 904, the second quadrupole lens 906 and the third quadrupole lens 908 are used. Thus, the multistage quadrupole lens system 900 operates as a triplet quadrupole lens system. Hereinbelow, the ion beam that is focused in the vertical direction and focused in the horizontal direction by the multistage quadrupole lens system 900 may be referred to as "focusing beam".

Defocusing the ion beam by the multistage quadrupole lens system 900 is effective when the beam current is high. Generally, as the beam current is higher, the ion density becomes higher and the space charge effect becomes greater. This is because the space charge effect is caused by the electric repulsion exerted among the ions. If the ion beam is deliberately defocused so as to achieve an increased beam diameter, the ion density will be smaller and therefore the space charge effect can be reduced. In the defocusing beam mode, the defocusing of ion beam is controlled in the multistage quadrupole lens system 900 such that the space charge effect is reduced in a position downstream of the multistage quadrupole lens system 900. Thus, the defocusing beam mode is suitable for the transportation of high-current beams.

In the defocusing beam mode, the upstream first quadrupole lens 904 is used. Increasing the beam diameter in a position of the upstream first quadrupole lens 904 of the multistage quadrupole lens system 900 is effective in reducing the space charge effect inside the multistage quadrupole lens system 900.

On the other hand, the focusing beam mode is suitable for the transportation of low-current beams. If the beam current is low, the space charge effect on the beam transportation will be comparatively low. This therefore enables ions in the ion beam to be transported approximately parallel with the beam center trajectory while a small beam diameter is kept intact.

Thus, the aforementioned first beamline setting S1 (see FIG. 2) may include having the multistage quadrupole lens system 900 operated in the defocusing beam mode. Also, the second beamline setting S2 may include having the multistage quadrupole lens system 900 operated in the focusing beam mode. Using the defocusing beam mode and the focusing beam mode separately for different purposes in this manner enables the ion beam to be efficiently transported over a wide beam current range from high to low currents.

Figure 22A:
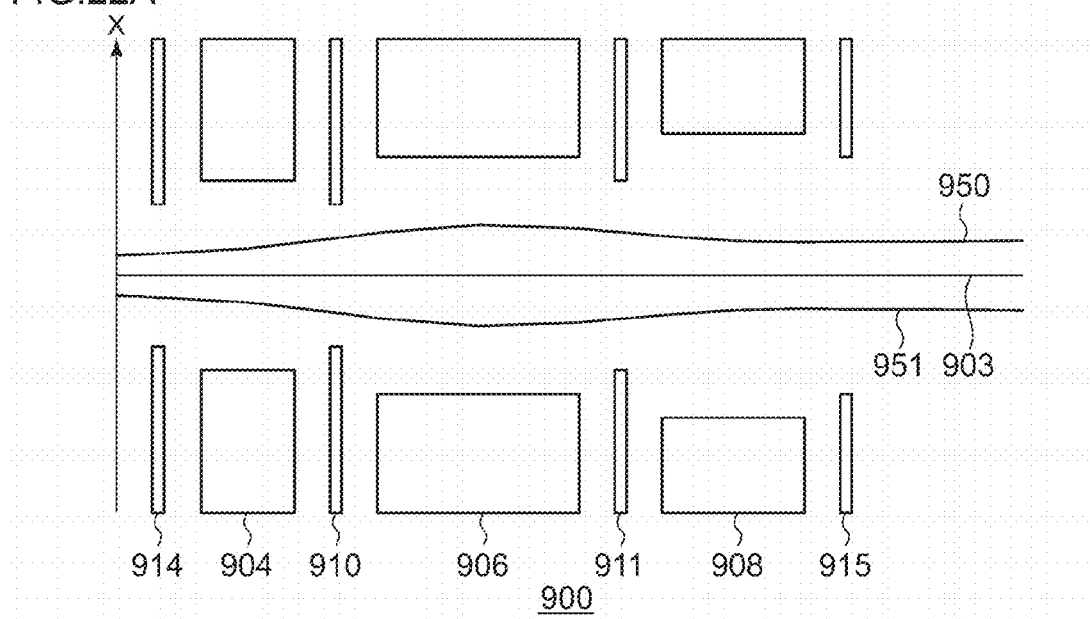
FIG. 22A and FIG. 22B are each a diagram showing an exemplary beam transport, which uses a multistage quadrupole lens system, according to an embodiment of the present invention.
Figure 22B:
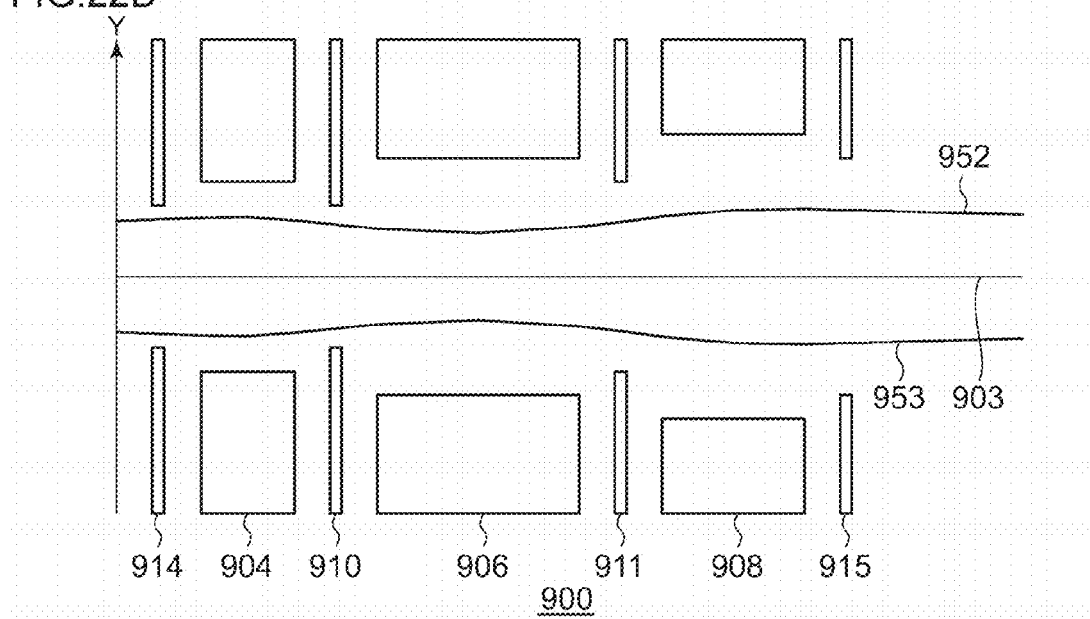
Figure 22C:
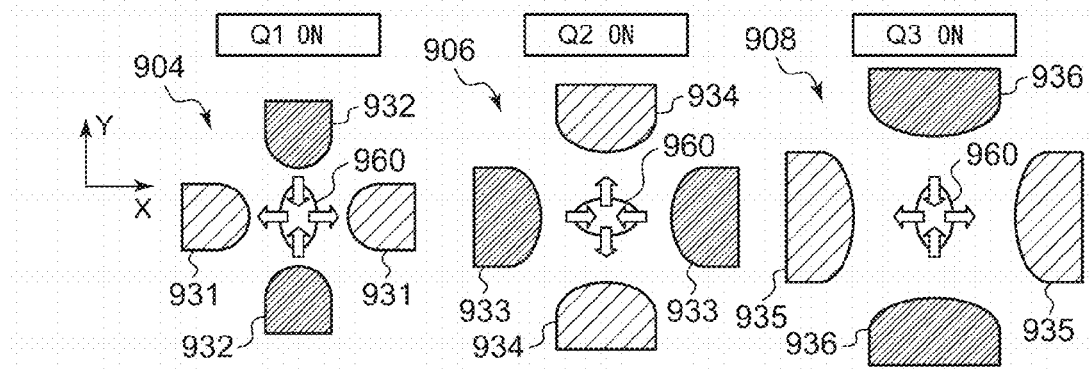
FIG. 22C is a diagram for explaining a focusing or defocusing action of each quadrupole lens on beams.
Figure 24A:
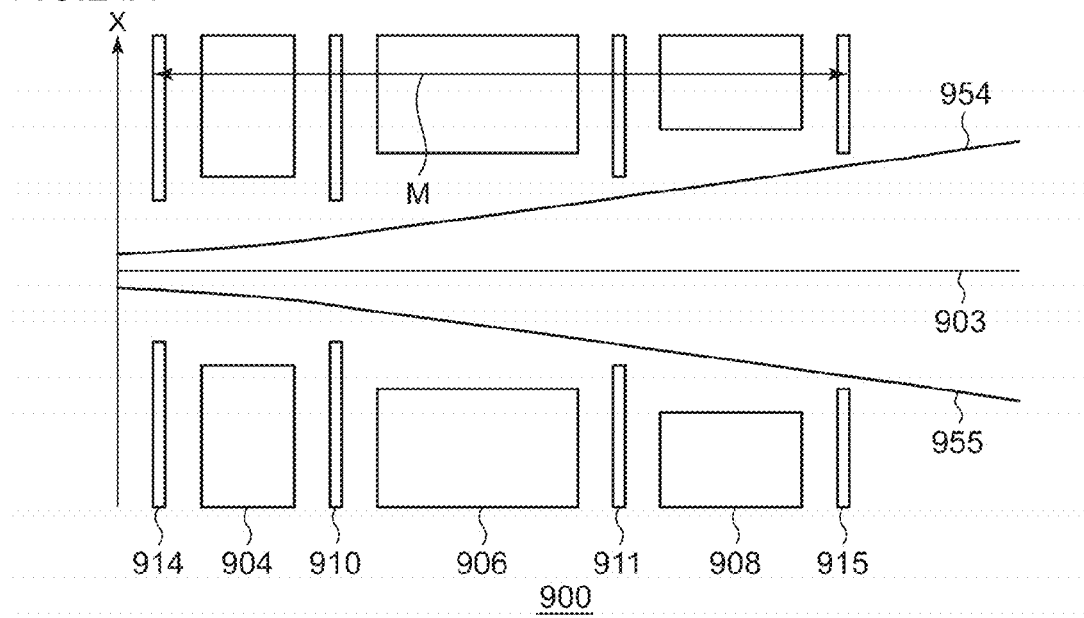
FIG. 24A and FIG. 24B are each a diagram showing an exemplary beam transport unit, which uses a multistage quadrupole lens system, according to an embodiment of the present invention.
Figure 24B:
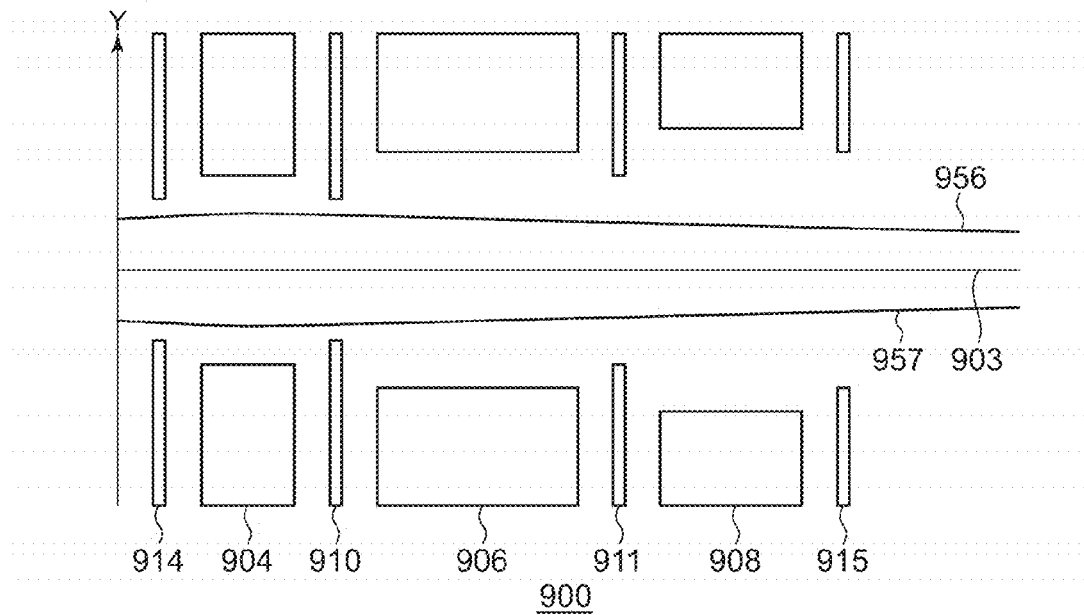
Figure 24C:
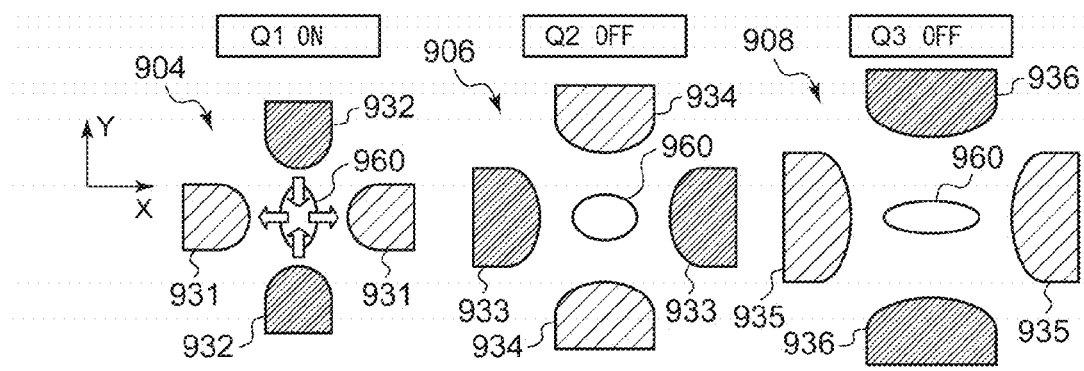
FIG. 24C is a diagram for explaining a focusing or defocusing action of each quadrupole lens on beams.

Referring to FIG. 22A and FIG. 22B, a description is given of a beam transport when the multistage quadrupole lens system 900 is operated as a triplet quadrupole lens system. Referring to FIG. 24A and FIG. 24B, a description is given of a beam transport when the multistage quadrupole lens system 900 is operated as a singlet quadrupole lens. FIG. 22A and FIG. 24A show a beam focusing (or beam defocusing) in the horizontal direction, and FIG. 22B and FIG. 24B show a beam focusing (or beam defocusing) in the vertical direction. FIGS. 22A and 22B and FIGS. 24A and 24B each shows a result of simulation run. FIG. 22C shows a focusing or defocusing action of each quadrupole lens when the multistage quadrupole lens system 900 is operated as a triplet quadrupole lens system. FIG. 24C shows a focusing or defocusing action of each quadrupole lens when the multistage quadrupole lens system 900 is operated as a singlet quadrupole lens. FIG. 22C and FIG. 24C show cross sections 960 of an ion beam passing through the centers of the first quadrupole lens 904, the second quadrupole lens 906 and the third quadrupole lens 908, respectively. In FIG. 22C and FIG. 24C, the focusing action of the ion beam is indicated by an inward-pointing arrow, and the defocusing action thereof is indicated by an outward-pointing arrow.

Thus, FIG. 22A shows a designed right end 950 and a designed left end 951 of ion beam transported by the multistage quadrupole lens system 900; in this case, the multistage quadrupole lens system 900 is used (worked) as a triplet quadrupole lens system. FIG. 22B shows a designed upper end 952 and a designed lower end 953 of ion beam in the multistage quadrupole lens system 900 working as the triplet quadrupole lens system. FIG. 24A shows a designed right end 954 and a designed left end 955 of ion beam when the first quadrupole lens 904 only is operated (turned on) in the multistage quadrupole lens system 900. FIG. 24B shows a designed upper end 956 and a designed lower end 957 of ion beam when the first quadrupole lens 904 only is operated in the multistage quadrupole lens system 900. Each of FIGS. 22A and 22B and FIGS. 24A and 22B shows also the beam center trajectory 903.

Figure 21A:
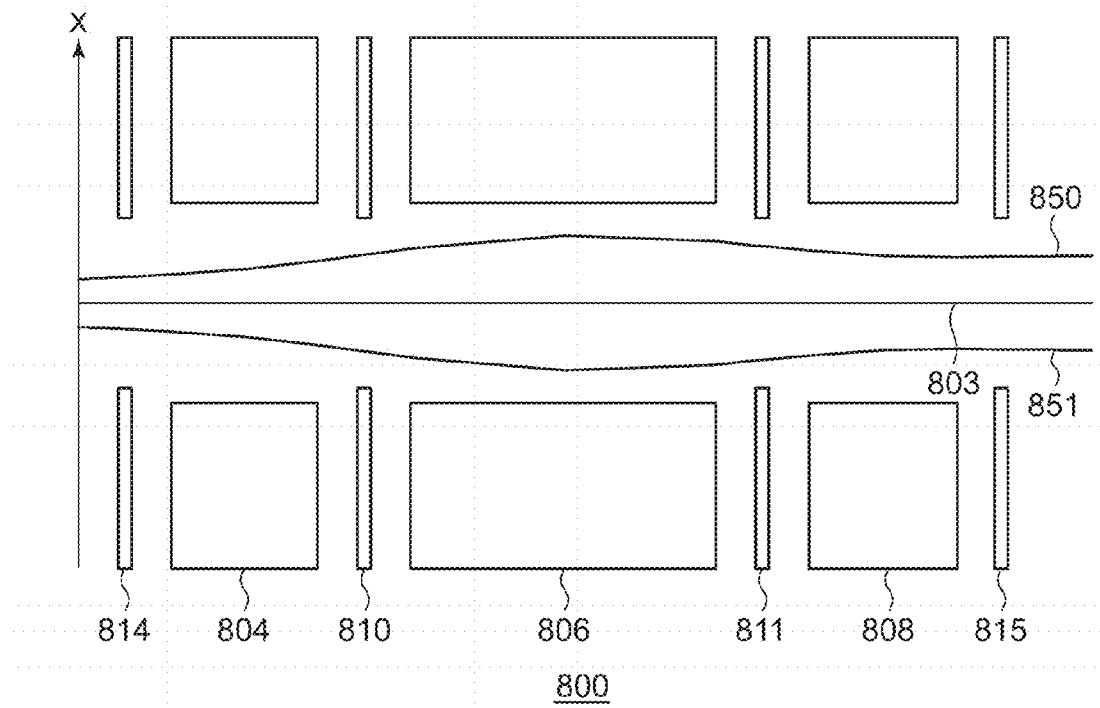
FIG. 21A and FIG. 21B are each a diagram showing an exemplary beam transport, which uses a triplet quadrupole lens system, in a comparative example.
Figure 21B:
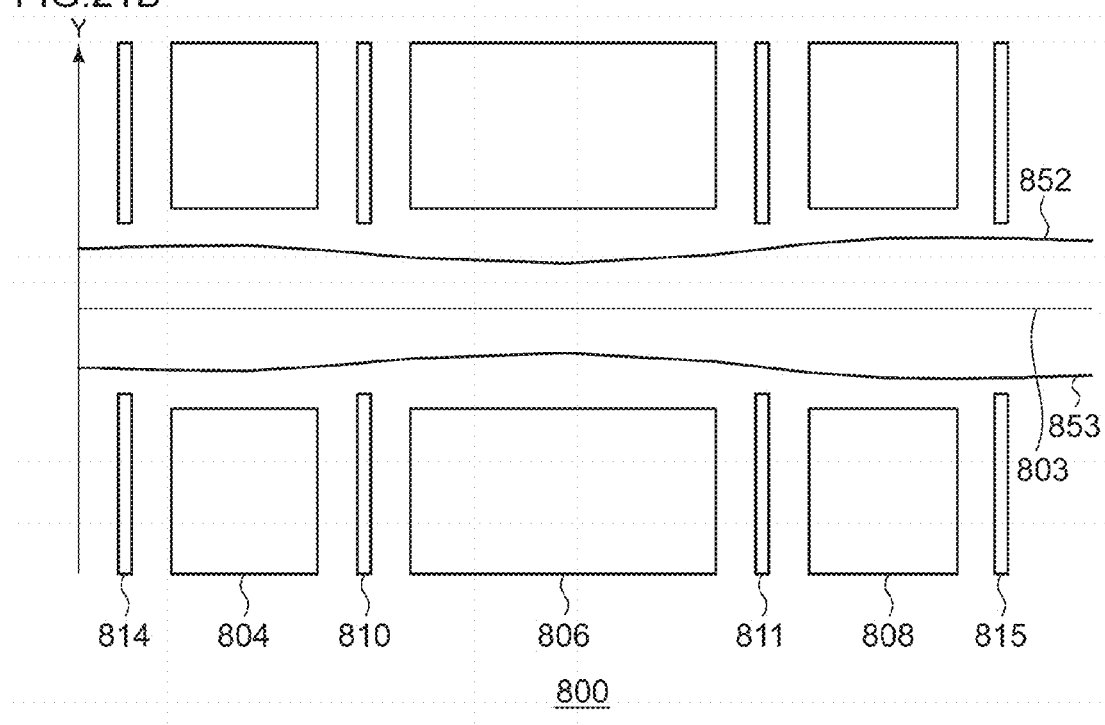
Figure 23A:
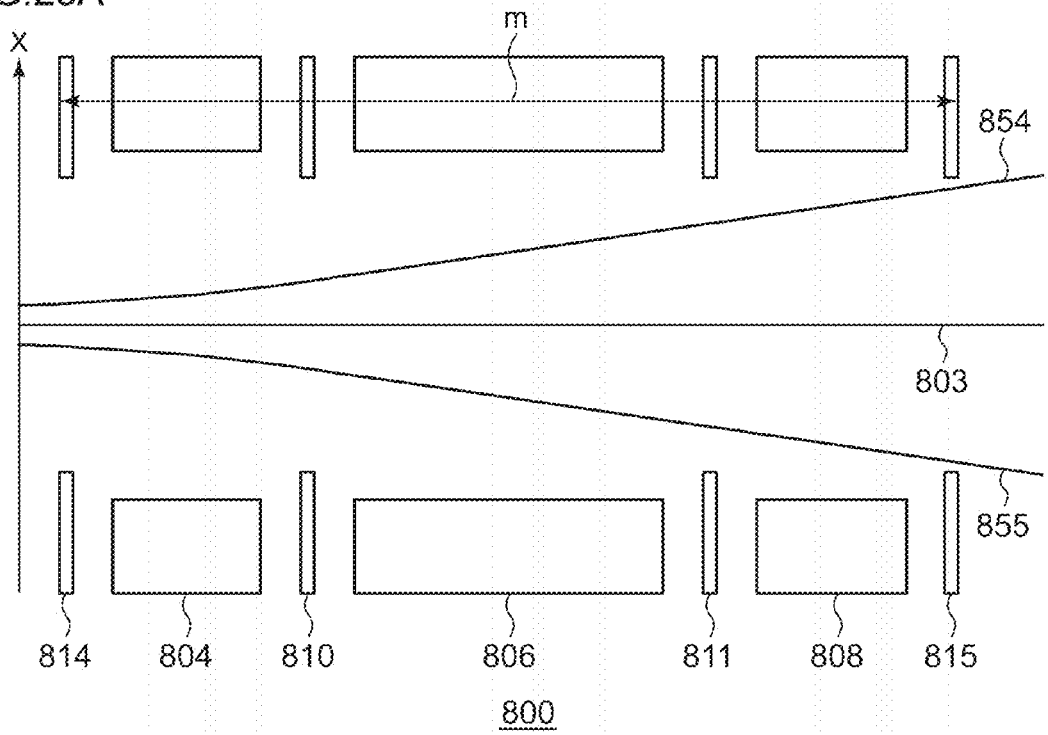
FIG. 23A and FIG. 23B are each a diagram showing an exemplary beam transport, which uses a triplet quadrupole lens system, in a comparative example.
Figure 23B:
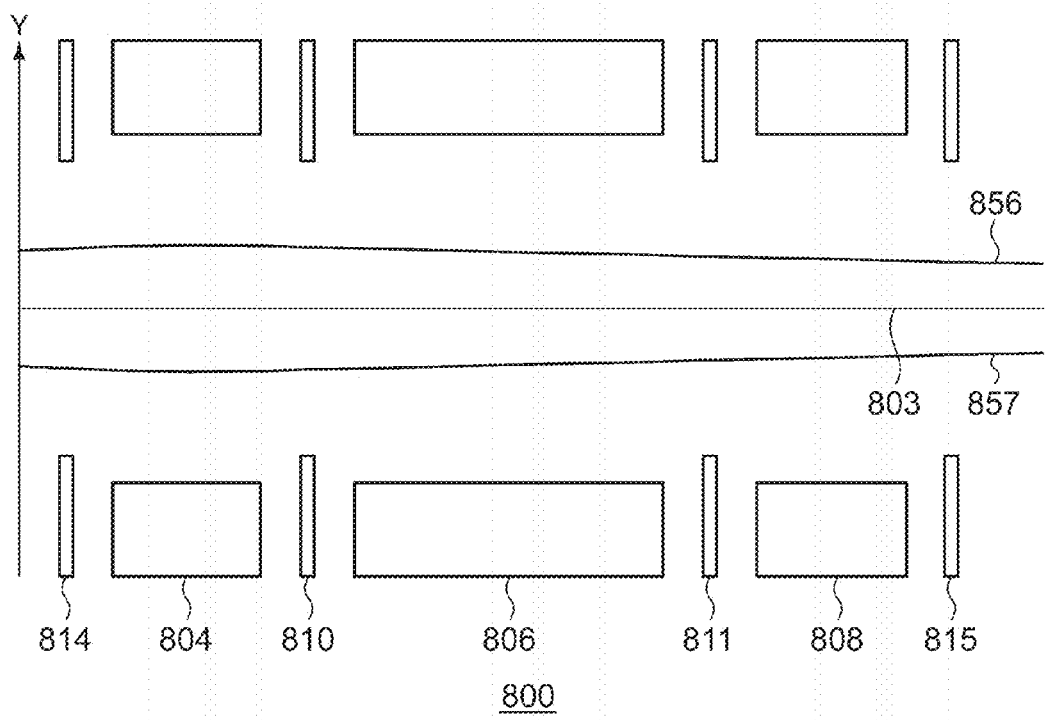

For comparison, by reference to FIG. 21A and FIG. 21B, a description is given of a beam transport when the triplet quadrupole lens system 800 shown in FIG. 15 is operated. For further comparison, by reference to FIG. 23A and FIG. 23B, a description is given of a beam transport when the triplet quadrupole lens system 800 is operated as a singlet quadrupole lens. Note, however, that the triplet quadrupole lens system 800 shown in each of FIG. 21A and FIG. 21B has a smaller bore diameter than that of the triplet quadrupole lens system 800 shown in each of FIGS. 23A and 23B. FIG. 21A and FIG. 23A show a beam focusing (or beam defocusing) in the horizontal direction, and FIG. 21B and FIG. 23B show a beam focusing (or beam defocusing) in the vertical direction. Thus, FIG. 21A shows a right end 850 and a left end 851 of ion beam in the triplet quadrupole lens system 800. FIG. 21B shows an upper end 852 and a lower end 853 of ion beam in the triplet quadrupole lens system 800. FIG. 23A shows a right end 854 and a left end 855 of ion beam when the first quadrupole lens 804 only is operated (turned on) in the triplet quadrupole lens system 800. FIG. 23B shows an upper end 856 and a lower end 857 of ion beam when the first quadrupole lens 804 only is operated in the triplet quadrupole lens system 800.

As described above, the shapes of components, such as the quadrupole lenses, the partition plates and the suppression electrode portions, which constitute the multistage quadrupole lens system 900 are designed such that the flare-type beam transport space where the central openings of successive quadrupole lenses get wider toward the downstream side from the upstream side along the beam center trajectory 903 is formed. For ease of understanding, the components such as the quadrupole lenses are additionally depicted in each Figure. In contrast thereto, the shapes of components constituting the triplet quadrupole lens system 800 are designed such that a cylindrical beam transport space, which is uniformly provided from an upstream side toward a downstream side is formed. Each Figure shows a case where the multistage quadrupole lens system 900 and the triplet quadrupole lens system 800 transport the beams under a common condition, except for their shapes. Note also that the ion beam entering the multistage quadrupole lens system 900 (and the triplet quadrupole lens system 800) tends to defocus at least in the horizontal direction, as shown in the Figures. However, the degree of defocusing is minimal.

As shown in FIG. 22A and FIG. 22C, the ion beam passing through the multistage quadrupole lens system 900 undergoes the horizontal defocusing action by the first quadrupole lens 904, the horizontal focusing action by the second quadrupole lens 906 and the horizontal defocusing action by the third quadrupole lens 908. Simultaneously, as shown in FIG. 22B and FIG. 22C, the ion beam passing therethrough undergoes the vertical focusing action by the first quadrupole lens 904, the vertical defocusing action by the second quadrupole lens 906 and the vertical focusing action by the third quadrupole lens 908. When, in this manner, the multistage quadrupole lens system 900 is used as a triplet quadrupole lens system, the multistage quadrupole lens system 900 causes the ion beam to focus in the vertical and horizontal directions. Similarly, as shown in FIG. 21A and FIG. 21B, the triplet quadrupole lens system 800 causes the ion beam to focus in the vertical and horizontal directions.

On the other hand, as shown in FIGS. 24A, 24B and 24C, the ion beam passing therethrough undergoes the vertical focusing action and the horizontal defocusing action by the first quadrupole lens 904 in the multistage quadrupole lens system 900. In this case, the second quadrupole lens 906 and the third quadrupole lens 908 are turned off. Thus, the beam angle at the entrance and the beam angle at the exit of the second quadrupole lens 906 (and the third quadrupole lens 908) are identical to each other. Thus, the ion beam in the third quadrupole lens 908 is focused in the vertical direction and defocused in the horizontal direction as compared with the ion beam in the first quadrupole lens 904. When, as described above, the multistage quadrupole lens system 900 is used as a singlet quadrupole lens, the multistage quadrupole lens system 900 causes the ion beam to focus in the vertical direction and defocus in the horizontal direction. When, as shown in FIG. 23A and FIG. 23B, the triplet quadrupole lens system 800 is used as a singlet quadrupole lens, the first quadrupole lens 804 causes the ion beam to focus in the vertical direction and defocus in the horizontal direction.

By comparing FIG. 24A with FIG. 23A, for example, it is verified that an entire length M of the multistage quadrupole lens system 900 is shorter than an entire length m of the triplet quadrupole lens system 800. Electrons cannot exist or are rarely existent in a region where the electric field is applied as with the electrostatic quadrupole lens, and therefore the space charge effect in a region inside of the electrostatic quadrupole lens is greater. Thus, reducing the length of the beam transportation direction in such an electron depleted region can reduce the space charge effect. Since the multistage quadrupole lens system 900 is shorter in length, the multistage quadrupole lens system 900 reduces the space charge effect more effectively than the triplet quadrupole lens system 800 does. Using the multistage quadrupole lens system 900 can improve the transport efficiency of the beam of singly-charged arsenic having several tens of keV energy and about several tens of mA current (high current), for instance.

Forming a flare-shaped internal space in the multistage quadrupole lens system 900 contributes to downsizing the lens length of the multistage quadrupole lens system 900. If, for example, the ratio among the lengths of the quadrupole lenses is T1:T2:T3=[0.5 to 0.8]:[0.8 to 1.6]:1 as described above, the ratio T1:T2:T3 will be 0.8:1.6:1 at most. When the length of the multistage quadrupole lens system is compared, between the present embodiment and a typical example, in terms of the length of the third quadrupole lens defined as a reference, the total lens length of the typical example (t1:t2:t3=1:2:1) will be expressed by 4t(=t+2t+t). In contrast, the total lens length in the present embodiment (T1:T2:T3=[0.5 to 0.8]:[0.8 to 1.6]:1) is 3.4T (=0.8T+1.6T+T) at most. The third Q lens length T in the present embodiment is nearly equal to or less than the third lens length t of the typical example. Thus, the lens length of the flare-shaped multistage quadrupole lens system 900 becomes shorter. Also, the first Q lens electrodes are brought close to the beam because the first bore radius R1 is small. This allows a desired first GL product (namely, the focusing force of the first quadrupole lens 904) to be realized with a shorter first Q lens length T1. Similarly, a desired second GL product can be realized with a shorter second Q lens length T2 in the second quadrupole lens 906. The same applies to the third quadrupole lens 908. Also, the flare-shaped multistage quadrupole lens system 900 is effective in reducing the power supply capacity. This is because the bore radius is smaller than that of the conventional lens and therefore the desired GL products can be achieved with smaller Q lens voltages.

In contrast to this, it is presupposed that a cylindrical internal space whose diameter is uniformly sized is formed in the triplet quadrupole lens system 800. Accordingly, the bore radius of the third quadrupole lens 808 is defined based on the diameter of the defocusing beam at the exit of the triplet quadrupole lens system 800. And the bore diameter of each of the first quadrupole lens 804 and the second quadrupole lens 806 is defined at the same value as the value of the bore radius of the third quadrupole lens 808 defined. Since the bore radius is large, the electrodes are located comparatively far from the beam. Thus, in order to achieve the desired first GL product, the Q lens length is increased and/or the Q lens voltage is raised. In consideration of the measures to be taken relating to the avoidance of the discharge between the electrodes, the Q lens voltage should not be excessively high. Hence, the entire length of the triplet quadrupole lens system 800 will be long.

Figure 25:
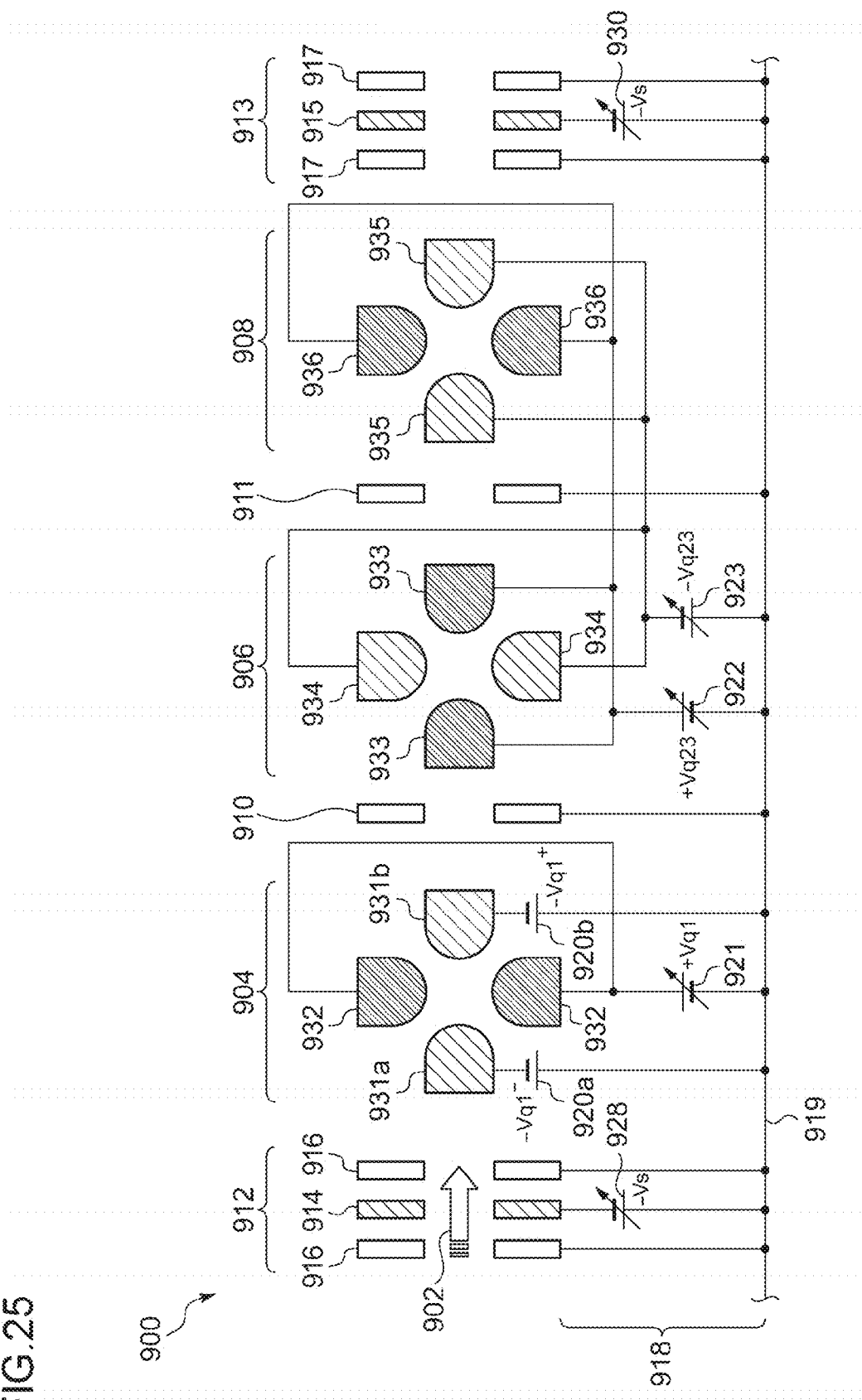
FIG. 25 is a diagram illustrating still another exemplary configuration of a power supply of a multistage quadrupole lens system according to an embodiment of the present invention.

FIG. 25 is a diagram illustrating still another exemplary configuration of a power supply of the multistage quadrupole lens system 900 according to an embodiment of the present invention. The power supply unit 918 shown in FIG. 25 differs from the power supply unit 918 shown in FIG. 20 in that the power supplies of the first quadrupole lens 904 differs from those in FIG. 20. Otherwise, the configuration of the power supply unit 918 shown in FIG. 25 is similar to that of the power supply unit 918 shown in FIG. 20.

The power supply unit 918 includes a pair of first negative power supplies 920a and 920b, associated with a pair of electrodes 931a and 931b disposed horizontally opposite to each other (namely, a pair of horizontally facing electrodes 931a and 931b), in the first quadrupole lens 904. One first negative power supply 920a of the pair of first negative power supplies 920a and 920b is connected to the electrode 931a in a manner such that a negative potential $-Vq1^{-}(=-Vq1-Vst)$ is applied to one electrode 931a of the pair of electrodes 931a and 931b. The other first negative power supply 920b thereof is connected to the electrode 931b in a manner such that a negative potential $-Vq1^{+}(=-Vq1+Vst)$ is applied to the other electrode 931b thereof. Thus, separate power supplies to the horizontal electrodes 931a and 931b respectively in the first quadrupole lens 904 can provide a steering function that regulates the horizontal position of the beam. Here, the voltage Vst is set according to a desired horizontal position of the beam.

Note also that a steering function for regulating the vertical position of the beam may be provided by separate power supplies associated respectively with the vertically facing electrodes. Similarly, the other quadrupole lenses can be equipped with the steering functions.

In the above-described embodiment, the first quadrupole lens 904 only is used in the defocusing beam mode. In another embodiment, the second quadrupole lens 906 and/or the third quadrupole lens 908 may be used in combination with the first quadrupole lens 904 in the defocusing beam mode. Alternatively, the second quadrupole lens 906 or the third quadrupole lens 908 may be mainly used in the defocusing beam mode. Also, only a part of the multistage quadrupole lens system (e.g., at least two quadrupole lenses including the first quadrupole lens 904) may be used in the focusing beam mode.

In the above-described embodiment, the triplet quadrupole lens system is configured by having the vertical focusing action, the horizontal focusing action, and the vertical focusing action in order from the upstream side. In another embodiment, however, the triplet quadrupole lens system may be configured by having the horizontal focusing action, the vertical focusing action, and the horizontal focusing action in order from the upstream side. Thus, the first quadrupole lens 904 may be configured such that the ion beam is focused in the horizontal direction and defocused in the vertical direction. The second quadrupole lens 906 may be configured such that the ion beam is defocused in the horizontal direction and focused in the vertical direction. The third quadrupole lens 908 may be configured such that the ion beam is focused in the horizontal direction and defocused in the vertical direction.

In the above-described embodiment, the multistage quadrupole lens system 900 is of a flare type. In another embodiment, the multistage quadrupole lens system may be of a quasi-flare type where the bore radius becomes minimum in the middle of a sequence of quadrupole lenses. In this case, the multistage quadrupole lens system includes an entrance quadrupole lens, a middle quadrupole lens, and an exit quadrupole lens. And the bore radius of the entrance quadrupole lens may be smaller than that of the exit quadrupole lens, and the bore radius of the middle quadrupole lens may be smaller than both that of the entrance quadrupole lens and that of exit quadrupole lens.

In still another embodiment, the multistage quadrupole lens system may be a barrel-shaped one where the bore radius becomes maximum in the middle of a sequence of quadrupole lenses. In this case, the multistage quadrupole lens system includes an entrance quadrupole lens, a middle quadrupole lens, and an exit quadrupole lens. And the bore radius of the entrance quadrupole lens may be smaller than that of the exit quadrupole lens, and the bore radius of the middle quadrupole lens may be larger than both that of the entrance quadrupole lens and that of exit quadrupole lens.

In still another embodiment, the multistage quadrupole lens system may be a multistage quadrupole lens system that is a two-stage quadrupole lens or a four-or-more-stage quadrupole lens. In this case, making the bore radius of the entrance quadrupole lens smaller than that of exit quadrupole lens proves to be useful in downsizing the multistage quadrupole lens system and/or reducing the power supply capacity.

In the above-described embodiments, the multistage quadrupole lens system is of an electric-field type (electrostatic). In still another embodiment, the multistage quadrupole lens system may be of a magnetic-field type (magentostatic).

In still another embodiment, there may be provided an ion implantation apparatus equipped with a multistage quadrupole lens system, used to adjust the beam focusing and defocusing, which is placed midway in a beamline of the ion implantation apparatus. This ion implantation apparatus may include a multistage quadrupole lens system provided upstream of a mass analysis slit, the multistage quadrupole lens system including an entrance quadrupole lens and an exit quadrupole lens, wherein the bore diameter of the entrance quadrupole lens may be larger than that of the exit quadrupole lens. As described just above, the multistage quadrupole lens system may be configured such that the bore diameter of each quadrupole lens is reduced in stages. In this case, the diameter of an ion beam entering the multistage quadrupole lens system is reduced in the vertical direction and/or the horizontal direction toward the downstream side of the beamline and then the ion beam exits from the multistage quadrupole lens system. In this case, the beam transport of the ion beam can be achieved with a downsizing multistage quadrupole lens system. Also, the power supply capacity of this multistage quadrupole lens system can be reduced.

Additional exemplary embodiments of the present invention are further listed as follows.

1. An ion implantation apparatus includes:
a multistage quadrupole lens system that is used to adjust beam focusing and defocusing, the multistage quadrupole lens system being placed midway in a beamline,
wherein the multistage quadrupole lens system is constructed of a plurality of quadrupole lenses, linearly arranged, having an identical central axis,
wherein the multistage quadrupole lens system is formed such that the lens bore diameters increase in stages, and the lens lengths of the plurality of quadrupole lenses are set separately, and
wherein the multistage quadrupole lens system is configured such that the beam transport of an ion beam is achieved, the beam transport being such that the diameter of the ion beam entering the multistage quadrupole lens system is increased in the vertical direction and/or the horizontal direction toward the downstream side of the beamline and then the ion beam exits from the multistage quadrupole lens system.

2. Each of a plurality of beam transport modes settable when the plurality of quadrupole lenses are operated may include the on-off of each of the plurality of quadrupole lenses and/or setting of a voltage applied to each of the plurality of quadrupole lenses.

3. The bore diameter and the lens length of each quadrupole lens of the multistage quadrupole lens system and a voltage to be applied to each quadrupole lens thereof may be set according to a state of the ion beam entering the multistage quadrupole lens system and a state of the ion beam exiting therefrom. The state of the ion beam may include a preset longitudinal diameter, a preset lateral diameter and a focused or defocused state of the ion beam.

4. A plurality of multistage quadrupole lens system configurations may be set with variation of the number of used quadrupole lens stages that constitute the multistage quadrupole lens system. For example, the multistage quadrupole lens system may be configured so as to operate a certain number of quadrupole lens stages in a certain beam transport mode and to operate a different number of quadrupole lens stages in another beam transport mode.

5. One of a plurality of beam transport modes settable when the plurality of quadrupole lenses are operated may include the setting of voltages applied to the quadrupole lenses to achieve the beam transport where the diameter of the ion beam is increased toward the downstream side of the beamline.

6. The setting of voltages applied to the quadrupole lenses to achieve the beam transport where the diameter of the ion beam is increased toward the downstream side of the beamline may be set such that the voltage is applied to only the quadrupole lens positioned on the uppermost stream side of the beamline.

7. The multistage quadrupole lens system may be operated in any one of a plurality of beam transport modes used when the plurality of quadrupole lenses are operated. The plurality of beam transport modes may include a defocusing beam mode where the multistage quadrupole lens system is operated such that the ion beam exiting from the multistage quadrupole lens system is focused in a first direction and defocused in a second direction perpendicular to the first direction. In the defocusing beam mode, the voltage may be applied to a first quadrupole lens only.

8. In substitution for applying the voltage to the first quadrupole lens only, the voltage may be applied to at least two quadrupole lenses excluding the first quadrupole lens, in the defocusing beam mode. The at least two quadrupole lens may include a second quadrupole lens.

9. The multistage quadrupole lens system may be a three-stage (triplet) quadrupole lens system.

10. One of a plurality of beam transport modes settable when the plurality of quadrupole lenses are operated may include a setting of voltages such that three quadrupole lenses provide a vertical focusing action, a horizontal focusing action, and a vertical focusing action, respectively, in order from an upstream side of the three quadrupole lenses.

11. One of a plurality of beam transport modes settable when the plurality of quadrupole lenses are operated may include the setting of voltages such that the ratio among the GL products of three quadrupole lenses is about 1:2:1.

12. The multistage quadrupole lens system may be operated in any one of a plurality of beam transport modes used when the plurality of quadrupole lenses are operated. The plurality of beam transport modes may include a focusing beam mode where the multistage quadrupole lens system is operated such that the ion beam exiting from the multistage quadrupole lens system is focused in a first direction and focused in a second direction perpendicular to the first direction. A first quadrupole lens, a second quadrupole lens and a third quadrupole lens may be used (activated) in the focusing beam mode.

13. The bore diameter of the first quadrupole lens may be equal to or smaller than that of the second quadrupole lens. The bore diameter of the second quadrupole lens may be equal to or smaller than that of the third quadrupole lens. The bore diameter of the first quadrupole lens may be smaller than that of the third quadrupole lens.

14. The power supply unit of the multistage quadrupole lens system may include separate power supplies each of which is configured by a positive voltage power supply and a negative voltage power supply. Here, the separate power supplies are used to control the first quadrupole lens, the second quadrupole lens and the third quadrupole lens, respectively, independently of each other.

15. The power supply unit of the multistage quadrupole lens system may include a common power supply, which is used commonly for the second quadrupole lens and the third quadrupole lens, and a separate power supply, which is used to control a first quadrupole lens independently of the second quadrupole lens and the third quadrupole lens.

16. The ratio among the GL product of a first quadrupole lens, the GL product of a second quadrupole lens and the GL product of a third quadrupole lens may be 1:[1 to 3]:[0.5 to 2].

17. The power supply unit of the multistage quadrupole lens system may include a separate power supply, which is used to independently control the first quadrupole lens, and the common power supply, which is used commonly for the second quadrupole lens and the third quadrupole lens. The shapes of the second quadrupole lens and the third quadrupole lens may be determined such that the ratio among the GL product of the first quadrupole lens, the GL product of the second quadrupole lens and the GL product of the third quadrupole lens is 1:[1 to 3]:[0.5 to 2].

18. The multistage quadrupole lens system may be configured such that the multistage quadrupole lens system fine-adjust the focusing force of the multistage quadrupole lens system by controlling a separate power supply for controlling the first quadrupole lens independently of the second quadrupole lens and the third quadrupole lens and/or a common power supply for controlling the second quadrupole lens and the third quadrupole lens.

19. The multistage quadrupole lens system may include an entrance suppression electrode and an exit suppression electrode. The aperture radius of the entrance suppression electrode may be smaller than that of the exit suppression electrode.

20. The multistage quadrupole lens system may include a first partition plate, placed between the first quadrupole lens and the second quadrupole lens, and a second partition plate, placed between the second quadrupole lens and the third quadrupole lens. The aperture radius of the first partition plate may be smaller than that of the second partition plate.

21. An ion implantation apparatus equipped with a multistage quadrupole lens system, used to adjust beam focusing and defocusing, which is placed midway in a beamline of the ion implantation apparatus,
wherein the ion implantation apparatus includes: a beam scanning unit; and the multistage quadrupole lens system provided upstream of the beam scanning unit,
wherein the multistage quadrupole lens system includes an entrance quadrupole lens and an exit quadrupole lens, and
wherein the bore diameter of the exit quadrupole lens is larger than that of the entrance quadrupole lens.

22. An ion implantation apparatus equipped with a multistage quadrupole lens system, used to adjust beam focusing and defocusing, which is placed midway in a beamline of the ion implantation apparatus,
wherein the ion implantation apparatus includes the multistage quadrupole lens system provided downstream of a mass analysis slit,
wherein the multistage quadrupole lens system includes an entrance quadrupole lens and an exit quadrupole lens, and
wherein the bore diameter of the exit quadrupole lens is larger than that of the entrance quadrupole lens.

23. An ion implantation apparatus equipped with a multistage quadrupole lens system, used to adjust beam focusing and defocusing, which is placed midway in a beamline of the ion implantation apparatus,
wherein the ion implantation apparatus includes the multistage quadrupole lens system provided between an extraction electrode and a mass analysis magnet,
wherein the multistage quadrupole lens system includes an entrance quadrupole lens and an exit quadrupole lens, and
wherein the bore diameter of the exit quadrupole lens is larger than that of the entrance quadrupole lens.

24. An ion implantation apparatus equipped with a multistage quadrupole lens system, used to adjust beam focusing and defocusing, which is placed midway in a beamline of the ion implantation apparatus,
wherein the ion implantation apparatus includes the multistage quadrupole lens system provided upstream of a mass analysis slit,
wherein the multistage quadrupole lens system includes an entrance quadrupole lens and an exit quadrupole lens, and
wherein the bore diameter of the entrance quadrupole lens is larger than that of the exit quadrupole lens.

25. An ion implantation apparatus equipped with a multistage quadrupole lens system, used to adjust beam focusing and defocusing, which is placed midway in a beamline of the ion implantation apparatus,
wherein a plurality of beam transport modes used when the multistage quadrupole lens system is operated are set such that the GL product, the bore diameter, the lens length and a voltage setting of each quadrupole lens in the multistage quadrupole lens system and the number of stages of the multistage quadrupole lens system are combined according to a preset longitudinal diameter, a preset lateral diameter and a focused or defocused state of an ion beam entering the multistage quadrupole lens system and according to the preset longitudinal diameter, the preset lateral diameter and the focused or defocused state of the ion beam exiting from the multistage quadrupole lens system.

26. An ion implantation apparatus equipped with a multistage quadrupole lens system, used to adjust beam focusing and defocusing, which is placed midway in a beamline of the ion implantation apparatus, wherein the multistage quadrupole lens system is operated in any one of a plurality of beam transport modes used when the multistage quadrupole lens system is operated, wherein the plurality of beam transport modes include:

a defocusing beam mode where the multistage quadrupole lens system is operated such that an ion beam exiting from the multistage quadrupole lens system is focused in a first direction and defocused in a second direction perpendicular to the first direction; and a focusing beam mode where the multistage quadrupole lens system is operated such that the ion beam exiting therefrom is focused in the first direction and focused in the second direction perpendicular to the first direction.

27. An ion implantation apparatus equipped with a multistage quadrupole lens system, used to adjust beam focusing and defocusing, which is placed midway in a beamline of the ion implantation apparatus, wherein the multistage quadrupole lens system includes:
a first quadrupole lens; a second quadrupole lens placed downstream of the first quadrupole lens; and a third quadrupole lens placed downstream of the second quadrupole lens, wherein the first quadrupole lens is configured such that an ion beam is focused in a first direction within a plane perpendicular to a beam transportation direction of the multistage quadrupole lens system, wherein the second quadrupole lens is configured such that the ion beam is focused in a second direction perpendicular to the first direction within the plane, wherein the third quadrupole lens is configured such that the ion beam is focused in the first direction, wherein the multistage quadrupole lens system is operated in any one of a plurality of beam transport modes used when the multistage quadrupole lens system is operated, and wherein the plurality of beam transport modes include:

a defocusing beam mode where at least one quadrupole lens is operated such that an ion beam exiting from the multistage quadrupole lens system is focused in the first direction and defocused in the second direction; and a focusing beam mode where at least two quadrupole lenses are operated such that the ion beam exiting therefrom is focused in the first direction and focused in the second direction.

28. The ion implantation apparatus and/or the multistage quadrupole lens system may further include a fourth to an nth quadrupole lenses placed downstream of the third quadrupole lens.

29. An ion implantation apparatus equipped with a multistage quadrupole lens system, used to adjust beam focusing and defocusing, which is placed midway in a beamline of the ion implantation apparatus, wherein the multistage quadrupole lens system includes:
a first quadrupole lens;
a second quadrupole lens placed downstream of the first quadrupole lens; and
a third quadrupole lens placed downstream of the second quadrupole lens, wherein the first quadrupole lens is configured such that an ion beam is focused in a first direction within a plane perpendicular to a beam transportation direction of the multistage quadrupole lens system, wherein the second quadrupole lens is configured such that the ion beam is focused in a second direction perpendicular to the first direction within the plane, wherein the third quadrupole lens is configured such that the ion beam is focused in the first direction, wherein a bore diameter of the first quadrupole lens is equal to or smaller than a bore diameter of the second quadrupole lens, wherein the bore diameter of the second quadrupole lens is equal to or smaller than a bore diameter of the third quadrupole lens, and wherein the bore diameter of the first quadrupole lens is smaller than the bore diameter of the third quadrupole lens.

It should be understood that the invention is not limited to the above-described embodiments, but may be modified into various forms on the basis of the spirit of the invention. Additionally, the modifications are included in the scope of the invention.

What is claimed is:

1. An ion implantation apparatus comprising:
a three-stage quadrupole lens system that is used to adjust beam focusing and defocusing, the three-stage quadrupole lens system being placed in a beam transport unit casing, wherein the three-stage quadrupole lens system is constructed of three quadrupole lenses, linearly arranged, having an identical central axis, wherein the three-stage quadrupole lens system is formed such that lens bore diameters increase in stages, and lens lengths of the three quadrupole lenses are set separately, wherein the three-stage quadrupole lens system is configured such that a beam transport of an ion beam along a beamline in the beam transport unit casing is achieved, the beam transport being such that a diameter of the ion beam entering the three-stage quadrupole lens system is increased in a vertical direction and/or a horizontal direction toward a downstream side of the beamline and the ion beam exits from the three-stage quadrupole lens system, and wherein a power supply unit of the three-stage quadrupole lens system includes:
a separate power supply, configured to control a first quadrupole lens independently of a second quadrupole lens and a third quadrupole lens, connected between the first quadrupole lens and a reference potential of the beam transport unit casing,
a common power supply, configured commonly for the second and third quadrupole lenses, connected between the second and third quadrupole lenses and the reference potential of the beam transport unit casing, wherein the ion implantation apparatus further comprises a controller configured to control the power supply unit, and comprising a plurality of beam transport setting configurations including:
a defocusing beam transport setting configuration configured such that the ion beam exiting from the three-stage quadrupole lens system is focused in a first direction and defocused in a second direction perpendicular to the first direction, and
a focusing beam transport setting configuration configured such that the ion beam exiting from the three-stage quadrupole lens system is focused in the first direction and focused in the second direction, wherein the controller is further configured to select one of the plurality of beam transport setting configurations according to a state of the ion beam, and to control the power supply unit according to the selected beam transport setting configuration, and wherein the defocusing beam transport setting configuration comprises a first on-off and/or voltage setting configured such that the separate power supply applies a voltage to the first quadrupole lens only, and the focusing beam transport setting comprising a second on-off and/or voltage setting configured such that the separate power supply and the common power supply apply voltages to the first, second, and third quadrupole lenses.

2. The ion implantation apparatus according to claim 1, wherein each of a plurality of beam transport modes settable when the three quadrupole lenses are operated includes an on-off of each of the three quadrupole lenses and/or setting of a voltage applied to each of the three quadrupole lenses.

3. The ion implantation apparatus according to claim 1, wherein a bore diameter and a lens length of each quadrupole lens of the three-stage quadrupole lens system and a voltage to be applied to each quadrupole lens thereof are set according to a state of the ion beam entering the three-stage quadrupole lens system and a state of the ion beam exiting therefrom, and
wherein the state of the ion beam includes a preset longitudinal diameter, a preset lateral diameter and a focused or defocused state of the ion beam.

4. The ion implantation apparatus according to claim 3, wherein a plurality of three-stage quadrupole lens system configurations are set with variation of the number of used quadrupole lens stages that constitute the three-stage quadrupole lens system.

5. The ion implantation apparatus according to claim 1, wherein one of a plurality of beam transport modes settable when the three quadrupole lenses are operated includes a setting of voltages applied to the quadrupole lenses to achieve the beam transport where the diameter of the ion beam is increased toward the downstream side of the beamline.

6. The ion implantation apparatus according to claim 5, wherein the setting of voltages applied to the quadrupole lenses to achieve the beam transport where the diameter of the ion beam is increased toward the downstream side of the beamline is set such that a voltage is applied to only a first quadrupole lens of the three quadrupole lenses.

7. The ion implantation apparatus according to claim 1, wherein one of a plurality of beam transport modes settable when the three quadrupole lenses are operated includes a setting of voltages such that the three quadrupole lenses provide a vertical focusing action, a horizontal focusing action, and a vertical focusing action, respectively, in order from an upstream side of the three quadrupole lenses.

8. The ion implantation apparatus according to claim 1, wherein one of a plurality of beam transport modes settable when the three quadrupole lenses are operated includes a setting of voltages such that a ratio among GL products of the three quadrupole lenses is about 1:2:1.

9. The ion implantation apparatus according to claim 1, wherein a bore diameter of a first quadrupole lens of the three quadrupole lenses is smaller than a bore diameter of a second quadrupole lens of the three quadrupole lenses, and
wherein the bore diameter of the second quadrupole lens is smaller than a bore diameter of a third quadrupole lens of the three quadrupole lenses.

10. The ion implantation apparatus according to claim 1, wherein a ratio among a GL product of a first quadrupole lens of the three quadrupole lenses, a GL product of a second quadrupole lens of the three quadrupole lenses and a GL product of a third quadrupole lens of the three quadrupole lenses is 1:[1 to 3]:[0.5 to 2].

11. The ion implantation apparatus according to claim 1, wherein shapes of a second quadrupole lens of the three quadrupole lenses and a third quadrupole lens of the three quadrupole lenses are determined such that a ratio among a GL product of a first quadrupole lens of the three quadrupole lenses, a GL product of the second quadrupole lens and a GL product of the third quadrupole lens is 1:[1 to 3]:[0.5 to 2].

12. The ion implantation apparatus according to claim 1, wherein the three-stage quadrupole lens system fine-adjusts a focusing force of the three-stage quadrupole lens system by controlling the separate power supply for controlling a first quadrupole lens of the three quadrupole lenses independently of a second quadrupole lens of the three quadrupole lenses and a third quadrupole lens of the three quadrupole lenses and/or the common power supply for controlling the second quadrupole lens and the third quadrupole lens.

13. The ion implantation apparatus according to claim 1, wherein the three-stage quadrupole lens system includes an entrance suppression electrode and an exit suppression electrode,
wherein an aperture radius of the entrance suppression electrode is smaller than that of the exit suppression electrode.

14. The ion implantation apparatus according to claim 1, wherein the three-stage quadrupole lens system includes a first partition plate, placed between a first quadrupole lens of the three quadrupole lenses and a second quadrupole lens of the three quadrupole lenses, and a second partition plate, placed between the second quadrupole lens and a third quadrupole lens of the three quadrupole lenses,
wherein an aperture radius of the first partition plate is smaller than that of the second partition plate.

15. An ion implantation apparatus comprising:
a beam focusing and defocusing multistage quadrupole lens system comprising a first quadrupole lens, a second quadrupole lens, and a third quadrupole lens arranged linearly and coaxially, and being formed such that respective lens bore diameters of the first quadrupole lens, the second quadrupole lens, and the third quadrupole lens increase in stages;
a power supply unit; and
a controller configured to control the power supply unit and comprising a plurality of beam transport setting configurations including:
a defocusing beam transport setting configuration configured such that the ion beam exiting from the three-stage quadrupole lens system is focused in a first direction and defocused in a second direction perpendicular to the first direction, and
a focusing beam transport setting configuration configured such that the ion beam exiting from the three-stage quadrupole lens system is focused in the first direction and focused in the second direction,
wherein the controller is further configured to select one of the plurality of beam transport setting configurations according to a state of the ion beam, and to control the power supply unit according to the selected beam transport setting configuration, and
wherein the defocusing beam transport setting configuration comprises a first on-off and/or voltage setting configured such that the separate power supply applies a voltage to the first quadrupole lens only, and the focusing beam transport setting comprising a second on-off and/or voltage setting configured such that the separate power supply and the common power supply apply voltages to the first, second, and third quadrupole lenses.

* * * * *